(12) United States Patent
Sullam et al.

(10) Patent No.: US 8,476,928 B1
(45) Date of Patent: *Jul. 2, 2013

(54) SYSTEM LEVEL INTERCONNECT WITH PROGRAMMABLE SWITCHING

(75) Inventors: Bert Sullam, Bellevue, WA (US);
Warren Snyder, Snohomish, WA (US);
Haneef Mohammed, Beaverton, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/197,624

(22) Filed: Aug. 3, 2011

Related U.S. Application Data

(63) Continuation of application No. 11/965,677, filed on Dec. 27, 2007, now Pat. No. 8,026,739.

(60) Provisional application No. 60/912,399, filed on Apr. 17, 2007.

(51) Int. Cl.
*H01L 25/00* (2006.01)
*H03K 19/177* (2006.01)

(52) U.S. Cl.
USPC .................. 326/41; 326/38; 326/39; 326/47

(58) Field of Classification Search
USPC .............................. 326/39–41, 47
See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedom |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |

(Continued)

FOREIGN PATENT DOCUMENTS

| | | |
|---|---|---|
| DE | 19710829 A1 | 9/1998 |
| EP | 0308583 A | 3/1989 |

(Continued)

OTHER PUBLICATIONS

U.S. Appl. No. 11/322,044, Dec. 26, 2005, Jonathon Stiff.

(Continued)

*Primary Examiner* — Anh Tran

(57) ABSTRACT

Different functional elements are all located on a same integrated circuit wherein at least one of the functional elements comprises a micro-controller. Configuration registers or configuration memory in the integrated circuit store configuration values loaded by the micro-controller. Connectors are configured to connect the integrated circuit to external signals A system level interconnect also located in the integrated circuit programmably connects together the different functional elements and different connectors according to the configuration values loaded into the configuration registers.

20 Claims, 17 Drawing Sheets

U.S. PATENT DOCUMENTS

| | | |
|---|---|---|
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,454,589 A | 6/1984 | Miller |
| 4,475,151 A | 10/1984 | Philipp |
| 4,497,575 A | 2/1985 | Philipp |
| 4,604,363 A | 8/1986 | Newhouse et al. |
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,926,355 A | 5/1990 | Boreland |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada, Jr. et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,699 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,750 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,739 A | 1/1994 | Krokstad et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Del Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten et al. |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |

| | | | | | |
|---|---|---|---|---|---|
| 5,399,922 A | 3/1995 | Kiani et al. | 5,594,388 A | 1/1997 | O'Shaughnessy et al. |
| 5,408,194 A | 4/1995 | Steinbach et al. | 5,594,734 A | 1/1997 | Worsley et al. |
| 5,408,235 A | 4/1995 | Doyle et al. | 5,594,876 A | 1/1997 | Getzlaff et al. |
| 5,414,308 A | 5/1995 | Lee et al. | 5,594,890 A | 1/1997 | Yamaura et al. |
| 5,414,380 A | 5/1995 | Floyd et al. | 5,600,262 A | 2/1997 | Kolze |
| 5,416,895 A | 5/1995 | Anderson et al. | 5,604,466 A | 2/1997 | Dreps et al. |
| 5,422,823 A | 6/1995 | Agrawal et al. | 5,608,892 A | 3/1997 | Wakerly |
| 5,424,689 A | 6/1995 | Gillig et al. | 5,614,861 A | 3/1997 | Harada |
| 5,426,378 A | 6/1995 | Ong | 5,617,041 A | 4/1997 | Lee et al. |
| 5,426,384 A | 6/1995 | May | 5,625,316 A | 4/1997 | Chambers et al. |
| 5,428,319 A | 6/1995 | Marvin et al. | 5,625,583 A | 4/1997 | Hyatt |
| 5,430,395 A | 7/1995 | Ichimaru | 5,629,857 A | 5/1997 | Brennan |
| 5,430,687 A | 7/1995 | Hung et al. | 5,629,891 A | 5/1997 | Lemoncheck et al. |
| 5,430,734 A | 7/1995 | Gilson | 5,630,052 A | 5/1997 | Shah |
| 5,432,476 A | 7/1995 | Tran | 5,630,057 A | 5/1997 | Hait |
| 5,438,672 A | 8/1995 | Dey | 5,630,102 A | 5/1997 | Johnson et al. |
| 5,440,305 A | 8/1995 | Signore et al. | 5,631,577 A | 5/1997 | Freidin et al. |
| 5,451,887 A | 9/1995 | El-Avat et al. | 5,633,766 A | 5/1997 | Hase et al. |
| 5,453,904 A | 9/1995 | Higashiyama et al. | 5,642,295 A | 6/1997 | Smayling |
| 5,455,525 A | 10/1995 | Ho et al. | 5,646,544 A | 7/1997 | Iadanza |
| 5,455,731 A | 10/1995 | Parkinson | 5,646,901 A | 7/1997 | Sharpe-Geisler et al. |
| 5,455,927 A | 10/1995 | Huang | 5,648,642 A | 7/1997 | Miller et al. |
| 5,457,410 A | 10/1995 | Ting | 5,651,035 A | 7/1997 | Tozun et al. |
| 5,457,479 A | 10/1995 | Cheng | 5,652,893 A | 7/1997 | Ben-Meir et al. |
| 5,463,591 A | 10/1995 | Aimoto et al. | 5,661,433 A | 8/1997 | LaRosa et al. |
| 5,479,603 A | 12/1995 | Stone et al. | 5,663,900 A | 9/1997 | Bhandari et al. |
| 5,479,643 A | 12/1995 | Bhaskar et al. | 5,663,965 A | 9/1997 | Seymour |
| 5,479,652 A | 12/1995 | Dreyer et al. | 5,664,199 A | 9/1997 | Kuwahara |
| 5,481,471 A | 1/1996 | Naglestad et al. | 5,666,480 A | 9/1997 | Leung et al. |
| 5,488,204 A | 1/1996 | Mead et al. | 5,670,915 A | 9/1997 | Cooper et al. |
| 5,491,458 A | 2/1996 | Mccune, Jr. et al. | 5,673,198 A | 9/1997 | Lawman et al. |
| 5,493,246 A | 2/1996 | Anderson | 5,675,825 A | 10/1997 | Dreyer et al. |
| 5,493,723 A | 2/1996 | Beck et al. | 5,677,691 A | 10/1997 | Hosticka et al. |
| 5,495,077 A | 2/1996 | Miller et al. | 5,680,070 A | 10/1997 | Anderson et al. |
| 5,495,593 A | 2/1996 | Elmer et al. | 5,682,032 A | 10/1997 | Philipp |
| 5,495,594 A | 2/1996 | Mackenna et al. | 5,684,434 A | 11/1997 | Mann et al. |
| 5,497,119 A | 3/1996 | Tedrow et al. | 5,684,952 A | 11/1997 | Stein |
| 5,497,498 A | 3/1996 | Taylor | 5,686,844 A | 11/1997 | Hull et al. |
| 5,499,192 A | 3/1996 | Knapp et al. | 5,687,325 A | 11/1997 | Chang |
| 5,500,823 A | 3/1996 | Martin et al. | 5,689,195 A | 11/1997 | Cliff et al. |
| 5,517,198 A | 5/1996 | Mcewan | 5,689,196 A | 11/1997 | Schutte |
| 5,519,854 A | 5/1996 | Watt | 5,691,664 A | 11/1997 | Anderson et al. |
| 5,521,529 A | 5/1996 | Agrawal et al. | 5,691,898 A | 11/1997 | Rosenberg et al. |
| 5,530,444 A | 6/1996 | Tice et al. | 5,694,063 A | 12/1997 | Burlison et al. |
| 5,530,673 A | 6/1996 | Tobita et al. | 5,696,952 A | 12/1997 | Pontarelli |
| 5,530,813 A | 6/1996 | Paulsen et al. | 5,699,024 A | 12/1997 | Manlove et al. |
| 5,537,057 A | 7/1996 | Leong et al. | 5,703,871 A | 12/1997 | Pope et al. |
| 5,541,878 A | 7/1996 | Lemoncheck et al. | 5,706,453 A | 1/1998 | Cheng et al. |
| 5,542,055 A | 7/1996 | Amini et al. | 5,708,589 A | 1/1998 | Beauvais |
| 5,543,588 A | 8/1996 | Bisset et al. | 5,708,798 A | 1/1998 | Lynch et al. |
| 5,543,590 A | 8/1996 | Gillespie et al. | 5,710,906 A | 1/1998 | Ghosh et al. |
| 5,543,591 A | 8/1996 | Gillespie et al. | 5,712,969 A | 1/1998 | Zimmermann et al. |
| 5,544,067 A | 8/1996 | Rostoker et al. | 5,721,931 A | 2/1998 | Gephardt et al. |
| 5,544,311 A | 8/1996 | Harenberg et al. | 5,724,009 A | 3/1998 | Collins et al. |
| 5,546,433 A | 8/1996 | Tran et al. | 5,727,170 A | 3/1998 | Mitchell et al. |
| 5,546,562 A | 8/1996 | Patel | 5,728,933 A | 3/1998 | Schultz et al. |
| 5,552,725 A | 9/1996 | Ray et al. | 5,729,704 A | 3/1998 | Stone et al. |
| 5,552,748 A | 9/1996 | O'Shaughnessy | 5,730,165 A | 3/1998 | Philipp |
| 5,554,951 A | 9/1996 | Gough | 5,732,277 A | 3/1998 | Kodosky et al. |
| 5,555,452 A | 9/1996 | Callaway et al. | 5,734,272 A | 3/1998 | Belot et al. |
| 5,555,907 A | 9/1996 | Philipp | 5,734,334 A | 3/1998 | Hsieh et al. |
| 5,557,762 A | 9/1996 | Okuaki et al. | 5,737,557 A | 4/1998 | Sullivan |
| 5,559,502 A | 9/1996 | Schutte | 5,737,760 A | 4/1998 | Grimmer et al. |
| 5,559,996 A | 9/1996 | Fujioka | 5,745,011 A | 4/1998 | Scott |
| 5,563,526 A | 10/1996 | Hastings et al. | 5,748,048 A | 5/1998 | Moyal |
| 5,563,529 A | 10/1996 | Seltzer et al. | 5,748,875 A | 5/1998 | Tzori |
| 5,564,010 A | 10/1996 | Henry et al. | 5,752,013 A | 5/1998 | Christensen et al. |
| 5,564,108 A | 10/1996 | Hunsaker et al. | 5,754,552 A | 5/1998 | Allmond et al. |
| 5,565,658 A | 10/1996 | Gerpheide et al. | 5,754,826 A | 5/1998 | Gamal et al. |
| 5,566,702 A | 10/1996 | Philipp | 5,757,368 A | 5/1998 | Gerpheide et al. |
| 5,572,665 A | 11/1996 | Nakabayashi | 5,758,058 A | 5/1998 | Milburn |
| 5,572,719 A | 11/1996 | Biesterfeldt | 5,760,612 A | 6/1998 | Ramirez |
| 5,574,678 A | 11/1996 | Gorecki | 5,761,128 A | 6/1998 | Watanabe |
| 5,574,852 A | 11/1996 | Bakker et al. | 5,763,909 A | 6/1998 | Mead et al. |
| 5,574,892 A | 11/1996 | Christensen | 5,764,714 A | 6/1998 | Stansell et al. |
| 5,579,353 A | 11/1996 | Parmenter et al. | 5,767,457 A | 6/1998 | Gerpheide et al. |
| 5,587,945 A | 12/1996 | Lin et al. | 5,774,704 A | 6/1998 | Williams |
| 5,587,957 A | 12/1996 | Kowalczyk et al. | 5,777,399 A | 7/1998 | Shibuya |
| 5,590,354 A | 12/1996 | Klapproth et al. | 5,781,030 A | 7/1998 | Agrawal et al. |

| | | | | | |
|---|---|---|---|---|---|
| 5,781,747 A | 7/1998 | Smith et al. | 5,933,023 A | 8/1999 | Young |
| 5,784,545 A | 7/1998 | Anderson et al. | 5,933,356 A | 8/1999 | Rostoker et al. |
| 5,790,882 A | 8/1998 | Silver et al. | 5,933,816 A | 8/1999 | Zeanah et al. |
| 5,790,957 A | 8/1998 | Heidari | 5,935,233 A | 8/1999 | Jeddeloh |
| 5,796,183 A | 8/1998 | Hourmand et al. | 5,935,266 A | 8/1999 | Thurnhofer et al. |
| 5,799,176 A | 8/1998 | Kapusta et al. | 5,939,904 A | 8/1999 | Fetterman et al. |
| 5,801,958 A | 9/1998 | Dangelo et al. | 5,939,949 A | 8/1999 | Olgaard et al. |
| 5,802,073 A | 9/1998 | Platt | 5,941,991 A | 8/1999 | Kageshima |
| 5,802,290 A | 9/1998 | Casselman | 5,942,733 A | 8/1999 | Allen et al. |
| 5,805,792 A | 9/1998 | Swoboda et al. | 5,943,052 A | 8/1999 | Allen et al. |
| 5,805,897 A | 9/1998 | Glowny | 5,945,878 A | 8/1999 | Westwick et al. |
| 5,808,883 A | 9/1998 | Hawkes | 5,949,632 A | 9/1999 | Barreras, Sr. et al. |
| 5,811,987 A | 9/1998 | Ashmore, Jr. et al. | 5,952,888 A | 9/1999 | Scott |
| 5,812,698 A | 9/1998 | Platt et al. | 5,956,279 A | 9/1999 | Mo et al. |
| 5,818,254 A | 10/1998 | Agrawal et al. | 5,959,871 A | 9/1999 | Pierzchala et al. |
| 5,818,444 A | 10/1998 | Alimpich et al. | 5,963,075 A | 10/1999 | Hiiragizawa |
| 5,818,736 A | 10/1998 | Leibold | 5,963,105 A | 10/1999 | Nguyen |
| 5,819,028 A | 10/1998 | Manghirmalani et al. | 5,963,503 A | 10/1999 | Lee |
| 5,822,387 A | 10/1998 | Mar | 5,964,893 A | 10/1999 | Circello et al. |
| 5,822,531 A | 10/1998 | Gorczyca et al. | 5,966,027 A | 10/1999 | Kapusta et al. |
| 5,828,693 A | 10/1998 | Mays et al. | 5,966,532 A | 10/1999 | Mcdonald et al. |
| 5,838,583 A | 11/1998 | Varadarajan et al. | 5,968,135 A | 10/1999 | Teramoto et al. |
| 5,841,078 A | 11/1998 | Miller et al. | 5,969,513 A | 10/1999 | Clark |
| 5,841,996 A | 11/1998 | Nolan et al. | 5,969,632 A | 10/1999 | Diamant et al. |
| 5,844,256 A | 12/1998 | Higashino | 5,973,368 A | 10/1999 | Pearce et al. |
| 5,844,404 A | 12/1998 | Caser et al. | 5,974,235 A | 10/1999 | Nunally et al. |
| 5,848,285 A | 12/1998 | Kapusta et al. | 5,977,791 A | 11/1999 | Veenstra |
| 5,850,156 A | 12/1998 | Wittman | 5,978,584 A | 11/1999 | Nishibata et al. |
| 5,852,733 A | 12/1998 | Chien et al. | 5,978,937 A | 11/1999 | Miyamori et al. |
| 5,854,625 A | 12/1998 | Frisch et al. | 5,982,105 A | 11/1999 | Masters |
| 5,857,109 A | 1/1999 | Taylor | 5,982,229 A | 11/1999 | Wong et al. |
| 5,861,583 A | 1/1999 | Schediwy et al. | 5,982,241 A | 11/1999 | Nguyen et al. |
| 5,861,875 A | 1/1999 | Gerpheide | 5,983,277 A | 11/1999 | Heile et al. |
| 5,864,242 A | 1/1999 | Allen et al. | 5,986,479 A | 11/1999 | Mohan |
| 5,864,392 A | 1/1999 | Winklhofer et al. | 5,987,246 A | 11/1999 | Thomsen et al. |
| 5,867,046 A | 2/1999 | Sugasawa | 5,988,902 A | 11/1999 | Holehan |
| 5,867,399 A | 2/1999 | Rostoker et al. | 5,994,939 A | 11/1999 | Johnson et al. |
| 5,869,979 A | 2/1999 | Bocchino | 5,996,032 A | 11/1999 | Baker |
| 5,870,004 A | 2/1999 | Lu | 5,999,725 A | 12/1999 | Barbier et al. |
| 5,870,309 A | 2/1999 | Lawman | 6,002,268 A | 12/1999 | Sasaki et al. |
| 5,870,345 A | 2/1999 | Stecker | 6,002,398 A | 12/1999 | Wilson |
| 5,872,464 A | 2/1999 | Gradinariu | 6,003,054 A | 12/1999 | Oshima et al. |
| 5,874,958 A | 2/1999 | Ludolph | 6,003,107 A | 12/1999 | Ranson et al. |
| 5,875,293 A | 2/1999 | Bell et al. | 6,003,133 A | 12/1999 | Moughanni et al. |
| 5,877,656 A | 3/1999 | Mann et al. | 6,005,814 A | 12/1999 | Mulholland et al. |
| 5,878,425 A | 3/1999 | Redpath | 6,005,904 A | 12/1999 | Knapp et al. |
| 5,880,411 A | 3/1999 | Gillespie et al. | 6,006,321 A | 12/1999 | Abbott |
| 5,880,598 A | 3/1999 | Duong | 6,006,322 A | 12/1999 | Muramatsu |
| 5,883,623 A | 3/1999 | Cseri | 6,008,685 A | 12/1999 | Kunst |
| 5,886,582 A | 3/1999 | Stansell | 6,008,703 A | 12/1999 | Perrott et al. |
| 5,887,189 A | 3/1999 | Bims et al. | 6,009,270 A | 12/1999 | Mann |
| 5,889,236 A | 3/1999 | Gillespie et al. | 6,009,496 A | 12/1999 | Tsai |
| 5,889,723 A | 3/1999 | Pascucci | 6,011,407 A | 1/2000 | New |
| 5,889,936 A | 3/1999 | Chan | 6,012,835 A | 1/2000 | Thompson et al. |
| 5,889,988 A | 3/1999 | Held | 6,014,135 A | 1/2000 | Fernandes |
| 5,894,226 A | 4/1999 | Koyama | 6,014,509 A | 1/2000 | Furtek et al. |
| 5,894,243 A | 4/1999 | Hwang | 6,014,723 A | 1/2000 | Tremblay et al. |
| 5,894,565 A | 4/1999 | Furtek et al. | 6,016,554 A | 1/2000 | Skrovan et al. |
| 5,895,494 A | 4/1999 | Scalzi et al. | 6,016,563 A | 1/2000 | Fleisher |
| 5,896,068 A | 4/1999 | Moyal | 6,018,559 A | 1/2000 | Azegami et al. |
| 5,896,330 A | 4/1999 | Gibson | 6,023,422 A | 2/2000 | Allen et al. |
| 5,898,345 A | 4/1999 | Namura et al. | 6,023,565 A | 2/2000 | Lawman et al. |
| 5,900,780 A | 5/1999 | Hirose et al. | 6,026,134 A | 2/2000 | Duffy et al. |
| 5,901,062 A | 5/1999 | Burch et al. | 6,026,501 A | 2/2000 | Hohl et al. |
| 5,903,718 A | 5/1999 | Marik | 6,028,271 A | 2/2000 | Gillespie et al. |
| 5,905,398 A | 5/1999 | Todsen et al. | 6,028,959 A | 2/2000 | Wang et al. |
| 5,909,544 A | 6/1999 | Anderson et al. | 6,031,365 A | 2/2000 | Sharpe-Geisler |
| 5,911,059 A | 6/1999 | Profit, Jr. | 6,032,268 A | 2/2000 | Swoboda et al. |
| 5,914,465 A | 6/1999 | Allen et al. | 6,034,538 A | 3/2000 | Abramovici |
| 5,914,633 A | 6/1999 | Comino et al. | 6,035,320 A | 3/2000 | Kiriaki et al. |
| 5,914,708 A | 6/1999 | Lagrange et al. | 6,037,807 A | 3/2000 | Wu et al. |
| 5,917,356 A | 6/1999 | Casal et al. | 6,038,551 A | 3/2000 | Barlow et al. |
| 5,920,310 A | 7/1999 | Faggin et al. | 6,041,406 A | 3/2000 | Mann |
| 5,923,264 A | 7/1999 | Lavelle et al. | 6,043,695 A | 3/2000 | O'Sullivan |
| 5,926,566 A | 7/1999 | Wang et al. | 6,043,719 A | 3/2000 | Lin et al. |
| 5,929,710 A | 7/1999 | Bien | 6,049,223 A | 4/2000 | Lytle et al. |
| 5,930,148 A | 7/1999 | Bjorksten et al. | 6,049,225 A | 4/2000 | Huang et al. |
| 5,930,150 A | 7/1999 | Cohen et al. | 6,051,772 A | 4/2000 | Cameron et al. |
| 5,931,959 A | 8/1999 | Kwiat | 6,052,035 A | 4/2000 | Nolan et al. |

| | | | | | | |
|---|---|---|---|---|---|---|
| 6,052,524 | A | 4/2000 | Pauna | 6,204,687 | B1 | 3/2001 | Schultz et al.
| 6,055,584 | A | 4/2000 | Bridges et al. | 6,205,574 | B1 | 3/2001 | Dellinger et al.
| 6,057,705 | A | 5/2000 | Wojewoda et al. | 6,208,572 | B1 | 3/2001 | Adams et al.
| 6,058,263 | A | 5/2000 | Voth | 6,211,708 | B1 | 4/2001 | Klemmer
| 6,058,452 | A | 5/2000 | Rangasayee et al. | 6,211,715 | B1 | 4/2001 | Terauchi
| 6,061,511 | A | 5/2000 | Marantz et al. | 6,211,741 | B1 | 4/2001 | Dalmia
| 6,066,961 | A | 5/2000 | Lee et al. | 6,215,326 | B1 | 4/2001 | Jefferson et al.
| 6,070,003 | A | 5/2000 | Gove et al. | 6,215,352 | B1 | 4/2001 | Sudo
| 6,072,803 | A | 6/2000 | Allmond et al. | 6,216,254 | B1 | 4/2001 | Pesce et al.
| 6,075,941 | A | 6/2000 | Itoh et al. | 6,218,859 | B1 | 4/2001 | Pedersen
| 6,079,985 | A | 6/2000 | Wohl et al. | 6,219,729 | B1 | 4/2001 | Keats et al.
| 6,081,140 | A | 6/2000 | King | 6,222,528 | B1 | 4/2001 | Gerpheide et al.
| 6,094,730 | A | 7/2000 | Lopez et al. | 6,223,144 | B1 | 4/2001 | Barnett et al.
| 6,097,211 | A | 8/2000 | Couts-Martin et al. | 6,223,147 | B1 | 4/2001 | Bowers
| 6,097,432 | A | 8/2000 | Mead et al. | 6,223,272 | B1 | 4/2001 | Coehlo et al.
| 6,101,457 | A | 8/2000 | Barch et al. | RE37,195 | E | 5/2001 | Kean
| 6,101,617 | A | 8/2000 | Burckhartt et al. | 6,225,866 | B1 | 5/2001 | Kubota et al.
| 6,104,217 | A | 8/2000 | Magana | 6,236,242 | B1 | 5/2001 | Hedberg
| 6,104,325 | A | 8/2000 | Liaw et al. | 6,236,275 | B1 | 5/2001 | Dent
| 6,107,769 | A | 8/2000 | Saylor et al. | 6,236,278 | B1 | 5/2001 | Olgaard
| 6,107,826 | A | 8/2000 | Young et al. | 6,236,593 | B1 | 5/2001 | Hong et al.
| 6,107,882 | A | 8/2000 | Gabara et al. | 6,239,389 | B1 | 5/2001 | Allen et al.
| 6,110,223 | A | 8/2000 | Southgate et al. | 6,239,798 | B1 | 5/2001 | Ludolph et al.
| 6,111,431 | A | 8/2000 | Estrada | 6,240,375 | B1 | 5/2001 | Sonoda
| 6,112,264 | A | 8/2000 | Beasley et al. | 6,246,258 | B1 | 6/2001 | Lesea
| 6,121,791 | A | 9/2000 | Abbott | 6,246,410 | B1 | 6/2001 | Bergeron et al.
| 6,121,805 | A | 9/2000 | Thamsirianunt et al. | 6,249,167 | B1 | 6/2001 | Oguchi et al.
| 6,121,965 | A | 9/2000 | Kenney et al. | 6,249,447 | B1 | 6/2001 | Boylan et al.
| 6,125,416 | A | 9/2000 | Warren | 6,253,250 | B1 | 6/2001 | Evans et al.
| 6,130,548 | A | 10/2000 | Koifman | 6,253,754 | B1 | 7/2001 | Roohparvar
| 6,130,551 | A | 10/2000 | Agrawal et al. | 6,260,087 | B1 | 7/2001 | Chang
| 6,130,552 | A | 10/2000 | Jefferson et al. | 6,262,717 | B1 | 7/2001 | Donohue et al.
| 6,130,553 | A | 10/2000 | Nakaya | 6,263,302 | B1 | 7/2001 | Hellestrand et al.
| 6,133,773 | A | 10/2000 | Garlepp et al. | 6,263,339 | B1 | 7/2001 | Hirsch
| 6,134,181 | A | 10/2000 | Landry | 6,263,484 | B1 | 7/2001 | Yang
| 6,134,516 | A | 10/2000 | Wang et al. | 6,271,679 | B1 | 8/2001 | McClintock et al.
| 6,137,308 | A | 10/2000 | Nayak | 6,272,646 | B1 | 8/2001 | Rangasayee et al.
| 6,140,853 | A | 10/2000 | Lo | 6,275,117 | B1 | 8/2001 | Abugharbieh et al.
| 6,141,376 | A | 10/2000 | Shaw | 6,278,568 | B1 | 8/2001 | Cloke et al.
| 6,141,764 | A | 10/2000 | Ezell | 6,280,391 | B1 | 8/2001 | Olson et al.
| 6,148,104 | A | 11/2000 | Wang et al. | 6,281,753 | B1 | 8/2001 | Corsi et al.
| 6,148,441 | A | 11/2000 | Woodward | 6,282,547 | B1 | 8/2001 | Hirsch
| 6,149,299 | A | 11/2000 | Aslan et al. | 6,282,551 | B1 | 8/2001 | Anderson et al.
| 6,150,866 | A | 11/2000 | Eto et al. | 6,286,127 | B1 | 9/2001 | King et al.
| 6,154,064 | A | 11/2000 | Proebsting | 6,288,707 | B1 | 9/2001 | Philipp
| 6,157,024 | A | 12/2000 | Chapdelaine et al. | 6,289,300 | B1 | 9/2001 | Brannick et al.
| 6,157,270 | A | 12/2000 | Tso | 6,289,478 | B1 | 9/2001 | Kitagaki
| 6,161,199 | A | 12/2000 | Szeto et al. | 6,289,489 | B1 | 9/2001 | Bold et al.
| 6,166,367 | A | 12/2000 | Cho | 6,292,028 | B1 | 9/2001 | Tomita
| 6,166,960 | A | 12/2000 | Marneweck et al. | 6,294,932 | B1 | 9/2001 | Watarai
| 6,167,077 | A | 12/2000 | Ducaroir et al. | 6,294,962 | B1 | 9/2001 | Mar
| 6,167,364 | A | 12/2000 | Stellenberg et al. | 6,298,320 | B1 | 10/2001 | Buckmaster et al.
| 6,167,559 | A | 12/2000 | Furtek et al. | 6,304,014 | B1 | 10/2001 | England et al.
| 6,169,383 | B1 | 1/2001 | Sabin et al. | 6,304,101 | B1 | 10/2001 | Nishihara
| 6,172,428 | B1 | 1/2001 | Jordan | 6,304,790 | B1 | 10/2001 | Nakamura et al.
| 6,172,571 | B1 | 1/2001 | Moyal et al. | 6,307,413 | B1 | 10/2001 | Dalmia et al.
| 6,173,419 | B1 | 1/2001 | Barnett | 6,310,521 | B1 | 10/2001 | Dalmia
| 6,175,914 | B1 | 1/2001 | Mann | 6,310,611 | B1 | 10/2001 | Caldwell
| 6,175,949 | B1 | 1/2001 | Gristede et al. | 6,311,149 | B1 | 10/2001 | Ryan et al.
| 6,181,163 | B1 | 1/2001 | Agrawal et al. | 6,314,530 | B1 | 11/2001 | Mann
| 6,183,131 | B1 | 2/2001 | Holloway et al. | 6,320,184 | B1 | 11/2001 | Winklhofer et al.
| 6,185,127 | B1 | 2/2001 | Myers et al. | 6,320,282 | B1 | 11/2001 | Caldwell
| 6,185,450 | B1 | 2/2001 | Seguine et al. | 6,321,369 | B1 | 11/2001 | Heile et al.
| 6,185,522 | B1 | 2/2001 | Bakker | 6,323,846 | B1 | 11/2001 | Westerman et al.
| 6,185,703 | B1 | 2/2001 | Guddat et al. | 6,324,628 | B1 | 11/2001 | Chan
| 6,185,732 | B1 | 2/2001 | Mann et al. | 6,326,859 | B1 | 12/2001 | Goldman et al.
| 6,188,228 | B1 | 2/2001 | Philipp | 6,332,137 | B1 | 12/2001 | Hori et al.
| 6,188,241 | B1 | 2/2001 | Gauthier et al. | 6,332,201 | B1 | 12/2001 | Chin et al.
| 6,188,381 | B1 | 2/2001 | van der Wal et al. | 6,337,578 | B2 | 1/2002 | Jefferson et al.
| 6,188,391 | B1 | 2/2001 | Seely et al. | 6,337,579 | B1 | 1/2002 | Mochida
| 6,188,975 | B1 | 2/2001 | Gay | 6,338,109 | B1 | 1/2002 | Snyder et al.
| 6,191,603 | B1 | 2/2001 | Muradali et al. | 6,339,815 | B1 | 1/2002 | Feng et al.
| 6,191,660 | B1 | 2/2001 | Mar et al. | 6,342,907 | B1 | 1/2002 | Petty et al.
| 6,191,998 | B1 | 2/2001 | Reddy et al. | 6,345,383 | B1 | 2/2002 | Ueki
| 6,192,431 | B1 | 2/2001 | Dabral et al. | 6,347,395 | B1 | 2/2002 | Payne et al.
| 6,198,303 | B1 | 3/2001 | Rangasayee | 6,351,789 | B1 | 2/2002 | Green
| 6,201,407 | B1 | 3/2001 | Kapusta et al. | 6,353,452 | B1 | 3/2002 | Hamada et al.
| 6,201,829 | B1 | 3/2001 | Schneider | 6,355,980 | B1 | 3/2002 | Callahan
| 6,202,044 | B1 | 3/2001 | Tzori | 6,356,862 | B2 | 3/2002 | Bailey

| Patent No. | Date | Name |
|---|---|---|
| 6,356,958 B1 | 3/2002 | Lin |
| 6,356,960 B1 | 3/2002 | Jones et al. |
| 6,359,950 B2 | 3/2002 | Gossmann et al. |
| 6,362,697 B1 | 3/2002 | Pulvirenti |
| 6,366,174 B1 | 4/2002 | Berry et al. |
| 6,366,300 B1 | 4/2002 | Ohara et al. |
| 6,366,874 B1 | 4/2002 | Lee et al. |
| 6,366,878 B1 | 4/2002 | Grunert |
| 6,369,660 B1 | 4/2002 | Wei et al. |
| 6,371,878 B1 | 4/2002 | Bowen |
| 6,373,954 B1 | 4/2002 | Malcolm, Jr. et al. |
| 6,374,370 B1 | 4/2002 | Bockhaus et al. |
| 6,377,009 B1 | 4/2002 | Philipp |
| 6,377,575 B1 | 4/2002 | Mullaney et al. |
| 6,377,646 B1 | 4/2002 | Sha |
| 6,380,811 B1 | 4/2002 | Zarubinsky et al. |
| 6,380,929 B1 | 4/2002 | Platt |
| 6,380,931 B1 | 4/2002 | Gillespie et al. |
| 6,384,947 B1 | 5/2002 | Ackerman et al. |
| 6,385,742 B1 | 5/2002 | Kirsch et al. |
| 6,388,109 B1 | 5/2002 | Schwarz et al. |
| 6,388,464 B1 | 5/2002 | Lacey et al. |
| 6,396,302 B2 | 5/2002 | New et al. |
| 6,396,657 B1 | 5/2002 | Sun et al. |
| 6,397,232 B1 | 5/2002 | Cheng-Hung et al. |
| 6,401,230 B1 | 6/2002 | Ahanessians et al. |
| 6,404,204 B1 | 6/2002 | Farruggia et al. |
| 6,404,224 B1 * | 6/2002 | Azegami et al. ............... 326/38 |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,421,698 B1 | 7/2002 | Hong |
| 6,421,817 B1 | 7/2002 | Mohan et al. |
| 6,425,109 B1 | 7/2002 | Choukalos et al. |
| 6,426,677 B1 | 7/2002 | Prentice |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard et al. |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Insenser Farre et al. |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,476,634 B1 | 11/2002 | Bilski |
| 6,477,691 B1 | 11/2002 | Bergamaschi et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,969 B2 | 12/2002 | Feng et al. |
| 6,496,971 B1 | 12/2002 | Lesea et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,516,428 B2 | 2/2003 | Wenzel et al. |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | Mcdonald et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,542,845 B1 | 4/2003 | Grucci et al. |
| 6,546,297 B1 | 4/2003 | Gaston et al. |
| 6,552,933 B2 | 4/2003 | Roohparvar |
| 6,553,057 B1 | 4/2003 | Sha et al. |
| 6,554,469 B1 | 4/2003 | Thomson et al. |
| 6,556,044 B2 | 4/2003 | Langhammer et al. |
| 6,557,164 B1 | 4/2003 | Faustini |
| 6,559,685 B2 | 5/2003 | Green |
| 6,560,306 B1 | 5/2003 | Duffy et al. |
| 6,560,699 B1 | 5/2003 | Konkle |
| 6,563,391 B1 | 5/2003 | Mar |
| 6,564,179 B1 | 5/2003 | Belhaj |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,590,589 B1 | 7/2003 | Sluiman et al. |
| 6,591,369 B1 | 7/2003 | Edwards et al. |
| 6,592,626 B1 | 7/2003 | Bauchot et al. |
| 6,594,796 B1 | 7/2003 | Chiang |
| 6,594,799 B1 | 7/2003 | Robertson et al. |
| 6,597,212 B1 | 7/2003 | Wang et al. |
| 6,597,824 B2 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,610,936 B2 | 8/2003 | Gillespie et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |

| | | |
|---|---|---|
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,008 B1 | 10/2003 | Dole |
| 6,634,009 B1 | 10/2003 | Molson et al. |
| 6,636,096 B2 | 10/2003 | Schaffer et al. |
| 6,636,169 B1 | 10/2003 | Distinti et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B2 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B2 | 12/2003 | Morgan et al. |
| 6,661,410 B2 | 12/2003 | Casebolt et al. |
| 6,661,724 B1 | 12/2003 | Snyder et al. |
| 6,664,978 B2 | 12/2003 | Kekic et al. |
| 6,664,991 B1 | 12/2003 | Chew et al. |
| 6,667,642 B1 | 12/2003 | Moyal |
| 6,667,740 B2 | 12/2003 | Ely et al. |
| 6,670,852 B1 | 12/2003 | Hauck |
| 6,671,869 B2 | 12/2003 | Davidson et al. |
| 6,673,308 B2 | 1/2004 | Hino et al. |
| 6,677,814 B2 | 1/2004 | Low et al. |
| 6,677,932 B1 | 1/2004 | Westerman |
| 6,678,645 B1 | 1/2004 | Rajsuman et al. |
| 6,678,877 B1 | 1/2004 | Perry et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,691,301 B2 | 2/2004 | Bowen |
| 6,697,754 B1 | 2/2004 | Alexander |
| 6,701,340 B1 | 3/2004 | Gorecki et al. |
| 6,701,487 B1 | 3/2004 | Ogami et al. |
| 6,701,508 B1 | 3/2004 | Bartz et al. |
| 6,703,961 B2 | 3/2004 | Mueck et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,718,533 B1 | 4/2004 | Schneider et al. |
| 6,724,220 B1 | 4/2004 | Snyder et al. |
| 6,725,441 B1 | 4/2004 | Keller et al. |
| 6,728,900 B1 | 4/2004 | Meli |
| 6,728,902 B2 | 4/2004 | Kaiser et al. |
| 6,730,863 B1 | 5/2004 | Gerpheide et al. |
| 6,731,552 B2 | 5/2004 | Perner |
| 6,732,068 B2 | 5/2004 | Sample et al. |
| 6,732,347 B1 | 5/2004 | Camilleri et al. |
| 6,738,858 B1 | 5/2004 | Fernald et al. |
| 6,744,323 B1 | 6/2004 | Moyal et al. |
| 6,745,369 B1 | 6/2004 | May et al. |
| 6,748,569 B1 | 6/2004 | Brooke et al. |
| 6,750,852 B2 | 6/2004 | Gillespie et al. |
| 6,750,876 B1 | 6/2004 | Atsatt et al. |
| 6,750,889 B1 | 6/2004 | Livingston |
| 6,754,101 B2 | 6/2004 | Terzioglu et al. |
| 6,754,723 B2 | 6/2004 | Kato |
| 6,754,765 B1 | 6/2004 | Chang et al. |
| 6,754,849 B2 | 6/2004 | Tamura |
| 6,757,761 B1 | 6/2004 | Smith et al. |
| 6,757,882 B2 | 6/2004 | Chen et al. |
| 6,765,407 B1 | 7/2004 | Snyder |
| 6,765,408 B2 | 7/2004 | Cheng et al. |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,774,644 B2 | 8/2004 | Eberlein |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,788,116 B1 | 9/2004 | Cook et al. |
| 6,788,221 B1 | 9/2004 | Ely et al. |
| 6,788,521 B2 | 9/2004 | Nishi |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |
| 6,806,782 B2 | 10/2004 | Motoyoshi et al. |
| 6,809,275 B1 | 10/2004 | Cheng et al. |
| 6,809,566 B1 | 10/2004 | Xin-Leblanc |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,834,384 B2 | 12/2004 | Fiorella, II et al. |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,850,554 B1 | 2/2005 | Sha et al. |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Latham, II et al. |
| 6,873,210 B2 | 3/2005 | Mulder et al. |
| 6,876,941 B2 | 4/2005 | Nightingale |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,014 B2 | 5/2005 | Son et al. |
| 6,901,563 B1 | 5/2005 | Ogami et al. |
| 6,903,402 B2 | 6/2005 | Miyazawa |
| 6,903,613 B1 | 6/2005 | Mitchell et al. |
| 6,904,570 B2 | 6/2005 | Foote et al. |
| 6,910,126 B1 | 6/2005 | Mar et al. |

| | | |
|---|---|---|
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Mueller et al. |
| 6,934,674 B1 | 8/2005 | Douezy et al. |
| 6,937,075 B2 | 8/2005 | Lim et al. |
| 6,940,356 B2 | 9/2005 | McDonald, II et al. |
| 6,941,336 B1 | 9/2005 | Mar |
| 6,941,538 B2 | 9/2005 | Hwang et al. |
| 6,944,018 B2 | 9/2005 | Caldwell |
| 6,949,811 B2 | 9/2005 | Miyazawa |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,960,936 B2 | 11/2005 | Cambonie |
| 6,961,686 B2 | 11/2005 | Kodosky et al. |
| 6,963,233 B2 | 11/2005 | Puccio et al. |
| 6,963,908 B1 | 11/2005 | Lynch et al. |
| 6,966,039 B1 | 11/2005 | Bartz et al. |
| 6,967,511 B1 | 11/2005 | Sullam |
| 6,967,960 B1 | 11/2005 | Bross et al. |
| 6,968,346 B2 | 11/2005 | Hekmatpour |
| 6,969,978 B2 | 11/2005 | Dening |
| 6,970,844 B1 | 11/2005 | Bierenbaum |
| 6,971,004 B1 | 11/2005 | Pleis et al. |
| 6,973,400 B2 | 12/2005 | Cahill-O'Brien et al. |
| 6,975,123 B1 | 12/2005 | Malang et al. |
| 6,980,060 B2 | 12/2005 | Boerstler et al. |
| 6,981,090 B1 | 12/2005 | Kutz et al. |
| 6,988,192 B2 | 1/2006 | Snider |
| 6,996,799 B1 | 2/2006 | Cismas et al. |
| 7,005,933 B1 | 2/2006 | Shutt |
| 7,009,444 B1 | 3/2006 | Scott |
| 7,010,773 B1 | 3/2006 | Bartz et al. |
| 7,015,735 B2 | 3/2006 | Kimura et al. |
| 7,017,145 B2 | 3/2006 | Taylor |
| 7,017,409 B2 | 3/2006 | Zielinski et al. |
| 7,020,854 B2 | 3/2006 | Killian et al. |
| 7,023,215 B2 | 4/2006 | Steenwyk |
| 7,023,257 B1 | 4/2006 | Sullam |
| 7,024,636 B2 | 4/2006 | Weed |
| 7,024,654 B2 | 4/2006 | Bersch et al. |
| 7,026,861 B2 | 4/2006 | Steenwyk |
| 7,030,513 B2 | 4/2006 | Caldwell |
| 7,030,656 B2 | 4/2006 | Lo et al. |
| 7,030,688 B2 | 4/2006 | Dosho et al. |
| 7,030,782 B2 | 4/2006 | Ely et al. |
| 7,034,603 B2 | 4/2006 | Brady et al. |
| 7,042,301 B2 | 5/2006 | Sutardja |
| 7,043,710 B2 | 5/2006 | Reese et al. |
| 7,047,166 B2 | 5/2006 | Dancea |
| 7,052,179 B2 | 5/2006 | Tesi |
| 7,055,035 B2 | 5/2006 | Allison et al. |
| 7,058,921 B1 | 6/2006 | Hwang et al. |
| 7,073,158 B2 | 7/2006 | Mccubbrey |
| 7,076,420 B1 | 7/2006 | Snyder et al. |
| 7,079,166 B1 | 7/2006 | Hong |
| 7,086,014 B1 | 8/2006 | Bartz et al. |
| 7,088,166 B1 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,093,225 B2 | 8/2006 | Osann, Jr. |
| 7,098,414 B2 | 8/2006 | Caldwell |
| 7,099,818 B1 | 8/2006 | Nemecek et al. |
| 7,100,133 B1 | 8/2006 | Meiyappan et al. |
| 7,103,108 B1 | 9/2006 | Beard |
| 7,107,302 B1 | 9/2006 | Fridman et al. |
| 7,109,978 B2 | 9/2006 | Gillespie et al. |
| 7,117,485 B2 | 10/2006 | Wilkinson et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,133,140 B2 | 11/2006 | Lukacs et al. |
| 7,133,793 B2 | 11/2006 | Ely et al. |
| 7,138,841 B1 | 11/2006 | Li et al. |
| 7,138,868 B2 | 11/2006 | Sanchez et al. |
| 7,139,530 B2 | 11/2006 | Kusbel |
| 7,141,968 B2 | 11/2006 | Hibbs et al. |
| 7,141,987 B2 | 11/2006 | Hibbs et al. |
| 7,149,316 B1 | 12/2006 | Kutz et al. |
| 7,150,002 B1 | 12/2006 | Anderson et al. |
| 7,151,528 B2 | 12/2006 | Taylor et al. |
| 7,152,027 B2 | 12/2006 | Andreade et al. |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,164,288 B2 | 1/2007 | Leijten-Nowak |
| 7,171,455 B1 | 1/2007 | Gupta et al. |
| 7,176,701 B2 | 2/2007 | Wachi et al. |
| 7,178,096 B2 | 2/2007 | Rangan et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,199,783 B2 | 4/2007 | Wenstrand et al. |
| 7,200,507 B2 | 4/2007 | Chen et al. |
| 7,206,733 B1 | 4/2007 | Nemecek |
| 7,212,189 B2 | 5/2007 | Shaw et al |
| 7,221,187 B1 | 5/2007 | Snyder et al. |
| 7,227,389 B2 | 6/2007 | Gong et al. |
| 7,236,921 B2 | 6/2007 | Nemecek et al. |
| 7,250,825 B2 | 7/2007 | Wilson et al. |
| 7,256,588 B2 | 8/2007 | Howard et al. |
| 7,265,633 B1 | 9/2007 | Stiff |
| 7,266,768 B2 | 9/2007 | Ferlitsch et al. |
| 7,274,212 B1 | 9/2007 | Burney et al. |
| 7,281,846 B2 | 10/2007 | Mcleod |
| 7,282,905 B2 | 10/2007 | Chen et al. |
| 7,283,151 B2 | 10/2007 | Nihei et al. |
| 7,283,410 B2 | 10/2007 | Hsu et al. |
| 7,287,112 B1 | 10/2007 | Pleis et al. |
| 7,288,977 B2 | 10/2007 | Stanley |
| 7,290,244 B2 | 10/2007 | Peck et al. |
| 7,295,049 B1 | 11/2007 | Moyal et al. |
| 7,298,124 B2 | 11/2007 | Kan et al. |
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,324,380 B2 | 1/2008 | Negut et al. |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,389,487 B1 | 6/2008 | Chan et al. |
| 7,392,011 B1 | 6/2008 | Jacomb-Hood |
| 7,400,183 B1 | 7/2008 | Sivadasan et al. |
| 7,406,674 B1 | 7/2008 | Ogami et al. |
| 7,421,251 B2 | 9/2008 | Westwick et al. |
| 7,461,274 B2 | 12/2008 | Merkin |
| 7,466,307 B2 | 12/2008 | Trent, Jr. et al. |
| 7,472,155 B2 | 12/2008 | Simkins et al. |
| 7,542,533 B2 | 6/2009 | Jasa et al. |
| 7,554,847 B2 | 6/2009 | Lee |
| 7,616,509 B2 | 11/2009 | Qureshi et al. |
| 7,637,658 B2 | 12/2009 | Gardner et al. |
| 7,648,271 B2 | 1/2010 | Doorenbos et al. |
| 7,679,398 B2 | 3/2010 | Osann, Jr. |
| 7,737,724 B2 | 6/2010 | Snyder et al. |
| 7,741,865 B1 | 6/2010 | Sharpe-Geisler et al. |
| 7,809,545 B2 | 10/2010 | Ciolfi et al. |

| | | |
|---|---|---|
| 7,880,459 B2 | 2/2011 | Harvey |
| 7,882,165 B2 | 2/2011 | Simkins et al. |
| 7,908,306 B1 | 3/2011 | Chieng et al. |
| 7,948,989 B2 | 5/2011 | Kapoor |
| 8,024,678 B1 | 9/2011 | Taylor et al. |
| 8,026,739 B2 | 9/2011 | Sullam et al. |
| 8,183,881 B1 * | 5/2012 | Stassart et al. .................. 326/38 |
| 2001/0000634 A1 | 5/2001 | Keehn et al. |
| 2001/0002129 A1 | 5/2001 | Zimmerman et al. |
| 2001/0006347 A1 | 7/2001 | Jefferson et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2001/0047509 A1 | 11/2001 | Mason et al. |
| 2002/0010716 A1 | 1/2002 | Mccartney et al. |
| 2002/0016706 A1 | 2/2002 | Cooke et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll |
| 2002/0099863 A1 | 7/2002 | Comeau et al. |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0144099 A1 | 10/2002 | Muro et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2002/0191029 A1 | 12/2002 | Gillespie et al. |
| 2003/0011639 A1 | 1/2003 | Webb |
| 2003/0014447 A1 | 1/2003 | White |
| 2003/0025734 A1 | 2/2003 | Boose et al. |
| 2003/0033588 A1 | 2/2003 | Alexander |
| 2003/0041235 A1 | 2/2003 | Meyer |
| 2003/0055852 A1 | 3/2003 | Wojko |
| 2003/0056071 A1 | 3/2003 | Triece et al. |
| 2003/0058469 A1 | 3/2003 | Buis et al. |
| 2003/0061572 A1 | 3/2003 | McClannahan et al. |
| 2003/0062889 A1 | 4/2003 | Ely et al. |
| 2003/0066057 A1 | 4/2003 | Rudusky |
| 2003/0080755 A1 | 5/2003 | Kobayashi |
| 2003/0086300 A1 | 5/2003 | Noyes et al. |
| 2003/0097640 A1 | 5/2003 | Abrams et al. |
| 2003/0105620 A1 | 6/2003 | Bowen |
| 2003/0126947 A1 | 7/2003 | Margaria |
| 2003/0135842 A1 | 7/2003 | Frey et al. |
| 2003/0149961 A1 | 8/2003 | Kawai et al. |
| 2003/0229482 A1 | 12/2003 | Cook et al. |
| 2004/0000928 A1 | 1/2004 | Cheng et al. |
| 2004/0017222 A1 | 1/2004 | Betz et al. |
| 2004/0018711 A1 | 1/2004 | Madurawe |
| 2004/0034843 A1 | 2/2004 | Osann |
| 2004/0054821 A1 | 3/2004 | Warren et al. |
| 2004/0153802 A1 | 8/2004 | Kudo et al. |
| 2004/0205553 A1 | 10/2004 | Hall et al. |
| 2004/0205617 A1 | 10/2004 | Light |
| 2004/0205695 A1 | 10/2004 | Fletcher |
| 2005/0024341 A1 | 2/2005 | Gillespie et al. |
| 2005/0066152 A1 | 3/2005 | Garey |
| 2005/0091472 A1 | 4/2005 | Master et al. |
| 2005/0134308 A1 | 6/2005 | Okada et al. |
| 2005/0143968 A9 | 6/2005 | Odom et al. |
| 2005/0240917 A1 | 10/2005 | Wu |
| 2005/0248534 A1 | 11/2005 | Kehlstadt |
| 2005/0280453 A1 | 12/2005 | Hsieh |
| 2005/0283509 A1 | 12/2005 | Hennedy et al. |
| 2006/0015862 A1 | 1/2006 | Odom et al. |
| 2006/0031768 A1 | 2/2006 | Shah et al. |
| 2006/0032680 A1 | 2/2006 | Elias et al. |
| 2006/0066345 A1 | 3/2006 | Leijten-Nowak |
| 2006/0097991 A1 | 5/2006 | Hotelling et al. |
| 2006/0195498 A1 | 8/2006 | Dobbek et al. |
| 2006/0273804 A1 | 12/2006 | Delorme et al. |
| 2007/0139074 A1 | 6/2007 | Reblewski |
| 2007/0258458 A1 | 11/2007 | Kapoor |
| 2008/0042687 A1 | 2/2008 | Mori et al. |
| 2008/0086668 A1 | 4/2008 | Jefferson et al. |
| 2008/0094102 A1 | 4/2008 | Osann |
| 2008/0095213 A1 | 4/2008 | Lin et al. |
| 2008/0186052 A1 | 8/2008 | Needham et al. |
| 2008/0258759 A1 | 10/2008 | Snyder et al. |
| 2008/0258804 A1 | 10/2008 | Kutz |
| 2008/0259998 A1 | 10/2008 | Venkataraman et al. |
| 2008/0263319 A1 | 10/2008 | Snyder et al. |
| 2008/0263334 A1 | 10/2008 | Synder et al. |
| 2008/0288755 A1 | 11/2008 | Synder et al. |
| 2008/0294806 A1 | 11/2008 | Swindle et al. |
| 2009/0322305 A1 | 12/2009 | De Cremoux |

FOREIGN PATENT DOCUMENTS

| | | |
|---|---|---|
| EP | 368398 A1 | 5/1990 |
| EP | 0450863 A | 10/1991 |
| EP | 0499383 A | 8/1992 |
| EP | 0639816 A1 | 2/1995 |
| EP | 0639816 A2 | 2/1995 |
| EP | 1170671 A | 1/2002 |
| EP | 1191423 A | 3/2002 |
| EP | 1205848 A1 | 5/2002 |
| JP | 4083405 A | 3/1992 |
| JP | 4095408 A | 3/1992 |
| JP | 5055842 A | 3/1993 |
| JP | 6021732 A | 1/1994 |
| WO | 9532478 A1 | 11/1995 |
| WO | 9617305 A | 6/1996 |
| WO | 9834376 A2 | 8/1998 |
| WO | 9909712 A | 2/1999 |

OTHER PUBLICATIONS

"An Analog PPL-Based Clock and Data Recovery Circuit with High Input Jitter Tolerance," Sun, Reprinted from IEEE Journal of Solid-State Circuits, 1988; 4 pages.

"Electronic Circuit Protector-Circuit Breaker:" IBM Technical Disclosure Bulletin; vol. 36, Issue 8, Aug. 1, 1993; 1 page.

"In-Circuit Emulators—descriptions of the major ICEs around," retrieved on Nov. 14, 2005 from http://www.algonet.se/~staffann/developer/emulator.htm; 6 pages.

"Microsoft Files Summary Judgement Motions"; Feb. 1999; Microsoft PressPass. retrieved on May 20, 2005 from http://www.microsoft.com/presspass/press/1999/feb99/Feb99/Calderapr.asp; 3 pages.

"New Object Domain R3 Beta Now Available (Build 134)!" Mar. 13, 2001; http://web.archive.org/web/200100331202505/www.objectdomain.com/domain30/index.html; 2 pages.

"OMG XML Metadata Interchange (XMI) Specifications" 2000; 17 pages.

"POD—Piece of Data, Plain Old Documentation, Plain Old Dos . . . "; retrieved on Nov. 14, 2005 from http://www.auditmypc.com/acronym/POD.asp; 2 pages.

"PSoC Designer, Integrated Development Environment User Guide", Jul. 17, 2001; Cypress MicroSystems, Revision 1.11; all pages.

"PSoC designer: Integrated development environment, getting stetted 25-minute tutorial, version 1.0," Cypress Microsystems, Cypress Microsystems, Inc. CMS10008A,luly 3, 2001; 25 pages.

"PSoC technology complete changes 8-bit MCU system design", Cypress Microsystems, Inc retrieved from <http>://www.archive.org/web/20010219005250/http://cypressmicro.com-/t . . .>, Feb. 19, 2001; 21 pages.

"The Gemini Netlist Comparison Project;" <http://www.cs.washington.edu/research/projects/lis/www/gemini/gemini.html> larry@cs.washington.edu; Mar. 19, 2002; 2 pages.

"VHDL Samples" retrieved on Jan. 29, 2007 from, http://www.csee.umbc.edu/help/VHDL/samples/samples.shtml; 10 pages.

"Webster's Third New International Dictionary," 1996, G. & C. Merriam Company: 3 pages (including pp. 1328-1329).

A.F. Harvey "DMA Fundamentals on Various PC Platforms," 2001, 2004, National Instruments Corporation; pp. 1-19; 19 pages.

Adham et al., "Preliminary Outiine of the IEEE P1500 Scalable Architecture for Testing Embedded Cores," 1999, IEEE; 6 pages.

Andrew S. Tanenbaum with contributions from James R. Goodman, "Structured Computer Organization," 1999, Prentice Hall, Fourth Edition; 32 pages.

Andrews, "Roadmap for Extending IEEE 1149.1 for Hierarchical Control of today-Stored, Standardized command Set, Test Programs," IEEE, 1994; 7 pages.

Anonymous. "F/Port: Fast Parallel Port for the PC" Installation Manual Release 7.1, circa 1997, available for download from http://www.fapo.com/fport.htm; 25 pages.

Anonymous, "JEEN JTAG Embedded Ice Ethernet Interface," Aug. 1999, Embedded Performance, Inc.; 3 pages.

Anonymous: "Lotus Notes FAQ—How do you generate unique document numbers?" Sep. 19, 1999; retrieved from www.keysolutions.com on Jul. 9, 2008; 1 page.

Anonymous, "Warp Nine Engineering—The IEEE 1284 Experts-F/Port Product Sheet," undated web page found at http://www.fapo.com/fport.htm; printed on Apr. 12, 2005; 2 pages.

Anonymous: "Using Debug"; 1999; Prentice-Hall Publishing; 20 pages.

U.S. Appl. No. 09/207,912: "Circuit(s), Architecture and Method(s) for Operating and/or Tuning a Ring Oscillator," Monte Mar, filed on Dec. 9, 1998; 23 pages.

U.S. Appl. No. 09/747,231: "Linearized Digital Phase-Locked Loop Method," Williams et al.; filed on Dec. 21, 2000; 29 pages.

U.S. Appl. No. 09/842,966: "Precision Crystal Oscillator Circuit Used in Microcontroller," Monte Mar, filed on Apr. 25, 2001; 26 pages.

U.S. Appl. No. 09/943,062: "Apparatus and Method for Programmable Power Management in a Programmable Analog Circuit Block," Monte Mar, filed on Aug. 29, 2001; 46 pages.

U.S. Appl. No. 09/964,99: "A Novel Band-Gap Circuit for Providing an Accurate Reference Voltage Compensated for Process State, Process Variations and Temperature," Kutz et al., filed Sep. 26, 2001; 26 pages.

U.S. Appl. No. 09/989,775: "User defined names for registers in memory banks derived from configurations," Ogami et al., filed on Nov. 19, 2001; 29 pages.

U.S. Appl. No. 10/002,726: "Method and Apparatus for Generatng Microcontroller Configuration Information," Ogami et al., filed on Nov. 19, 2001; 54 pages.

U.S. Appl. No. 10/074,093: "Configurable Memory for Programmable Logic Circuits," Lacey et al., filed on Dec. 18, 2001; 25 pages.

U.S. Appl. No. 10/137,497: "Reconfigurable Testing System and Method," Pleis et al.; filed on May 1, 2002; 40 pages.

U.S. Appl. No. 10/172,670: "Method and System for Programming a Memory Device," Snyder et al.; filed on Jun. 13, 2002; 66 pages.

U.S. Appl. No. 10/238,966: "Method for Parameterizing a User Module," Perrin et al., filed on Sep. 9, 2002; 41 pages.

U.S. Appl. No. 10/653,050: "Method and System for Programming a Memory Device," Snyder et al.; filed on Aug. 29, 2003; 69 pages.

U.S. Appl. No. 11/088,028: "Method and Circuit for Rapid Alignment of Signals," Moyal et al., filed on Nov. 13, 2007; 34 pages.

U.S. Appl. No. 11/166,622: "Touch Wake for Electronic Devices," Beard et al., filed on Jun. 23, 2005; 221 pages.

U.S. Appl. No. 11/200,619: "Providing hardware independence to automate code generation of processing device firmware," Snyder et al.; filed on Aug. 10, 2005; 41 pages.

U.S. Appl. No. 11/201,627: "Method and an apparatus to design a processing system using a graphical user interface," Ogami et al.; filed on Aug. 10, 2005, 37 pages.

U.S. Appl. No. 11/818,005: "Techniques for Generating Microcontroller Configuration Information," Ogami et al., filed on Aug. 12, 2007; 61 pages.

U.S. Appl. No. 11/963,661: "Universal Digital Block With Integrated Arithmetic Logic Unit," Warren Snyder et al., Filed on Dec. 21, 2007; 30 pages.

U.S. Appl. No. 11/965,291: "Universal Digital Block Interconnection and Channel Routing," Snyder et al., filed on Dec. 27, 2007; 31 pages.

U.S. Appl. No. 11/968,145: "Dynamically Configurable and Re-Configurable Data Path," Warren Synder et al., Filed on Dec. 31, 2007; 36 pages.

U.S. Appl. No. 11/985,340: "Method and Circuit for Rapid Alignment of Signals," Moyal et al., filed on Nov. 13, 2007; 34 pages.

U.S. Appl. No. 11/986,338: Reconfigurable Testing System n Method, Pleis et al., filed on Nov. 20, 2007 41 pages.

U.S. Appl. No. 12/004,833: "Systems and Methods for Dynamically Reconfiguring a Programmable System on a Chip," Memula, Suresh et al., Filed on Dec. 21, 2007; 50 pages.

U.S. Appl. No. 12/057,149: "Power Management Architecture, Method and Configuration System," Kenneth Ogami, filed on Mar. 27, 2008; 41 pages.

U.S. Appl. No. 12/058 534: "System and Method for Controlling a Target Device," Kenneth Ogami et al., filed on Mar. 28, 2008; 55 pages.

U.S. Appl. No. 12/058,589: "Configuration of Programmable IC Design Elements," Best et al., filed on Mar. 28, 2008, 19 pages.

U.S. Appl. No. 12/056,586: "System and Method for Monitoring a Target Device," Kenneth Ogami et al., filed on Mar. 28, 2008; 56 pages.

U.S. Appl. No. 12/060,176: "Programmable System-On-Chip Hub," Scott Allen Swindle et al., Filed on Mar. 31, 2008; 39 pages.

U.S. Appl. No. 12/804,391: "Clock Driven Dynamic Datapath Chaining" Warten Synder et al., Filed on Apr. 16, 2008; 31 pages.

U.S. Appl. No. 12/356,468: "System and Method for Dynamically Generating a Configuration Datasheet," Anderson et al.; filed on Jan. 20, 2009; 27 pages.

U.S. Appl. No. 12/765,400: "Autonomous Control in a Programmable System," Sullam et al., filed on Apr. 22, 2010; 30 pages.

U.S. Appl. No. 12/786,412 "Universal Digital Block Interconnection and Channel Routing," Warren Snyder et al., Filed on May 24, 2010: 31 pages.

U.S. Appl. No. 13/099,334 "Universal Digital Block Interconnection and Channel Routing," Warren Snyder et al., Filed on May 2, 2011; 32 pages.

Application No. 200880012232.1 "Universal Digital Block Interconnection and Channel Routing," Warren Snyder et al., Filed on Apr. 17, 2008.

Application No. PCT/US08/60673 "Clock Driven Dynamic Datapath Chaining," Filed on Apr. 17, 2008; 24 pages.

Application No. PCT/US08/60680 "Universal Digital Block Interconnection and Channel Routing," Filed on Apr. 17, 2008; 25 pages.

Application No. PCT/US08/60685 "Universal Digital Block With Integrated Arithmetic Logic Unit," Filed on Apr. 17, 2008; 24 pages.

Application No. PCT/US08/60696 "Dynamically Configurable and Re-Configurable Data Path," Filed on Apr. 17, 2008; 29 pages.

Ashok Bindra, "Programmable SoC Delivers a New Level of System Flexibility"; Electronic Design; Nov. 6, 2000; 11 pages.

Atmel Corporation: AT9OSC Summary: "Secure Microcontrollers for Smart Cards." Oct. 1999, 7 pages.

Azim et al, "A Custom DSP Chip to implement a Robot Motion Controller Proceedings of the IEEE Custom Integrated Circuits Conference," May 1988, pp. 8.7.1-8.7.5; 6 pages.

Bakker et al, "Micropower CMOS Temperature Sensor with Digital Output," IEEE Journal of Solid-State Circuits, Jul. 1996; 3 pages.

Balough at al, "White Paper: Comparing IP lntegration Approaches for FPGA Implementation," Feb. 2007, Version 1.1, Altera, pp. 1-7 7 pages.

Bauer et al.; "A Reconfigurable Logic Machine for Fast Event-Driven Simulation"; Jun. 1998; Design Automation Conference Proceedings; 8 pages.
Burogs et al., "Power Converter Analysis and Design using Matlab. A Transfer Function Approach," Proceedings of IEEE International Symposium on Industrial Electronics 1998, vol. 2, pp. 552-557; 6 pages.
Bursky, "FPGA Combines Multiple Interfaces and Logic," Electronic Design, vol. 48 No. 20, Oct. 2, 2000, pp. 74-78; 5 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
Chapweske, Adam, "The PS/2 Mouse Interface," PS/2 Mouse Interfacing, 2001, retrieved on May 18, 2006; 11 pages.
Charles Melear, "Using Background Modes for Testing, Debugging and Emulation of Miorocontrollers," IEEE, 1997, pp. 90-97; 8 pages.
Charles, Jr. et al., "Wirebonding: Reinventing the Process for MCMs," Apr. 1998, IEEE 7th International Conference on Multichip Modules and High Density Packaging, pp. 300-302; 3 pages.
Ching et al, "An In-Curcuit-Emulator for TMS320C25," IEEE, 1994, pp. 51-56; 6 pages.
Cover Pages Technology Reports XML and Electronic Design Automation (EDA); Aug. 2000; retrieved from http://xml.coverpages.org on Mar. 23, 2005; 5 pages.
Cypress MicroSystem, Inc. "Cypress Customer Forums" retrieved from <http://www.cypress.com/forums/messageview>; Nov. 30, 2004; 1 page.
Cypress MicroSystem, Inc. "PsoC Designer: Integrated Development Environment User Guide"; Rev. 1,18; Sep. 8, 2003; 193 pages.
Cypress MicroSystems, Inc. "Cypress MicroSystems Unveils Programmable System-On-A-Chip for Embedded Internet, Communications, and Consumer Systems" Nov. 13, 2000; 3 pages.
Cypress Semiconductor Corporation, "CY8C21x34 Data Sheet," CSR User Module, CSR V.1.0; Oct. 6, 2005; 36 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC CY8C20x34 Technical Reference Manual (TRM)," PSoC CY8C20x34 TRM, Version 1.0, 2006; 218 pages.
Cypress Semiconductor Corporation, "PSoC Mixed-Signal Controllers," Production Description <http://www.cypress.com/portal/server>; retrieved on Sep. 27, 2005; 2 pages.
Cypress Semiconductor Corporation, "Release Notes srn017," Jan. 24, 2007; 3 pages.
Dahl et al., "Emulation of the Sparcle Microprocessor with the MIT Virtual Wires Emulation System," 1994. IEEE, pp. 14-22; 9 pages.
Daniel B. Sedory, "A Guide to DEBUG," 2004, retrieved on May 20, 2005 from http://www.geocites.com/thestarman3/asm/debug/debug2.htm, pp. 1-11; 7 pages.
Dirk Killat, "A One-Chip Solution for Electronic Ballasts in Fluorescent Lamps," Power Electronics, http://powerelectronics.com/mag/power_onechip_solution_electronic/, dated Mar. 1, 2004, accessed Sep. 13, 2005; 4 pages.
Durham et al., "Circuit Architectures for High Linearity Monolithic Continuous-Time Filtering:" IEEE, 1992; 7 pages.
Durham et al., "High-Linearity Conitnuous-Time Filter in 5-V VLSI CMOS," IEEE, 1992; 8 pages.
Durham et al., "Integrated Continuous-Time Balanced Filters for 16-bit DSP Interfaces," IEEE, 1993; 6 pages.
Duvvuru et al., "Evaluation of a Branch Target Address Cache," 1995, IEEE, pp. 173-180; 8 pages.
Ebeling et al., "Validating VLSI Circuit Layout by Wireiist Comparison," Sep. 1983, In the Proceedings of the IEEE International Conference on Computer Aided Design (ICCAD-83), pp. 172-173; 2 pages.
Ebling, "Gemini II: A Second Generation Layout Validation Program;" 1988; in proceedings of the IEEE International Conference on Computer Aided Design (ICCAD-88); 4 pages.
Efstathiou, "Analog Electronics: Basic Circuits of Operational Amplifiers," <http://web.archive.org/web/20021231045232> Dec. 31, 2002, version, retrieved from the Internet Archives; 10 pages.
Electronic Tools Company, E-Studio User Manuel; 2000; retrieved from http://web.archive.org for site http://e-tools.com on Mar. 23, 2005; 77 pages.
Frank Goodenough, "Analog Counterparts of FPGAS Ease System Design," Electronic Design, Penton Publishing, Cleveland, OH, Oct. 14, 1994, vol. 42, No. 21, pp. 63-66, 68; 10 pages.
Fred Eady, "PSoC 101," Circuit Cellar, Aug. 2004, accessed Sep. 13, 2005, http://www.circuitcellar.com/library/print/0804/eady169/2.htm; 4 pages.
From U.S. Appl. No. 10/033,027; "Programmable Microcontroller (PSoC) Architecture (Mixed Analog/Digital)"; Aug. 7, 2001; U.S Appl. No. 09/924,734 Snyder et al.; 28 pages.
Ganapathy et al., "Hardware Emulation for Functional Verification of K5", Jun. 1996, 33rd Design Automation Conference Proceedings, Jun. 3-7, 1996, pp. 315-318; 4 pages.
Ghosh et al., "A Low Overhead Design for Testability and Test Generation Technique for Core-based Systems," IEEE, 1997; 10 pages.
Haberl et al., "Self Testable Boards with Standard IEEE 1149.5 Module Test and Maintenance (MTM) Bus Interface," IEEE, 1994; 6 pages.
Hamblen, "Rapid Prototyping Using Field-Programmable Logic Devices" Jun. 2000, IEEE; 9 pages.
Harbaurn et al. "Design of a Flexible Coprocessor Unit" Proceedings of the Euromicro Conference, XX XX, Sep. 1999, pp. 335-342; 10 pages.
Harrison et al.; "Xilinx FPGA Design in a Group Environment Using VHDS and Synthesis Tools"; Colliquium on Digital System Design Using Synthesis Techniques; Feb. 15, 1996; 4 pages.
Hintz et al., "Microcontrollers," 1992, McGraw-Hill, pp. 29-37; 11 pages.
Hong et al., "An FPGA-Based Hardware Emulator for Fast Fault Emulation," IEEE, 1997, pp. 345-348; 4 pages.
Hong et al., "Hierarchial System Test by an IEEE 1149.5 MTM-Bus Slave-Module Interface Core," IEEE, 2000; 14 pages.
Hsieh et al., "Modeling Micro-Controiler Peripherais for High-Level Co-Simulation and Synthesis." IEEE, 1997, pp. 127-130; 4 pages.
Huang et al., "Iceberg: An Embedded In-Circuit Emulator Synthesizer for Microcontrollers", Proceedings of the 36th Design Automation Conference, Jun. 1999, pp. 580-585; 6 pages.
Hwang et al, "Integrated circuit for automatically varying resistance in computer system, has pair of transistors connected in parallel with respective resistors such that resistors are bypassed when corresponding transistors are enabled," Derwent information LTD; 2002; 2 pages.
International Search Report and Written Opinion of the International Searching Authority for PCT/US05/28898, filed Aug. 12, 2005, mailed Mar. 6, 2007; 6 pages.
International Search Report for International Application No. PCT/US2006/09572 dated Jan. 10, 2008; 2 pages.
International Search Report for International Application No. PCT/US05/28793 mailed Dec. 16, 2007; 8 pages.
International Search Report for International Application No. PCT/US08/60680 dated Aug. 15, 2008; 2 pages.
International Search Report for International Application No. PCT/US08/60685 dated Sep. 17, 2008; 5 pages.
International Search Report for International Application No. PCT/US08/60695 dated Jul. 22, 2009; 3 pages.
International Search Report for International Application No. PCT/US08/60696 dated Sep. 22, 2008; 5 pages.
International Search Report for International Application No. PCT/US10/33626 mailed Jun. 24, 2010; 3 pages.
International Search Report of the International Searching Authority for International Application No. PCT/US08/60681 dated Sep. 12, 2008; 2 pages.

International Search Report of the International Searching Authority for International Application No. PCT/US08/60698 dated Sep. 5, 2008; 2 pages.
International Written Opinion for International Apptication No. PCT/US08/60685 dated Sep. 17, 2008; 4 pages.
International Written Opinion of the International Searching Authority for International Appitcation No. PCT/US2006/09572 dated Jan. 10, 2008; 7 pages.
International Written Opinion of the International Searching Authority for International Application No. PCT/US08/60698 dated Sep. 5, 2008; 2 pages.
Ito et al., "A Comparison of Microcontrollers Targeted to FPGA-Based Embedded Applications", Sep. 2000, Proceedings of 13th Symposium on Integrated Circuits and Systems Design, Sep. 18-24, 2000, pp. 397-402; 6 pages.
John Mangino, "Using DMA with High Performance Peripherals to Maximize System Performance," 2007, Texas Instruments, pp. 1-23; 23 pages.
Jonathan B. Rosenburg, "How Debuggers Work" John Wiley & Sons, Inc. 1996; 259 pages.
Julio Faure et al.; "A Novel Mixed Signal Programmable Device With On-Chip Microprocessor", 1997, IEEE 1997 Custom Integrated Circuits Conference, pp. 103-106; 4 pages.
Jung et al., "A Register File with Transposed Access Mode," 2000, IEEE; 2 pages.
Khan et al.; "FPGA Architectures for Asic Hardware Emulators"; IEEE 1993, pp, 336-340, 5 pages.
Kory Hopkins, "Definition;" Jan. 16, 1997; <http://www.cs.sfu.ca/cs/people/GradStudent.html>; 1 page.
Kutz et al, "Novel Method and System for Interaction Between a Processor and a Power on Reset Circuit to Dynamically Control Power States in a Microcontroller", Jun. 22, 2001, U.S. Appl. No. 09/887,923.
Larsson, "A 2-1600-MHz CMOS Clock Recovery PLL with Low-V dd Capability," IEEE Journal of Solid-State Circuits, vol. 34, No. 12, Dec. 1999; 10 pages.
Lee, Mark; "EMC Design Considerations for PSoC CapSense Applications," Cypress Semiconductor Corporation, Application Note An2318; Sep. 16, 2005; 6 pages.
Lutovac et al. "Symbolic Computation on Digital Filter Transfer Function Using MATLAB," Proceedings of 23rd International Conference on Microelectronics, vol. 2 NIS, Yugoslavia, May 2002, pp. 651-654; 4 pages.
M. Mooris Mano, "Computer System Architecture," 1982, Prentice-Hall, 2nd Edition, pp. 261-264 and 435-440; 14 pages.
Maneatis, "Low-Jitter Process-Independent DLL and PLL Based on Self-Biased Techniques," IEEE Journal of Solid-State Circuits, vol. 31, No. 11, Nov. 1996, pp. 1723-1732; 10 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, vol. 45, No. 3, Feb. 3, 2000, pp. 129-138; 7 pages.
Microsoft Computer Dictionary "ActiveX" 2002; Microsoft Press; 5th Edition; 3 pages.
Microsoft Press Computer User's Dictionary; 1998; 3 pages (including p. 18).
Monte Mar et al., "An architecture for a configurable Mixed-signal device", 2003, IEEE Journal of Solid-State Circuits, vol. 3, pp. 565-568; 4 pages.
Morrison, Gate, "IBM Eyes Merchant Packaging Services," Jul. 13, 2998, Electronic News, available at http://www.findarticles.com; 4 pages.
Nam et al., "Fast Development of Source-Level Debugging System Using Hardware Emulation," IEEE, 2000, pp. 400-404; 4 pages.
Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Oh et al., "Emulator Environment Based on an FPGA Prototyping Board," IEEE, Jun. 21-23, 2000, pp. 72-77; 6 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Papachristou et al., "Microprocessor Based Testing for Core-Based System on a Chip," IEEE, 1999; 6 pages.
Pasternak, "In-Circuit-Emulation in ASIC Architecture Core Designs," IEEE, 1989, pp. P6-4.1-P6-4.4; 4 pages.
PCT International Search Report for PCT/US05/28791 filed Aug. 12, 2005, mailed Mar. 31, 2008; 4 pages.
PCT International Written Opinion for PCT/US05/28791, filed Aug. 12, 2005, mailed Mar. 31, 2008; 8 pages.
PCT Written Opinion of the International Searching Authority for PCT/US2005/028793, filed Aug. 12, 2005, mailed Nov. 19, 2007; 7 pages.
USPTO Advisory Action for U.S. Appl. No. 11/968,145 dated Oct. 6, 2011; 3 pages.
USPTO Advisory Action for U.S. Appl. No. 12/060,176 dated Sep. 7, 2012, 3 pages.
USPTO Advisory Action for U.S. Appl. No. 12/138,577 dated Oct. 29, 2010; 3 pages.
USPTO Advisory Action for U.S. Appl. No. 12/239,450 dated Aug. 14, 2012.
USPTO U.S. Appl. No. 08/865,342: "Programmable Clock Generator," Mann et al., filed on May 29, 1997; 41 pages.
USPTO U.S. Appl. No. 09/047,595: "Roving Range Control to Limit Receive PLL Frequency of Operation," Paul H. Scott, filed on Mar. 29, 1998; 35 pages.
USPTO U.S. Appl. No. 09/048,905: "Programmable Clock Generator," Mann et al., filed on Mar. 26, 1998; 42 pages.
USPTO U.S. Appl. No. 09/216,460: "Circuit and Method for Controlling an Output of a Ring Oscillator," Abugharbieh et al., filed on Dec. 18, 1998; 21 pages.
USPTO U.S. Appl. No. 09/275,336: "Programmable Oscillator Scheme," Mar et al., filed on Mar. 24, 1999; 25 pages.
USPTO U.S. Appl. No. 09/398,956: "Frequency Acquisition Rate Control in Phase Lock Loop Circuits," Moyal et at., filed on Sep. 17, 1999; 35 pages.
USPTO U.S. Appl. 09/404,891: "Method, Architecture and Circuitry for Controlling Pulse Width in a Phase and/or Frequency Detector," Scott et al., filed on Sep. 24, 1999; 17 pages.
USPTO U.S. Appl. No. 09/470,665: "Digital Phase/Frequency Detector, and Clock Generator and Data Recovery PLL Containing the Same," Kamal Dalmia, filed on Dec. 23, 1999; 26 pages.
USPTO U.S. Appl. No. 09/471,576: "Reference-Free Clock Generation and Data Recovery PLL," Kemal Dalmia, filed on Dec. 23, 1999; 30 pages.
USPTO U.S. Appl. No. 09/471,914: "Reference-Free Clock Generator and Data Recovety PLL," Dalmia et al., filed on Dec. 23, 1999; 32 pages.
USPTO U.S. Appl. No. 09/475,808: "Configurable Memory for Programmable Logic Circuits," Lacey et al., filed on Dec. 30, 1999; 24 pages.
USPTO U.S. Appl. No. 09/475,879: "Programmable Logic Device," Lacey et al.; filed on Dec. 30, 1999; 50 pages.
USPTO U.S. Appl. No. 09/538,989: "Memory Based Phase Locked Loop," Rengarajan S. Krishnan, filed on Mar. 30, 2000; 27 pages.
USPTO U.S. Appl. No. 09/608,753: "PLL Lockout Watchdog," Wilson et al., filed on Aug. 24, 2004; 24 pages.
USPTO U.S. Appl. No. 09/721,316: "Pogammabe Oscillator Scheme," Mar et al., filed on Nov. 22, 2000; 26 pages.
USPTO U.S. Appl. No. 09/826,397: "Method and Circuit for Allowing a Microprocessor to Change its Operating Frequency on-the-Fly," Bert Sullam, filed on Apr. 21, 2001; 24 pages.
USPTO U.S. Appl. No. 09/849,164: "Reduced Static Phase Error CMOS PLL Charge Pump," Jonathon Stiff, filed on May 4, 2001; 30 pages.
USPTO U.S. Appl. No. 09/855,868: "Protecting Access to Microcontroller Memory Blocks," Warren Snyder, filed on May 14, 2001; 28 pages.
USPTO U.S. Appl. No. 09/875,599: "Method and Apparatus for Programming a Flash Memory," Warren Snyder, filed on Jun. 5, 2001; 23 pages.
USPTO U.S. Appl. No. 09/887,923: "Novel Method and System for Interacting between a Processor and a Power on Reset to Dynamically Control Power States in a Microcontroller," Kutz et al., filed on Jun. 22, 2001; 44 pages.

USPTO U.S. Appl. No. 09/887,955: "Novel Power on Reset Circuit of Microcontroller," Kutz et al., filed on Jun. 22, 2001; 42 pages.
USPTO U.S. Appl. No. 09/893,048: "A Microcontroller haying an On-Chip High Gain Amplifier," Kutz et al., filed on Jun. 26, 2001; 22 pages.
USPTO U.S. Appl. No. 09/893,050: "Multiple Use of Microcontroller Pad," Kutz et al., filed on Jun. 26, 2001; 21 pages.
USPTO U.S. Appl. No. 09/693,161: "Architecture of a PLL with Dynamic Frequency Control on a PLD," Michael T. Moore, filed on Jun. 27, 2001; 32 pages.
USPTO U.S. Appl. No. 09/909,045; "Digital Configurable Macro Architecture," Warren Snyder, filed on Jul. 18, 2001; 37 pages.
USPTO U.S. Appl. No. 09/909,047: "A Programmable Analog System Architecture," Monte Mar, filed on Jul. 18, 2001; 60 pages.
USPTO U.S. Appl. No. 09/909,109: "Configuring Digital Functions in a Digital Configurable Macro Architecture," Warren Snyder, filed on Jul. 18, 2001; 38 pages.
USPTO U.S. Appl. No. 09/912,768: "A Microcontroller having a Dual Mode Relax Oscillator that is Trimmable," James Shutt; filed on Jul. 24, 2001; 33 pages.
USPTO U.S. Appl. No. 09/922,419:"A Power Supply Pump Circuit for a Microcontroller," Kutz et al., filed on Aug. 3, 2011; 38 pages.
USPTO U.S. Appl. No. 09/922,579: "A Method for a Efficient Supply to a Microcontroller," Kutz et al., filed on Aug. 3, 2001; 37 pages.
USPTO U.S. Appl. No. 09/923,461: "Non-interfering Multiply-Mac (Multiply Accumulate) Circuit," Warren Snyder, filed on Aug. 6, 2001; 25 pages.
USPTO U.S. Appl. No. 09/924,734: "Programmable Microcontroller (PSoC) Architecture (Mixed Analog/Digital)", Snyder et al., filed on Aug. 7, 2001; 28 pages.
USPTO U.S. Appl. No. 09/929,891: "Programming Architecture for a Programmable Analog System," Mar et al., filed on Aug. 14, 2001; 82 pages.
USPTO U.S. Appl. No. 09/930,021: "Programmable Methodology and Architecture for a Programmable Analog System"; Mar et al., filed on Aug. 14, 2001; 87 pages.
USPTO U.S. Appl. No. 09/935,454: "Method and Apparatus for Local and Global Power Management in a Programmable Analog Circuit," Monte Mar, filed on Aug. 22, 2001; 56 pages.
USPTO U.S. Appl. No. 09/943,149: "Method for Phase Locking in a Phase Lock Loop," Moyal et al., filed on Aug. 30, 2001; 25 pages.
USPTO U.S. Appl. No. 09/953,423: "A Configurable Input/Output Interface for a Microcontroller," Warren Snyder, filed on Sep. 14, 2001; 28 pages.
USPTO U.S. Appl. No. 09/957,084: "A Crystal-Less Oscillator with Trimmable Analog Current Control for Increased Stability," Mar et al., filed on Sep. 19, 2001; 28 pages.
USPTO U.S. Appl. No. 09/969,311: "Method for Synchronizing and Resetting Clock Signals Supplied to Multiple Programmable Analog Blocks," Bert Sullam, filed on Oct. 1, 2001; 57 pages.
USPTO U.S. Appl. No. 09/969,313: "Architecture for Synchronizing and Resetting Clock Signals Supplied to Multiple Analog Programmable Analog Blocks," Bert Sullan, filed on Oct. 1, 2001; 50 pages.
USPTO U.S. Appl. No. 09/972,003: "Test Architecture for Microcontroller Providing for a Serial Communication Interface," Warren Snyder, filed on Oct. 5, 2001; 32 pages.
USPTO U.S. Appl. No. 09/972,133: "Method for Entering Circuit Test Mode," Warren Snyder, filed on Oct. 5, 2001; 30 pages.
USPTO U.S. Appl. No. 09/972,319: "Method for Applying Instructions to Microprocessor in Test Mode," Warren Snyder, filed on Oct. 5, 2001; 31 pages.
USPTO U.S. Appl. No. 09/973,535: "Architecture for Decimatlon Algorithm," Warren Snyder, filed on Oct. 9, 2001; 26 pages.
USPTO U.S. Appl. No. 09/975,030: "Emulator Chip-Board Architecture for Interface," Snyder et al., filed on Oct. 10, 2001; 37 pages.
USPTO U.S. Appl. No. 09/975,104: "Capturing Test/Emulation and Enabling Real-Time Debugging Using FPGA for In-Circuit Emulation," Warren Snyder, filed on Oct. 10, 2001; 35 pages.
USPTO U.S. Appl. No. 09/975,105: "Host to FPGA Interface in an In-Circuit Emulation System," Craig Nemecek, filed on Oct. 10, 2001; 44 pages.
USPTO U.S. Appl. No. 09/975,115: "In-System Chip Emulator Architecture," Snyder et al., filed on Oct. 10, 2001; 38 pages.

USPTO U.S. Appl. No. 09/975,338: "Method for Breaking Execution of a Test Code in DUT and Emulator Chip Essentially Simultaneously and Handling Complex Breakpoint Events," Nemecek et al., filed on Oct. 10, 2001; 34 pages.
USPTO U.S. Appl. No. 09/977,111: "A Frequency Doubler Circuit with Trimmable Current Control," Shutt et al., filed on Oct. 11, 2001; 35 pages.
USPTO U.S. Appl. No. 09/981,448: "Oscillator Tuning Method," Lane T. Hauck, filed on Oct. 17, 2001; 28 pages.
USPTO U.S. Appl. No. 09/989,574: "Method and System for using a Graphics user Interface for Programming an Electronic Device," Bartz et al., filed on Nov. 19, 2001; 43 pages.
USPTO U.S. Appl. No. 09/989,761: "Storing of global parameter defaults and using them over town or more design projects," Ogami et al., filed on Nov. 19, 2001; 37 pages.
USPTO U.S. Appl. No. 09/989,781: "System and method for decoupling and iterating resources associated with a module," Ogami et al., filed on Nov. 19, 2001; 40 pages.
USPTO U.S. Appl. No. 09/989,808: "Automatic generation of application program interfaces, source code, interrupts, and data sheets for microcontroller programming," Bartz et al., filed on Nov. 19, 2001; 67 pages.
USPTO U.S. Appl. No. 09/989,815: "A Data Driven Method and System for Monitoring Hardware Resource Usage for Programming an Electric Device," Bartz el al., filed on Nov. 19, 2001; 36 pages.
USPTO U.S. Appl. No. 09/989,816: "Datasheet Browsing and Creation with Data-Driven Datasheet Tabs within a Microcontroller Design Tool" Bartz et al, filed on Nov. 19, 2001; 55 pages.
USPTO U.S. Appl. No. 09/989,619: "System and method for creating a boot file utilizing a boot template," Ogami et al., filed on Nov. 19, 2001; 43 pages.
USPTO U.S. Appl. No. 09/996,834: "A System and a Method for Communication bewteen and Ice and a Production Microcontroller while in a Halt State," Craig Nemecek, filed on Nov. 15, 2001; 33 pages.
USPTO U.S. Appl. No. 09/998,859: "A System and a Method for Checking Lock Step Consistency between in Circuit Emulation and a Microcontroller while Debugging Process is in Progress," Craig Nemecek, filed on Nov. 15, 2001; 33 pages.
USPTO U.S. Appl. No. 10/000,383: "System and Method of Providing a Programmable Clock Architecture for an Advanced Microcontroller," Sullam et al., filed on Oct. 24, 2001; 34 pages.
USPTO U.S. Appl. No. 10/001,477: "Breakpoint Control in an In-Circuit Emulation System," Roe et al., filed on Nov. 1, 2001; 43 pages.
USPTO U.S. Appl. No. 10/001,478: "In-Circuit Emulator and POD Synchronized Boot," Nemecek et al., filed on Nov. 1, 2001; 44 pages.
USPTO U.S. Appl. No. 10/001,568: "Combined In-Circuit Emulator and Programmer," Nemecek et al., filed on Nov. 1, 2001; 47 pages.
USPTO U.S. Appl. No. 10/007,717: "Conditional Branching in an In-Circuit Emulation System," Craig Nemecek, filed on Nov. 1, 2001; 43 pages.
USPTO U.S. Appl. No. 10/004,039: "In-Circuit Emulator with Gatekeeper for Watchdog Timer," Nemecek et al., filed on Nov. 14, 2001; 46 pages.
USPTO U.S. Appl. No. 10/004,197: "In-Circuit Emulator with Gatekeeper Based Halt Control," Nemecek et al., filed on Nov. 14, 2001; 47 pages.
USPTO U.S. Appl. No. 10/011,214: "Method and Circuit for Synchronizing a Write Operation between an On-Chip Microprocessor and an On-Chip Programmable Analog Device Operating at Different Frequencies," Sullam et al., filed on Oct. 25, 2001; 49 pages.
USPTO U.S. Appl. No. 10/033,027: "Microcontrollable Programmable System on a Chip," Warren Snyder; filed on Oct. 22, 2001; 117 pages.
USPTO U.S. Appl. No. 10/083,442: "Method Architecture for a Low Gain PLL with Wide Frequency Range." Meyers et al., filed on Feb. 26, 2002; 28 pages.
USPTO U.S. Appl. No. 10/109,979: "Graphical user interface with logic unifying functions," Anderson et al., filed on Mar. 29, 2002; 100 pages.

USPTO U.S. Appl. No. 10/113,064: "Method and System for Debugging through Supervisory Operating Codes and Self Modifying Codes," Roe et al., filed on Mar. 29, 2002; 36 pages.
USPTO U.S. Appl. No. 10/113,065: "System and Method for Automatically Matching Components in a Debugging System," Nemecek et al., filed on Mar. 29, 2002; 32 pages.
USPTO U.S. Appl. No. 10/226,911: "Calibration of Integrated Circuit Time Constants," Gehring et al.; filed on Aug. 22, 2002; 32 pages.
USPTO U.S. Appl. No. 10/272,231: "Digital Configurable Macro Architecture," Warren Snyder, filed on Oct. 15, 2002; 36 pages.
USPTO U.S. Appl. No. 10/288,003L "Low Voltage Differential Signal Driver Circuit and Method," Roper et al., filed on Nov. 4, 2002; 30 pages.
USPTO U.S. Appl. No. 10/293,392: "Low Voltage Receiver Circuit and Method for Shifting the Differential Input Signals of the Receiver Depending on a Common Mode Voltage of the Input Signals," Maher et al., filed on Nov. 13, 2002; 23 pages.
USPTO U.S. Appl. No. 10/305,589: "Current Controlled Delay Circuit," Jonathon Stiff, filed on Nov. 26, 2002; 24 pages.
USPTO U.S. Appl. No. 10/324,455: "Programmable Oscillator Scheme," Mar et al., filed on Dec. 20, 2002; 23 pages.
USPTO U.S. Appl. No. 10/327,217: "Single Ended Clock Signal Generator Having a Differential Output," Richmond et al., filed on Dec. 20, 2002; 27 pages.
USPTO U.S. Appl. No. 10/803,030: "Programmable Microcontrollable Architecture (Mixed Analog/Digital)," Snyder et al., filed on Mar. 16, 2004; 40 pages.
USPTO U.S. Appl. No. 10/871,582: "LVDS Input Circuit with Extended Common Mode Range," Reinschmidt et al., filed on Jun. 17, 2004; 25 pages.
USPTO U.S. Appl. No. 11/125,554: "A Method for a Efficient Supply to a Microcontroller," Kutz et al., filed on May 9, 2005; 41 pages.
USPTO U.S. Appl. No. 11/132,894: "Open Loop Bandwidth Test Architecture and Method for Phase Locked Loop (PLL)," Jonathon Stiff, filed on May 19, 2005; 38 pages.
USPTO U.S. Appl. No. 11/201,922: "Design model for a hardware device-independent method of defining embedded firmware for programmable systems," McDonald et al., filed on Aug. 10, 2005; 31 pages.
USPTO U.S. Appl. No. 11/273,708: "Capacitance Sensor Using Relaxation Oscillators," Snyder et al., filed on Nov. 14, 2005; 33 pages.
USPTO U.S. Appl. No. 11/322,044: "Split charge pump PLL architecture," Jonathon Stiff, filed on Dec. 28, 2005; 19 pages.
USPTO U.S. Appl. No. 11/337,272: "Successive Approximate Capacitance Measurement Circuit," Warren Snyder; filed on Jan. 20, 2006; 29 pages.
USPTO U.S. Appl. No. 11/415,588: "Voltage Controlled Oscillator Delay Cell and Method," Sivadasan et al., filed on May 1, 2006; 24 pages.
USPTO U.S. Appl. No. 11/644,100: "Differentiate-to-single ended signal converter circuit and method," Jonathon Stiff, filed on Dec. 21, 2006; 33 pages.
USPTO U.S. Appl. No. 11/698,660: "Configurable Bus," Kutz et al., filed on Jan. 25, 2007; 35 pages.
USPTO U.S. Appl. No. 11/709,866: "Input/Output Multiplexer Bus," Dennis Sequine, filed on Feb. 21, 2007; 33 pages.
USPTO U.S. Appl. No. 11/850,260: "Circuit and Method for Improving the Accuracy of a Crystal-less Oscillator Having Dual-Frequency Modes," Wright et al., filed on Sep. 5, 2007; 33 pages.
USPTO U.S. Appl. No. 11/983,291: "Successive Approximate Capacitance Measurement Circuit," Warren Snyder, filed on Nov. 7, 2007; 26 pages.
USPTO U.S. Appl. No. 12/132,527: "System and Method for Performing Next Placements and Pruning of Deallowed Placements for Programming an Integrated Circuit," Ogami et al., filed on Jun. 31, 2008, 44 pages.
USPTO U.S. Appl. No. 12/218,404: "Voltage Controlled Oscillator Delay Cell and Method," Sivadasan et al., filed on Jul. 14, 2008; 23 pages.
USPTO Ex Parte Qualyle Action for U.S. Appl. No. 09/992,076 dated Jun. 18, 2007; 6 pages.
USPTO Ex Parte Quayle Action for U.S. Appl. No. 09/975,115 dated Aug. 20, 2009; 7 pages.
USPTO Final Rejection for U.S. Appl. No. 09/975,105 dated Jul. 13, 2006; 7 pages.
USPTO Final Rejection for U.S. Appl. No. 09/975,115 dated Feb. 21, 2007; 25 pages.
USPTO Final Rejection for U.S. Appl. No. 09/975,115 dated May 12, 2008; 33 pages.
USPTO Final Rejection for U.S. Appl. No. 09/975,115 dated Jun. 23, 2006; 20 pages.
USPTO Final Rejection for U.S. Appl. No. 09/989,765 dated Mar. 31, 2009; 18 pages.
USPTO Final Rejection for U.S. Appl. No. 09/989,765 dated Apr. 3, 2007; 12 pages.
USPTO Final Rejection for U.S. Appl. No. 09/989,765 dated Apr. 4, 2008; 16 pages.
USPTO Final Rejection for U.S. Appl. No. 09/989,765 dated Apr. 17, 2006; 12 pages.
USPTO Final Rejection for U.S. Appl. No. 09/989,767 dated Jan. 11, 2007; 12 pages.
USPTO Final Rejection for U.S. Appl. No. 09/989,767 dated Jan. 15, 2009; 21 pages.
USPTO Final Rejection for U.S. Appl. No. 09/989,767 dated Apr. 6, 2005; 13 pages.
USPTO Final Rejection for U.S. Appl. No. 09/989,767 dated Dec. 27, 2007 21 pages.
USPTO Final Rejection for U.S. Appl. No. 09/989,771 dated Feb. 27, 2007; 8 pages.
USPTO Final Rejection for U.S. Appl. No. 09/969,771 dated Mar. 28, 2006; 9 pages.
USPTO Final Rejection for U.S. Appl. No. 09/989,771 dated Apr. 6, 2005; 7 pages.
USPTO Final Rejection for U.S. Appl. No. 09/989,771 dated Dec. 10, 2008; 12 pages.
USPTO Final Rejection for U.S. Appl. No. 09/989,771 dated Dec. 27, 2007; 15 pages.
USPTO Final Rejection for U.S. Appl. No. 09/989,777 dated Jan. 30, 2008; 14 pages.
USPTO Final Rejection for U.S. Appl. No. 09/89,777 dated Mar. 13, 2007; 24 pages.
USPTO Final Rejection for U.S. Appl. No. 09/989,777 dated Dec. 21, 2005; 29 pages.
USPTO Final Rejection for U.S. Appl. No. 09/989,778 dated Mar. 16, 2009; 26 pages.
USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.
USPTO Final Rejection for U.S. Appl. No. 09/989,778 dated Feb. 15, 2006; 9 pages.
USPTO Final Rejection for U.S. Appl. No. 09/969,778 dated Dec. 20, 2007; 14 pages.
USPTO Final Rejection for U.S. Appl. No. 09/989,782 dated Jul. 9, 2008; 10 pages.
USPTO Final Rejection for U.S. Appl. No. 09/989,782 dated JUl. 24, 2007; 9 pages.
USPTO Final Rejection for U.S. Appl. No. 09/989,782 dated Sep. 21, 2006; 10 pages.
USPTO Final Rejection for U.S. Appl. No. 09/989,782 dated Nov. 3, 2005; 11 pages.
USPTO Final Rejection for U.S. Appl. No. 09/992,076 dated Jan. 30, 2007; 32 pages.
USPTO Final Rejection for U.S. Appl. No. 09/992,076 dated Mar. 17, 2006; 16 pages.
USPTO Final Rejection for U.S. Appl. No. 09/994,600 dated Feb. 13, 2006; 13 pages.
USPTO Final Rejection for U.S. Appl. No. 09/994,600 dated May 4, 2005; 16 pages.
USPTO Final Rejection for U.S. Appl. No. 09/994,600 dated Oct. 17, 2007; 13 pages.
USPTO Final Rejection for U.S. Appl. No. 09/994,600 dated Dec. 8, 2006; 14 pages.

USPTO Final Rejection for U.S. Appl. No. 09/994,601 dated Apr. 17, 2008; 24 pages.
USPTO Final Rejection for U.S. Appl. No. 09/994,601 dated May 18, 2007; 17 pages.
USPTO Final Rejection for U.S. Appl. No. 09/994,601 dated Mar. 8, 2006; 11 pages.
USPTO Final Rejection for U.S. Appl. No. 09/994,601 dated Mar. 24, 2005; 10 pages.
USPTO Final Rejection for U.S. Appl. No. 09/998,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Final Rejection for U.S. Appl. No. 09/998,859 dated Nov. 19, 2003; 5 pages.
USPTO Final Rejection for U.S. Appl. No. 10/001,477 dated Jun. 30, 2008; 15 pages.
USPTO Final Rejection for U.S. Appl. No. 10/001,477 dated Jul. 23, 2007; 16 pages.
USPTO Final Rejection for U.S. Appl. No. 10/001,477 dated Aug. 24, 2006; 13 pages.
USPTO Final Rejection for U.S. Appl. No. 10/001,477 dated Oct. 24, 2005; 13 pages.
USPTO Final Rejection for U.S. Appl. No. 10/002,217 dated Feb. 6, 2008; 10 pages.
USPTO Final Rejection for U.S. Appl. No. 10/002,217 dated Mar. 7, 2007; 12 pages.
USPTO Final Rejection for U.S. Appl. No. 10/002,217 dated Nov. 17, 2005; 17 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. No. 10/008,096 dated Sep. 4, 2007; 19 pages.
USPTO Final Rejection for U.S. Appl. No. 10/008,096 dated Oct. 13, 2006; 17 pages.
USPTO Final Rejection for U.S. Appl. No. 10/008,096 dated Nov. 25, 2005; 17 pages.
USPTO Final Rejection for U.S. Appl. No. 10/033,027 dated Jun. 8, 2007; 8 pages.
USPTO Final Rejection for U.S. Appl. No. 10/033,027 dated Aug. 9, 2006; 6 pages.
USPTO Final Rejection for U.S. Appl. No. 10/033,027 dated Oct. 31, 2005; 24 pages.
USPTO Final Rejection for U.S. Appl. No. 10/113,065 dated Oct. 26, 2005; 17 pages.
USPTO Final Rejection for U.S. Appl. No. 10/238,966 dated Sep. 27, 2007; 9 pages.
USPTO Final Rejection for U.S. Appl. No. 11/968,145 dated Aug. 2, 2010; 6 pages.
USPTO Final Rejection for U.S. Appl. No. 09/404,891 dated Dec. 8, 2004; 7 pages.
USPTO Final Rejection for U.S. Appl. No. 09/475,879 dated Oct. 11, 2001; 10 pages.
USPTO Final Rejection for U.S. Appl. No. 09/875,599 dated Feb. 15, 2006; 18 pages.
USPTO Final Rejection for U.S. Appl. No. 09/875,599 dated Mar. 29, 2005; 20 pages.
USPTO Final Rejection for U.S. Appl. No. 09/875,599 dated Apr. 26, 2004; 15 pages.
USPTO Final Rejection for U.S. Appl. No. 09/875,599 dated Aug. 25, 2004; 17 pages.
USPTO Final Rejection for U.S. Appl. No. 09/875,599 dated Nov. 21, 2005; 16 pages.
USPTO Final Rejection for U.S. Appl. No. 09/893,050 dated Aug. 30, 2004; 13 pages.
USPTO Final Rejection for U.S. Appl. No. 09/912,768 dated Nov. 7, 2004; 13 pages.
USPTO Final Rejection for U.S. Appl. No. 09/930,021 dated Aug. 31, 2004; 8 pages.
USPTO Final Rejection for U.S. Appl. No. 09/943,062 dated Jan. 18, 2008; 8 pages.
USPTO Final Rejection for U.S. Appl. No. 09/943,062 dated Apr. 30, 2004; 9 pages.
USPTO Final Rejection for U.S. Appl. No. 09/943,062 dated Jun. 27, 2003; 8 pages.
USPTO Final Rejection for U.S. Appl. No. 09/943,149 dated May 7, 2003; 10 pages.
USPTO Final Rejection for U.S. Appl. No. 09/957,084 dated Jan. 29, 2004; 8 pages.
USPTO Final Rejection for U.S. Appl. No. 09/957,084 dated Apr. 23, 2003; 8 pages.
USPTO Final Rejection for U.S. Appl. No. 09/969,311 dated Apr. 7, 2003; 7 pages.
USPTO Final Rejection for U.S. Appl. No. 09/972,133 dated Mar. 30, 2006; 8 pages.
USPTO Final Rejection for U.S. Appl. No. 09/972,133 dated Jun. 29, 2005; 10 pages.
USPTO Final Rejection for U.S. Appl. No. 09/975,104 dated Feb. 15, 2006; 7 pages.
USPTO Final Rejection for U.S. Appl. No. 09/975,338 dated Jan. 18, 2006; 12 pages.
USPTO Final Rejection for U.S. Appl. No. 09/975,338 dated Jan. 31, 2006; 21 pages.
USPTO Final Rejection for U.S. Appl. No. 09/975,338 dated Feb. 27, 2007; 23 pages.
USPTO Final Rejection for U.S. Appl. No. 09/989,570 dated May 30, 2003; 9 pages.
USPTO Final Rejection for U.S. Appl. No. 09/989,571 dated Jan. 26, 2005; 11 pages.
USPTO Final Rejection for U.S. Appl. No. 09/989,761 dated Aug. 26, 2004; 7 pages.
USPTO Final Rejection for U.S. Appl. No. 09/989,761 dated Oct. 3, 2003; 7 pages.
USPTO Final Rejection for U.S. Appl. No. 09/989,762 dated Jan. 26, 2007; 13 pages.
USPTO Final Rejection for U.S. Appl. No. 09/989,762 dated Mar. 14, 2006; 19 pages.
USPTO Final Rejection for U.S. Appl. No. 09/989,767 dated Jan. 18, 2011; 24 pages.
USPTO Final Rejection for U.S. Appl. No. 09/989,767 dated Dec. 7, 2009; 22 pages.
USPTO Final Rejection for U.S. Appl. No. 09/989,771 dated Jan. 4, 2011; 12 pages.
USPTO Final Rejection for U.S. Appl. No. 09/989,771 dated Nov. 25, 2009; 12 pages.
USPTO Final Rejection for U.S. Appl. No. 09/989,782 dated May 15, 2009; 10 pages.
USPTO Final Rejection for U.S. Appl. No. 09/994,601 dated Jan. 5, 2010; 13 pages.
USPTO Final Rejection for U.S. Appl. No. 09/998,848 dated Dec. 10, 2009; 16 pages.
USPTO Final Rejection for U.S. Appl. No. 10/001,478 dated Apr. 20, 2009; 16 pages.
USPTO Final Rejection for U.S. Appl. No. 10/001,478 dated Jun. 4, 2008; 18 pages.
USPTO Final Rejection for U.S. Appl. No. 10/001,478 dated Sep. 5, 2006; 19 pages.
USPTO Final Rejection for U.S. Appl. No. 10/001,478 dated Sep. 17, 2007; 15 pages.
USPTO Final Rejection for U.S. Appl. No. 10/001,568 dated Oct. 26, 2005; 16 pages.
USPTO Final Rejection for U.S. Appl. No. 10/002,726 dated Mar. 27, 2006; 8 pages.
USPTO Final Rejection for U.S. Appl. No. 10/002,726 dated Nov. 30, 2005; 10 pages.
USPTO Final Rejection for U.S. Appl. No. 10/004,039 dated Nov. 22, 2005; 19 pages.
USPTO Final Rejection for U.S. Appl. No. 10/004,197 dated Nov. 23, 2005; 17 pages.

USPTO Final Rejection for U.S. Appl. No. 10/011,214 dated Jan. 21, 2005; 8 pages.
USPTO Final Rejection for U.S. Appl. No. 10/113,064 dated Oct. 18, 2005; 22 pages.
USPTO Final Rejection for U.S. Appl. No. 10/113,581 dated May 11, 2009; 21 pages.
USPTO Final Rejection for U.S. Appl. No. 10/113,581 dated Jun. 11, 2008; 14 pages.
USPTO Final Rejection for U.S. Appl. No. 10/113,581 dated Jul. 13, 2007; 15 pages.
USPTO Final Rejection for U.S. Appl. No. 10/113,581 dated Aug. 10, 2006; 13 pages.
USPTO Final Rejection for U.S. Appl. No. 10/118,682 dated May 3, 2004; 8 pages.
USPTO Final Rejection for U.S. Appl. No. 10/118,682 dated Oct. 12, 2005; 11 pages.
USPTO Final Rejection for U.S. Appl. No. 10/137,497 dated Mar. 13, 2006; 15 pages.
USPTO Final Rejection for U.S. Appl. No. 10/137,497 dated May 5, 2005; 13 pages.
USPTO Final Rejection for U.S. Appl. No. 10/256,829 dated Jan. 27, 2006; 24 pages.
USPTO Final Rejection for U.S. Appl. No. 10/256,829 dated Jun. 1, 2007; 16 pages.
USPTO Final Rejection for U.S. Appl. No. 10/256,829 dated Jun. 23, 2009; 8 pages.
USPTO Final Rejection for U.S. Appl. No. 10/272,231 dated Nov. 5, 2003; 5 pages.
USPTO Final Rejection for U.S. Appl. No. 10/288,003 dated Oct. 6, 2004; 6 pages.
USPTO Final Rejection for U.S. Appl. No. 10/305,589 dated Oct. 21, 2004; 7 pages.
USPTO Final Rejection for U.S. Appl. No. 10/327,207 dated Mar. 2, 2006; 13 pages.
USPTO Final Rejection for U.S. Appl. No. 10/329,162 dated Aug. 25, 2006; 12 pages.
USPTO Final Rejection for U.S. Appl. No. 10/329,162 dated Sep. 21, 2005; 12 pages.
USPTO Final Rejection for U.S. Appl. No. 10/329,162 dated Dec. 15, 2004; 10 pages.
USPTO Final Rejection for U.S. Appl. No. 10/871,582 dated Feb. 1, 2006; 5 pages.
USPTO Final Rejection for U.S. Appl. No. 11/166,622 dated Mar. 10, 2009; 11 pages.
USPTO Final Rejection for U.S. Appl. No. 11/166,622 dated Mar. 18, 2010; 12 pages.
USPTO Final Rejection for U.S. Appl. No. 11/166,622 dated Dec. 7, 2010; 12 pages.
USPTO Final Rejection for U.S. Appl. No. 11/200,619 dated Jan. 4, 2010; 18 pages.
USPTO Final Rejection for U.S. Appl. No. 11/200,619 dated Mar. 3, 2009; 14 pages.
USPTO Final Rejection for U.S. Appl. No. 11/201,627 dated Apr. 29, 2008; 21 pages.
USPTO Final Rejection for U.S. Appl. No. 11/201,627 dated May 24, 2010; 26 pages.
USPTO Final Rejection for U.S. Appl. No. 11/201,627 dated Jul. 7, 2009; 19 pages.
USPTO Final Rejection for U.S. Appl. No. 11/201,922 dated Apr. 30, 2008; 10 pages.
USPTO Final Rejection for U.S. Appl. No. 11/273,708 dated Jul. 5, 2007; 8 pages.
USPTO Final Rejection for U.S. Appl. No. 11/322,044 dated Sep. 21, 2007; 14 pages.
USPTO Final Rejection for U.S. Appl. No. 11/322,044 dated Oct. 19, 2009; 10 pages.
USPTO Final Rejection for U.S. Appl. No. 11/337,272 dated Feb. 21, 2007; 11 pages.
USPTO Final Rejection for U.S. Appl. No. 11/415,588 dated Oct. 19, 2007; 8 pages.
USPTO Final Rejection for U.S. Appl. No. 11/644,100 dated May 19, 2010; 13 pages.
USPTO Final Rejection for U.S. Appl. No. 11/644,100 dated Aug. 19, 2009; 12 pages.
USPTO Final Rejection for U.S. Appl. No. 11/644,100 dated Nov. 18, 2008; 12 pages.
USPTO Final Rejection for U.S. Appl. No. 11/698,660 dated Feb. 16, 2010; 14 pages.
USPTO Final Rejection for U.S. Appl. No. 11/698,660 dated May 28, 2009; 12 pages.
USPTO Final Rejection for U.S. Appl. No. 11/698,660 dated Sep. 3, 2010; 19 pages.
USPTO Final Rejection for U.S. Appl. No. 11/799,439 dated Dec. 18, 2008; 6 pages.
USPTO Final Rejection for U.S. Appl. No. 11/850,260 dated Aug. 21, 2009; 9 pages.
USPTO Final Rejection for U.S. Appl. No. 11/857,947 dated Jan. 4, 2011; 14 pages.
USPTO Final Rejection for U.S. Appl. No. 11/857,947 dated Oct. 14, 2009; 22 pages.
USPTO Final Rejection for U.S. Appl. No. 11/865,672 dated Dec. 30, 2009; 6 pages.
USPTO Final Rejection for U.S. Appl. No. 11/963,661 dated May 6, 2011; 7 pages.
USPTO Final Rejection for U.S. Appl. No. 11/963,661 dated Jun. 22, 2010; 11 pages.
USPTO Final Rejection for U.S. Appl. No. 11/963,661 dated Sep. 4, 2012; 26 pages.
USPTO Final, Rejection for U.S. Appl. No. 11/968,145 dated Jul. 29, 2011; 5 pages.
USPTO Final Rejection for U.S. Appl. No. 11/983,291 dated Aug. 21, 2009; 10 pages.
USPTO Final Rejection for U.S. Appl. No. 12/060,176 dated Jan. 24, 2012; 25 pages.
USPTO Final Rejection for U.S. Appl. No. 12/060,176 dated Jan. 21, 2012; 26 pages.
USPTO Final Rejection for U.S. Appl. No. 12/060,176 dated Oct. 12, 2010; 22 pages.
USPTO Final Rejection for U.S. Appl. No. 12/060,176 dated Nov. 8, 2011; 24 pages.
USPTO Final Rejection for U.S. Appl. No. 12/104,676 dated Dec. 3, 2010; 9 pages.
USPTO Final Rejection for U.S. Appl. No. 12/132,527 dated Oct. 14, 2010; 8 pages.
USPTO Final Rejection for U.S. Appl. No. 13/099,334 dated Oct. 17, 2012; 5 pages.
USPTO Final Rejection for U.S. Appl. No. 09/989,767 dated Mar. 6, 2006; 15 pages.
USPTO Miscellaneous Action for U.S. Appl. No. 09/943,062 dated Jan. 30, 2006; 2 pages.
USPTO Miscellaneous ActiOn for U.S. Appl. No. 09/989,819 dated Dec. 14, 2001; 1 page.
USPTO Miscellaneous Action for U.S. Appl. No. 10/001,478 dated Feb. 23, 2010; 5 pages.
USPTO Miscellaneous Action for U.S. Appl. No. 10/113,581 dated Jun. 23, 2010; 6 pages.
USPTO Miscellaneous Action for U.S. Appl. No. 10/327,207 dated May 13, 2003; 1 page.
USPTO Miscellaneous Action for U.S. Appl. No. 10/327,217 dated Feb. 10, 2004; 1 page.
USPTO Miscellaneous Action for U.S. Appl. No. 11/201,922 dated Oct. 1, 2009; 2 pages.
USPTO Miscellaneous Action with SSP for U.S. Appl. No. 09/930,021 dated Oct. 1, 2001; 1 page.
USPTO Non-Final Rejection for U.S. Appl. No. 10/001,477 dated May 11, 2005; 10 pages.
USPTO Non-Final Office Rejection for U.S. Appl. No. 10/002,217 dated Oct. 2, 2006; 21 pages.
USPTO Non-Final Office Rejection for U.S. Appl. No. 10/002,217 dated May 19, 2005; 15 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.

USPTO Non-Final Rejection for U.S. Appl. No. 09/975;115 dated Jan. 7, 2008; 30 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Feb. 11, 2005; 86 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Jul. 31, 2007; 28 pages.
USPTO Non-Final Rejection for U.S. Appl. No. 09/975,115 dated Oct. 9, 2008; 34 pages.
USPTO Non-Final Rejection for U.S. Appl. No. 09/975,115 dated Oct. 31, 2006; 19 pages.
USPTO Non-Final Rejection for U.S. Appl. No. 09/989,765 dated Sep. 19, 2007; 14 pages.
USPTO Non-Final Rejection for U.S. Appl. No. 09/989,765 dated Sep. 28, 2008; 17 pages.
USPTO Non-Final Rejection for U.S. Appl. No. 09/989,765 dated Oct. 2, 2006; 13 pages.
USPTO Non-Final Rejection for U.S. Appl. No. 09/989,765 dated Oct. 5, 2005; 9 pages.
USPTO Non-Final Rejection for U.S. Appl. No. 09/989,767 dated Jul. 2, 2007; 22 pages.
USPTO Non-Final Rejection for U.S. Appl. No. 09/989,767 dated Jul. 17, 2006; 12 pages.
USPTO Non-Final Rejectiol for U.S. Appl. No. 09/989,767 dated Jul. 24, 2006; 21 pages.
USPTO Non-Final Rejection for U.S. Appl. No. 09/989,771 dated May 28, 2008; 14 pages.
USPTO Non-Final Rejection for U.S. Appl. No. 09/989,771 dated Jul. 16, 2007; 14 pages.
USPTO Non-Final Rejection for U.S. Appl. No. 09/989,771 dated Aug. 23, 2006; 7 pages.
USPTO Non-Final Rejection for U.S. Appl. No. 09/989,771 dated Sep. 12, 2005; 7 pages.
USPTO Non-Final Rejection for U.S. Appl. No. 09/989,771 dated Sep. 22, 2004; 7 pages.
USPTO Non-Final Rejection for U.S. Appl. No. 09/989,777 dated Apr. 11, 2006; 21 pages.
USPTO Non-Final Rejection for U.S. Appl. No. 09/989,777 dated Jul. 5, 2005; 36 pages.
USPTO Non-Final Rejection for U.S. Appl. No. 09/989,777 dated Sep. 11, 2007; 18 pages.
USPTO Non-Final Rejection for U.S. Appl. No. 09/989,777 dated Sep. 13, 2006; 18 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2008; 24 pages.
USPTO Non-Final Rejection for U.S. Appl. No. 09/989,778 dated Jul. 19, 2007; 18 pages.
USPTO Non-Final Rejection for U.S. Appl. No. 09/989,778 dated Sep. 1, 2005; 10 pages.
USPTO Non-Final Rejection for U.S. Appl. No. 09/989,778 dated Sep. 18, 2006; 11 pages.
USPTO Non-Final Rejection for U.S. Appl. No. 09/989,782 dated Jan. 29, 2007; 9 pages.
USPTO Non-Final Rejection for U.S. Appl. No. 09/989,782 dated Mar. 28, 2008; 8 pages.
USPTO Non-Final Rejection for U.S. Appl. No. 09/989,782 dated Apr. 29, 2005; 11 pages.
USPTO Non-final Rejection for U.S. Appl. No. 09/989,782 dated Oct. 6, 2004; 11 pages.
USPTO Non-Final Rejection for U.S. Appl. No. 09/989,782 dated Nov. 26, 2008; 10 pages.
USPTO Non-Final Rejection for U.S. Appl. No. 09/989,782 dated Dec. 14, 2007; 8 pages.
USPTO Non-Final Rejection for U.S. Appl. No. 09/992,076 dated Jun. 1, 2005; 20 pages.
USPTO Non-Final Rejection for U.S. Appl. No. 09/992,076 dated Aug. 10, 2006; 19 pages.
USPTO Non-Final Rejection for U.S. Appl. No. 09/992,076 dated Nov. 21, 2005; 29 pages.
USPTO Non-Final Rejection for U.S. Appl. No. 09/994,600 dated May 15, 2007; 14 pages.
USPTO Non-Final Rejection for U.S. Appl. No. 09/994,600 dated Jul. 17, 2006; 14 pages.
USPTO Non-Final Rejection for U.S. Appl. No. 09/994,600 dated Aug. 23, 2005; 13 pages.
USPTO Non-Final Rejection for U.S. Appl. No. 09/994,600 dated Oct. 21, 2004; 37 pages.
USPTO Non-Final Rejection for U.S. Appl. No. 09/994,601 dated Oct. 4, 2007; 20 pages.
USPTO Non-Final Rejection for U.S. Appl. No. 09/994,601 dated Sep. 21, 2005; 12 pages.
USPTO Non-Final Rejection for U.S. Appl. No. 09/994,601 dated Nov. 14, 2006; 15 pages.
USPTO Non-Final Rejection for U.S. Appl. No. 09/994,601 dated Jul. 29, 2004; 10 pages.
USPTO Non-Final Rejection for U.S. Appl. No. 09/998,834 dated Sep. 20, 2004; 11 pages.
USPTO Nen-Final Rejection for U.S. Appl. No. 09/998,848 dated Jan. 26, 2008; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.
USPTO Non-Final Rejection for U.S. Appl. No. 09/998,859 dated May 15, 2003; 6 pages.
USPTO Non-Final Rejection for U.S. Appl. No. 09/998,859 dated May 28, 2003; 6 pages.
USPTO Non-Final Rejection for U.S. Appl. No. 09/998;859 dated Nov. 4, 2004; 6 pages.
USPTO Non-final Rejection for U.S. Appl. No. 10/001,477 dated Jan. 22, 2007; 15 pages.
USPTO Non-Final Rejection for U.S. Appl. No. 10/001,477 dated Mar. 2, 2006; 14 pages.
USPTO Non-Final Rejection for U.S. Appl. No. 10/001,477 dated Dec. 6, 2007; 13 pages.
USPTO Non-Final Rejection for U.S. Appl. No. 10/002,217 dated Apr. 3, 2006; 12 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Nan-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Apr. 26, 2006; 26 pages.
USPTO Non-Final Rejection for U.S. Appl. No. 10/033,027 dated Oct. 18, 2004; 17 pages.
USPTO Non-Final Rejection for U.S. Appl. No. 10/033,027 dated Dec. 18, 2008; 5 pages.
USPTO Non-Final Rejection for U.S. Appl. No. 10/033,027 dated Dec. 21, 2006; 31 pages.
USPTO Non-Final Rejection for U.S. Appl. No. 10/113,065 dated May 20, 2005; 14 pages.
USPTO Non-Final Rejection for U.S. Appl. No. 10/238,966 dated Apr. 6, 2006; 8 pages.
USPTO Non-Final Rejection for U.S. Appl. No. 10/238,966 dated Apr. 19, 2007; 7 pages.
USPTO Non-Final Rejection for U.S. Appl. No. 10/238,966 dated Jun. 30, 2008; 12 pages.
USPTO Non-Final Rejection for U.S. Appl. No. 10/238,966 dated Oct. 20, 2006; 8 pages.

USPTO Non-Final Rejection for U.S. Appl. No. 10/238,966 dated Dec. 26, 2007; 12 pages.
USPTO Non-Final Rejection for U.S. Appl. No. 09/404,891 dated Jan. 5, 2004; 5 pages.
USPTO Non-Final Rejection for U.S. Appl. No. 09/404,091 dated Mar. 5, 2003; 6 pages.
USPTO Non-Final Rejection for U.S. Appl. No. 09/404,891 dated Jun. 25, 2004; 6 pages.
USPTO Nan-Final Rejection for U.S. Appl. No. 09/404,891 dated Jul. 10, 2003; 6 pages.
USPTO Non-Final Rejection for U.S. Appl. No. 09/404,891 dated Oct. 11, 2002, 5 pages.
USPTO Non-Final Rejection for U.S. Appl. No. 09/475,808 dated Jun. 6, 2001; 6 pages.
USPTO Non-Final Rejection for U.S. Appl. No. 09/475,879 dated Mar. 8, 2001; 6 pages.
USPTO Non-Final Rejection for U.S. Appl. No. 09/826,397 dated Apr. 21, 2004; 6 pages.
USPTO Non-final Rejection for U.S. Appl. No. 09/855,868 dated Aug. 26, 2004; 7 pages.
USPTO Non-Final Rejection for U.S. Appl. No. 09/875,599 dated May 31, 2006; 18 pages.
USPTO Non-Final Rejection for U.S. Appl. No. 09/875,599 dated Oct. 27, 2003; 13 pages.
USPTO Non-Final Rejection for U.S. Appl. No. 09/875,599 dated Dec. 3, 2004; 16 pages.
USPTO Non-Final Rejection for U.S. Appl. No. 09/887,923 dated May 25, 2004; 7 pages.
USPTO Non-Final Rejection for U.S. Appl. No. 09/887,955 dated May 26, 2004; 5 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Non-Final Rejection for U.S. Appl. No. 09/893,050 dated Jan. 5, 2005; 13 pages.
USPTO Non-Final Rejection for U.S. Appl. No. 09/893,050 dated Jan. 15, 2004; 9 pages.
USPTO Non-Final Rejection for U.S. Appl. No. 09/909,047 dated Jul. 6, 2004; 9 pages.
USPTO Non-Final Rejection for U.S. Appl. No. 09/912,788 dated Apr. 11, 2005; 14 pages.
USPTO Non-Final Rejection for U.S. Appl. No. 09/912,788 dated Jun. 22, 2004; 11 pages.
USPTO Non-Final Rejection for U.S. Appl. No. 09/922,579 dated Aug. 18, 2004; 6 pages.
USPTO Non-Final Rejection for U.S. Appl. No. 09/923,461 dated Jul. 16, 2004; 6 pages.
USPTO Non-Final Rejection for U.S. Appl. No. 09/929,891 dated Sep. 13, 2004; 6 pages.
USPTO Non-Final Rejection for U.S. Appl. No. 09/930,021 dated Apr. 26, 2004; 6 pages.
USPTO Non-Final Rejection for U.S. Appl. No. 09/943,062 dated Jan. 27, 2003; 7 pages.
USPTO Non-Final Rejection for U.S. Appl. No. 09/943,082 dated Jun. 22, 2007; 12 pages.
USPTO Non-Final Rejection for U.S. Appl. No. 09/943,062 dated Sep. 11, 2002; 9 pages.
USPTO Non-Final Rejection for U.S. Appl. No. 09/943,062 dated Dec. 8, 2003; 9 pages.
USPTO Non-Final Rejection for U.S. Appl. No. 09/943,149 dated Aug. 28, 2003; 9 pages.
USPTO Non-Final Rejection for U.S. Appl. No. 09/943,149 dated Nov. 20, 2002; 7 pages.
USPTO Non-Final Rejection for U.S. Appl. No. 09/953,423 dated Feb. 6, 2004; 5 pages.
USPTO Non-Final Rejection for U.S. Appl. No. 09/957,084 dated Aug. 23, 2002; 6 pages.
USPTO Non-Final Rejection for U.S. Appl. No. 09/957,084 dated Aug. 27, 2003; 8 pages.
USPTO Non-Final Rejection for U.S. Appl. No. 09/969,311 dated Sep. 21, 2004; 4 pages.
USPTO Non-Final Rejection for U.S. Appl. No. 09/969,311 dated Nov. 6, 2002; 8 pages.
USPTO Non-Final Rejection for U.S. Appl. No. 09/969,313 dated May 6, 2005; 9 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Non-Final Rejection for U.S. Appl. No. 09/972,133 dated Mar. 8, 2005; 9 pages.
USPTO Non-Final Rejection for U.S. Appl. No. 09/972,133 dated Nov. 25, 2005; 9 pages.
USPTO Non-Final Rejection for U.S. Appl. No. 09/972,319 dated Sep. 16, 2004; 9 pages.
USPTO Non-Final Rejection for U.S. Appl. No. 09/975,030 dated Mar. 29, 2005; 13 pages.
USPTO Non-Final Rejection for U.S. Appl. No. 09/975,030 dated Oct. 20, 2005; 7 pages.
USPTO Non-Final Rejection for U.S. Appl. No. 09/975,104 dated Mar. 21, 2005; 7 pages.
USPTO Non-Final Rejection for U.S. Appl. No. 09/975,104 dated Jun. 16, 2006; 8 pages.
USPTO Non-Final Rejection for U.S. Appl. No. 09/975,104 dated Aug. 16, 2005; 6 pages.
USPTO Non-Final Rejection for U.S. Appl. No. 09/975,338 dated Apr. 30, 2010; 2 pages.
USPTO Non-Final Rejection for U.S. Appl. No. 09/975.338 dated Aug. 14, 2007; 19 pages.
USPTO Non-Final Rejection for U.S. Appl. No. 09/975,338 dated Sep. 6, 2006; 11 pages.
USPTO Non-Final Rejection for U.S. Appl. No. 09/989,570 dated Jan. 2, 2003; 7 pages.
USPTO Non-Final Rejection for U.S. Appl. No. 09/989,570 dated Jan. 26, 2005; 9 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Non-Final Rejection for U.S. Appl. No. 09/989,571 dated May 23, 2005; 8 pages.
USPTO Non-Final Rejection for U.S. Appl. No. 09/989,571 dated Jul. 12, 2004; 9 pages.
USPTO Non-Final Rejection for U.S. Appl. No. 09/989,761 dated Mar. 10, 2004; 6 pages.
USPTO Non-Final Rejection for U.S. Appl. No. 09/989,761 dated Apr. 18, 2003; 5 pages.
USPTO Non-Final Rejection for U.S. Appl. No. 09/989,762 dated Jul. 23, 2007; 15 pages.
USPTO Non-Final Rejection for U.S. Appl. No. 09/989,762 dated Jul. 27, 2005; 15 pages.
USPTO Non-Final Rejection for U.S. Appl. No. 09/989,762 dated Aug. 10, 2006; 18 pages.
USPTO Non-Final Rejection for U.S. Appl. No. 09/989,767 dated May 12, 2009; 21 pages.
USPTO Non-Final Rejection for U.S. Appl. No. 09/989,767 dated Jul. 9, 2010; 22 pages.
USPTO Non-Final Rejection for U.S. Appl. No. 09/989,767 dated Oct. 6, 2004; 15 pages.
USPTO Non-Final Rejection for U.S. Appl. No. 09/989,771 dated Apr. 30, 2009; 11 pages.
USPTO Non-Final Rejection for U.S. Appl. No. 09/989,771 dated Jul. 20, 2010; 12 pages.
USPTO Non-Final Rejection for U.S. Appl. No. 09/989,782 date Oct. 27, 2009; 9 pages.
USPTO Non-Final Rejection for U.S. Appl. No. 09/989,808 dated Apr. 14, 2005; 8 pages.
USPTO Non-final Rejection for U.S. Appl. No. 09/989,808 dated Oct. 19, 2005; 8 pages.
USPTO Non-Final Rejection for U.S. Appl. No. 09/989,817 dated Jan. 12, 2005; 5 pages.

USPTO Non-Final Rejection for U.S. Appl. No. 09/989,817 dated Jun. 8, 2004; 7 pages.
USPTO Non-Final Rejection for U.S. Appl. No. 09/989,819 dated Jul. 13, 2004; 4 pages.
USPTO Non-Final Rejection for U.S. Appl. No. 09/994,601 dated Jul. 9, 2009; 11 pages.
USPTO Non-Final Rejection for U.S. Appl. No. 09/998,848 dated Jun. 21, 2010; 15 pages.
USPTO Nan-Final Rejection for U.S. Appl. No. 09/998,848 dated May 12, 2009; 16 pages.
USPTO Non-Final Rejection for U.S. Appl. No. 10/001,478 dated Jan. 30, 2008; 19 pages.
USPTO Non-Final Rejection for U.S. Appl. No. 10/001,478 dated Mar. 15, 2006; 19 pages.
USPTO Non-Final Rejection for U.S. Appl. No. 10/001,478 dated Apr. 2, 2007; 17 pages.
USPTO Non-Final Rejection for U.S. Appl. No. 10/001,478 dated May 16, 2005; 13 pages.
USPTO Non-Final Rejection for U.S. Appl. No. 10/001,478 dated Aug. 4, 2009; 17 pages.
USPTO Nori-Final Rejection for U.S. Appl. No. 10/001,478 dated Oct. 20, 2008; 18 pages.
USPTO Non-Final Rejertion for U.S. Appl. No. 10/001,568 dated May 19, 2005; 16 pages.
USPTO Non-Final Rejection for U.S. Appl. No. 10/002,217 dated Aug. 3, 2007; 10 pages.
USPTO Non-Final Rejection for U.S. Appl. No. 10/002,726 dated Jun. 10, 2005; 10 pages.
USPTO Nen-Final Rejection for U.S. Appl. No. 10/002,726 dated Aug. 28, 2006; 10 pages.
USPTO Nan-Final Rejection for U.S. Appl. No. 10/002,726 dated Dec. 13, 2004; 7 pages.
USPTO Non-Final Rejection for U.S. Appl. No. 10/004,039 dated Apr. 11, 2006; 14 pages.
USPTO Non-Final Rejection for U.S. Appl. No. 10/004,039 dated Jun. 6, 2005; 17 pages.
USPTO Non-Final Rejection for U.S. Appl. No. 10/004,197 dated Apr. 3, 2006; 13 pages.
USPTO Non-Final Rejection for U.S. Appl. No. 10/004,197 dated Jun. 6, 2005; 21 pages.
USPTO Non-Final Rejection for U.S. Appl. No. 10/011,214 dated Aug. 13, 2004; 10 pages.
USPTO Non-Final Rejection for U.S. Appl. No. 10/109,979 dated Jun. 30, 2005; 6 pages.
USPTO Non-Final Rejection for U.S. Appl. No. 10/113,064 dated Apr. 6, 2006; 19 pages.
USPTO Non-Final Rejection for U.S. Appl. No. 10/113,064 dated Apr. 25, 2005; 15 pages.
USPTO Non-Final Rejection for U.S. Appl. No. 10/113,581 dated Jan. 10, 2007; 14 pages.
USPTO Non-Final Rejection for U.S. Appl. No. 10/113,581 dated Feb. 24, 2006; 11 pages.
USPTO Non-Final Rejection for U.S. Appl. No. 10/113,581 dated Aug. 12, 2005; 12 pages.
USPTO Non-Final Rejection for U.S. Appl. No. 10/113,581 dated Sep. 1, 2009; 18 pages.
USPTO Non-Final Rejection for U.S. Appl. No. 10/113,581 dated Nov. 26, 2008; 20 pages.
USPTO Non-Final Rejection for U.S. Appl. No. 10/113,581 dated Nov. 27, 2007; 15 pages.
USPTO Non-Final Rejection for U.S. Appl. No. 10/118,682 dated Jan. 12, 2005; 11 pages.
USPTO Non-Final Rejection for U.S. Appl. No. 10/118,682 dated Feb. 25, 2004; 9 pages.
USPTO Non-Final Rejection for U.S. Appl. No. 10/118,682 dated Jun. 16, 2005; 12 pages.
USPTO Non-Final Rejection for U.S. Appl. No. 10/118,682 dated Sep. 24, 2004; 8 pages.
USPTO Non-Final Rejection for U.S. Appl. No. 10/118,682 dated Nov. 3, 2003; 8 pages.
USPTO Non-Final Rejection for U.S. Appl. No. 10/137,497 dated Aug. 2, 2006; 21 pages.
USPTO Non-Final Rejection for U.S. Appl. No. 10/137,497 dated Sep. 22, 2005; 21 pages.
USPTO Non-Final Rejection for U.S. Appl. No. 10/137,497 dated Nov. 5, 2004; 17 pages.
USPTO Non-Final Rejection for U.S. Appl. No. 10/226,911 dated Mar. 19, 2004; 6 pages.
USPTO Non-Final Rejection for U.S. Appl. No. 10/256,829 dated Jan. 7, 2009; 7 pages.
USPTO Non-Final Rejection for U.S. Appl. No. 10/256,829 dated May 3, 2006; 16 pages.
USPTO Non-Final Rejection for U.S. Appl. No. 10/256,829 dated Jun. 26, 2008; 11 pages.
USPTO Non-Final Rejection for U.S. Appl. No. 10/256,829 dated Jul. 26, 2005; 14 pages.
USPTO Non-Final Rejection for U.S. Appl. No. 10/256,829 dated Oct. 26, 2009; 8 pages.
USPTO Non-Final Rejection for U.S. Appl. No. 10/256,829 dated Nov. 2, 2006, 13 pages.
USPTO Non-Final Rejection for U.S. Appl. No. 10/272,231 dated Jul. 14, 2003; 6 pages.
USPTO Non-Final Rejection for U.S. Appl. No. 10/293,392 dated Oct. 16, 2003; 6 pages.
USPTO Non-Final Rejection for U.S. Appl. No. 10/305,589 dated Oct. 7, 2003; 6 pages.
USPTO Non-Final Rejection for U.S. Appl. No. 10/324,455 dated Aug. 21, 2003; 4 pages.
USPTO Non-Final Rejection for U.S. Appl. No. 10/324,455 dated Nov. 6, 2003; 4 pages.
USPTO Non-Final Rejection for U.S. Appl. No. 10/327,207 dated Jul. 21, 2006; 12 pages.
USPTO Non-Final Rejection for U.S. Appl. No. 10/327,207 dated Sep. 20, 2005; 11 pages.
USPTO Non-Final Rejection for U.S. Appl. No. 10/327,217 dated Apr. 30, 2004; 5 pages.
USPTO Non-Final Rejection for U.S. Appl. No. 10/329,162 dated Jan. 29, 2007; 10 pages.
USPTO Non-Final Rejection for U.S. Appl. No. 10/329,162 dated Mar. 10, 2006; 9 pages.
USPTO Non-Final Rejection for U.S. Appl. No. 10/329,162 dated Apr. 21, 2005; 10 pages.
USPTO Non-Final Rejection for U.S. Appl. No. 10/329,162 dated Aug. 2, 2004; 8 pages.
USPTO Non-Final Rejection for U.S. Appl. No. 10/653,050 dated Apr. 6, 2004; 7 pages.
USPTO Non-Final Rejection for U.S. Appl. No. 10/803,030 dated Jun. 8, 2005; 4 pages.
USPTO Non-Final Rejection for U.S. Appl. No. 10/871,582 dated Sep. 7, 2005; 7 pages.
USPTO Non-Final Rejection for U.S. Appl. No. 11/088,028 dated Jun. 16, 2006; 8 pages.
USPTO Non-Final Rejection for U.S. Appl. No. 11/125,554 dated Dec. 11, 2006; 9 pages.
USPTO Non-Final Rejection for U.S. Appl. No. 11/132,894 dated Dec. 19, 2006; 12 pages.
USPTO Non-Final Rejection for U.S. Appl. No. 11/166,622 dated Jun. 22, 2010; 11 pages.
USPTO Non-Final Rejection for U.S. Appl. No. 11/166,622 dated Sep. 29, 2009; 11 pages.
USPTO Non-Final Rejection for U.S. Appl. No. 11/200,619 dated Jan. 31, 2011; 14 pages.
USPTO Non-Final Rejection for U.S. Appl. No. 11/200,619 dated Jun. 17, 2009; 12 pages.
USPTO Non-Final Rejection for U.S. Appl. No. 11/200,619 dated Aug. 27, 2008; 13 pages.
USPTO Non-Final Rejection for U.S. Appl. No. 11/201,627 dated Sep. 30, 2010; 6 pages.
USPTO Non-Final Rejection for U.S. Appl. No. 11/201,627 dated Nov. 16, 2007; 16 pages.
USPTO Non-Final Rejection for U.S. Appl. No. 11/201,627 dated Dec. 12, 2008; 17 pages.
USPTO Non-Final Rejection for U.S. Appl. No. 11/201,627 dated Dec. 24, 2009; 22 pages.

USPTO Non-Final Rejection for U.S. Appl. No. 11/201,922 dated Jun. 11, 2010; 12 pages.
USPTO Non-Final Rejection for U.S. Appl. No. 11/201,922 dated Oct. 15, 2007; 10 pages.
USPTO Non-Final Rejection for U.S. Appl. No. 11/201,922 dated Oct. 21, 2008; 12 pages.
Robert A. Blauschild, "WP 3.5. An Integrated Time Reference," ISSCC94/Session 3, Analog Techniques/Paper WP 3.5, Feb. 1994, pp. 56-58; 4 pages.
Robinson, Gordon, D., "Why 1/49.1 (JTAG) Really Works", May 1994, Conference Proceedings Electro/94 International, May 10-12, 1994, Combined Volumes, pp. 749-754; 6 pages.
Sedra, Adel S. et al., "Microelectronic Circuits," 3rd Edition, Oxford University Press, pp. xiii-xx and 861-883, 1991; 20 pages.
Seguine, Ryan; "Layout Guideitnes for PSoC CapSense," Cypress Semiconductor Corporation, Application Note AN2292; Jul. 22, 2005; 13 pages.
Shahbahrami et al., "Matrix Register File and Extended Subwords: Two Techniques for Embedded Media Processors," ACM, May 2005; 9 pages.
SIPO 2 month Office Action for Application No. 200880012232.1 dated Apr. 23, 2012; 3 pages.
SIPO 4 month Office Action for Application No. 200880012232.1 dated May 6, 2011; 2 pages.
Snyder et al., "Xilinx's A-to-Z Systems Platform" Cahners Microprocessor, The Insider's Guide to Microprocessor Hardware, Feb. 6, 2001; 9 pages.
Song et al., "A 50% Power Reduction Scheme for CMOS Relaxation Osciilator," IEEE, 1999, pp, 154-157; 4 pages.
Specks et al., "A Mixed Digital-Analog 16B Microcontroller with 0.5MB Flash Memory, On-Chip Power Supply, Physical Newirk Interface, and 40V I/O for Automotive Single-Chip Mechatronics," IEEE, Feb. 9, 2000; 1 page.
Stallman at al., "Debugging with the GNU Source-Level Debugger"; Jan. 1994; retrieved on May 2, 2005 from http://www.cs.utah.edu; 4 pages.
Stan Augarten; "The Chip Collectio—Introduction—Smithsonian Institute"; "State of the Art"; "The First 256-Bit Static RAM"; retrieved on Nov. 14, 2005 from http://smithsonianchips.si.edu/augarten/p24.htm; 2 pages.
Stephen Walters, "Computer-Aided Prototyping for ASIC-Based Systems," 1991, IEEE Design & Test of Computers, vol. 8, Issue 2, pp. 4-10; 8 pages.
U.S. Appl. No. 60/243,708: "Advanced Programmable Microcontroller Device," Snyder et al., filed Oct. 26, 2000; 277 pages.
The Written Opinion of the International Search Report for International Application No. PCT/US10/33626 mailed Jun. 24, 2010; 5 pages.
Tan et al., "Fine Pitch and Wirebonding and Reliability of Aluminum Capped Copper Bond Pads," May 2000, IEEE Electronic Components and Technology Conference, pp. 1674-1680; 7 pages.
USPTO Advisory Action for U.S. Appl. No. 09/989,778 dated May 15, 2006; 4 pages.
USPTO Advisory Action for U.S. Appl. No. 09/998,848 dated Sep. 7, 2005; 3 pages.
USPTO Advisory Action for U.S. Appl. No. 10/001,477 dated Oct. 10, 2008; 3 pages.
USPTO Advisory Action for U.S. Appl. No. 09/475,879 dated Mar. 4, 2002; 3 pages.
USPTO Advisory Action for U.S. Appl. No. 09/475,879 dated Dec. 31, 2001; 3 pages.
USPTO Advisory Action for U.S. Appl. No. 09/875,599 dated Jun. 8, 2005; 3 pages.
USPTO Advisory Action for U.S. Appl. No. 09/943,062 dated Mar. 27, 2008; 3 pages.
USPTO Advisory Action for U.S. Appl. No. 09/943,062 dated Sep. 25, 2003; 3 pages.
USPTO Advisory Action for U.S. Appl. No. 09/969,311 dated Jul. 21, 2003; 2 pages.
USPTO Advisory Action for U.S. Appl. No. 09/975,338 dated Aug. 31, 2005; 3 pages.
USPTO Advisory Action for U.S. Appl. No. 09/975,338 dated May 15, 2006; 4 pages.
USPTO Advisory Action for U.S. Appl. No. 09/989,570 dated Aug. 14, 2003; 3 pages.
USPTO Advisory Action for U.S. Appl. No. 09/989,771 dated Feb. 3, 2010; 3 pages.
USPTO Advisory Action for U.S. Appl. No. 09/989,778 dated Jun. 17, 2009; 3 pages.
USPTO Advisory Action for U.S. Appl. No. 09/994,601 dated Mar. 23, 2010; 2 pages.
USPTO Advisory Action for U.S. Appl. No. 09/998,848 dated Feb. 24, 2010; 3 pages.
USPTO Advisory Action for U.S. Appl. No. 10/001,478 dated Jun. 30, 2009; 3 pages.
USPTO Advisory Action for U.S. Appl. No. 10/329,162 dated Mar. 29, 2005; 2 pages.
USPTO Advisory Action for U.S. Appl. No. 11/166,622 dated May 27, 2009; 3 pages.
USPTO Advisory Action for U.S. Appl. No. 11/200,619 dated May 11, 2009; 3 pages.
USPTO Advisory Action for U.S. Appl. No. 11/201,627 dated Aug. 5, 2010; 3 pages.
USPTO Advisory Action for U.S. Appl. No. 11/201,627 dated Sep. 21, 2009; 3 pages.
USPTO Advisory Action for U.S. Appl. No. 11/322,044 dated Nov. 30, 2007; 2 pages.
USPTO Advisory Action for U.S. Appl. No. 11/337,272 dated Apr. 3, 2007; 3 pages.
USPTO Advisory Action for U.S. Appl. No. 11/415,588 dated Jan. 14, 2008; 3 pages.
USPTO Advisory Action for U.S. Appl. No. 11/644,100 dated Feb. 9, 2009; 3 pages.
USPTO Advisory Action for U.S. Appl. No. 11/644,100 dated Jul. 21, 2010; 3 pages.
USPTO Advisory Action for U.S. Appl. No. 11/698,660 dated Jul. 31, 2009; 3 pages.
USPTO Advisory Action for U.S. Appl. No. 11/698,680 dated Nov. 10, 2010; 3 pages.
USPTO Advisory Action for U.S. Appl. No. 11/799,439 dated Mar. 20, 2009; 3 pages.
USPTO Advisory Action for U.S. Appl. No. 11/818,005 dated Jul. 30, 2010; 3 pages.
USPTO Advisory Action for U.S. Appl. No. 11/850,260 dated Nov. 2, 2009; 3 pages.
USPTO Advisory Action for U.S. Appl. No. 11/963,661 dated Jun. 30, 2011; 3 pages.
USPTO Advisory Action for U.S. Appl. No. 11/963,661 dated Aug. 27, 2010; 3 pages.
USPTO Non-Final Rejection for U.S. Appl. No. 11/201,922 dated Dec. 28, 2010; 14 pages.
USPTO Non-Final Rejection for U.S. Appl. No. 11/273,708 dated Mar. 19, 2007; 16 pages.
USPTO Non-Final Rejection for U.S. Appl. No. 11/322,044 dated Apr. 11, 2008; 11 pages.
USPTO Non-Final Rejection for U.S. Appl. No. 11/322,044 dated Apr. 24, 2007; 13 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/337,272 dated May 17, 2007; 11 pages.
USPTO Non-Final Rejection for U.S. Appl. No. 11/337,272 dated Oct. 24, 2006; 9 pages.
USPTO Non-Final Rejection for U.S. Appl. No. 11/415,588 dated Jun. 13, 2007; 8 pages.
USPTO Non-Final Rejection for U.S. Appl. No. 11/644,100 dated Mar. 9, 2009; 11 pages.
USPTO Non-Final Rejection for U.S. Appl. No. 11/644,100 dated Apr. 14, 2008; 10 pages.
USPTO Non-Final Rejection for U.S. Appl. No. 11/644,100 dated Sep. 15, 2010; 10 pages.

USPTO Non-Final Rejection for U.S. Appl. No. 11/644,100 dated Dec. 16, 2009; 13 pages.
USPTO Non-Final Rejection for U.S. Appl. No. 11/698,660 dated May 21, 2010; 15 pages.
USPTO Non-Final Rejection for U.S. Appl. No. 11/698,660 dated Oct. 7, 2009; 12 pages.
USPTO Non-Final Rejection for U.S. Appl. No. 11/698,660 dated Dec. 2, 2008; 12 pages.
USPTO Non-Final Rejection for U.S. Appl. No. 11/698,660 dated Dec. 13, 2010; 20 pages.
USPTO Non-Final Rejection for U.S. Appl. No. 11/709,886 dated Nov. 7, 2008; 14 pages.
USPTO Non-Final Rejection for U.S. Appl. No. 11/799,439 dated May 29, 2008; 8 pages.
USPTO Non-Final Rejection for U.S. Appl. No. 11/799,439 dated Nov. 2, 2007; 7 pages.
USPTO Non-Final Rejection for U.S. Appl. No. 11/818,005 dated Oct. 26, 2010; 10 pages.
USPTO Non-Final Rejection for U.S. Appl. No. 11/818,005 dated Nov. 23, 2009; 8 pages.
USPTO Non-Final Rejection for U.S. Appl. No. 11/850,280 dated Jan. 14, 2010; 8 pages.
USPTO Non-Final Rejection for U.S. Appl. No. 11/850,260 dated Mar. 6, 2009; 7 pages.
USPTO Non-Final Rejection for U.S. Appl. No. 11/857,947 dated Feb. 3, 2010; 23 pages.
USPTO Non-Final Rejection for U.S. Appl. No. 11/857,947 dated Mar. 30, 2009; 18 pages.
USPTO Non-Final Rejection for U.S. Appl. No. 11/857,947 dated Jul. 21, 2010; 15 pages.
USPTO Non-Final Rejection for U.S. Appl. No. 11/859,547 dated Oct. 1, 2009; 9 pages.
USPTO Non-Final Rejection for U.S. Appl. No. 11/865,672 dated Jul. 17, 2009; 6 pages.
USPTO Non-Final Rejection for U.S. Appl. No. 11/963,661 dated Feb. 4, 2010; 11 pages.
USPTO Non-Final Rejection for U.S. Appl. No. 11/963,661 dated May 15, 2012; 19 pages.
USPTO Non-Final Rejection for U.S. Appl. No. 11/963,661 dated Dec. 3, 2010; 18 pages.
USPTO Non-Final Rejection for U.S. Appl. No. 11/963,661 dated Dec. 29, 2011; 16 pages.
USPTO Non-Final Rejection for U.S. Appl. No. 11/965,291 dated Dec. 17, 2008; 8 pages.
USPTO Non-Final Rejection for U.S. Appl. No. 11/965,677 dated Mar. 10, 2009; 10 pages.
USPTO Non-Final Rejection for U.S. Appl. No. 11/967,240 dated Jun. 10, 2009; 7 pages.
USPTO Non-Final Rejection for U.S. Appl. No. 11/967,243 dated Sep. 17, 2009; 9 pages.
USPTO Non-Final Rejection for U.S. Appl. No. 11/968,145 dated Jan. 5, 2011; 8 pages.
USPTO Non-Final Rejection for U.S. Appl. No. 11/968,145 dated Mar. 4, 2010; 11 pages.
USPTO Non-Final Rejection for U.S. Appl. No. 11/983,291 dated Mar. 9, 2009; 9 pages.
USPTO Nan-Final Rejection for U.S. Appl. No. 12/004,833 dated Dec. 21, 2010; 8 pages.
USPTO Non-Final Rejection for U.S. Appl. No. 12/058,534 dated Jan. 11, 2011; 17 pages.
USPTO Non-Final Rejection for U.S. Appl. No. 12/058,569 dated Aug. 2, 2010; 9 pages.
USPTO Non-Final Rejection for U.S. Appl. No. 12/060,128 dated Apr. 29, 2009; 11 pages.
USPTO Non-Final Rejection for U.S. Appl. No. 12/080,176 dated Mar. 30, 2010; 22 pages.
USPTO Non-Final Rejection for U.S. Appl. No. 12/080,176 dated Apr. 6, 2011; 23 pages.
USPTO Non-Final Rejection for U.S. Appl. No. 12/060,176 dated May 1, 2012; 25 pages.
USPTO Non-Final Rejection for U.S. Appl. No. 12/060,176 dated Nov. 20, 2012; 26 pages.
USPTO Non-Final Rejection for U.S. Appl. No. 12/060,176 dated Mar. 30, 2010; 22 pages.
USPTO Non-Final Rejection for U.S. Appl. No. 12/104,391 dated Oct. 20, 2011; 4 pages.
USPTO Non-Final Rejection for U.S. Appl. No. 12/104,672 dated Aug. 26, 2009; 11 pages.
USPTO Non-Final Rejection for U.S. Appl. No. 12/104,678 dated Jul. 2, 2010; 8 pages.
USPTO Non-Final Rejection for U.S. Appl. No. 12/132,527 dated Apr. 29, 2010; 7 pages.
USPTO Non-Final Rejection for U.S. Appl. No. 12/136,557 dated Mar. 15, 2010; 10 pages.
USPTO Non-Final Rejection for U.S. Appl. No. 12/218,404 dated Sep. 30, 2008; 8 pages.
USPTO Non-Final Rejection for U.S. Appl. No. 12/786,412 dated Jan. 31, 2011; 1 page.
USPTO Non-Final Rejection for U.S. Appl. No. 13/099,334 dated May 25, 2012; 12 pages.
USPTO Non-Final Rejection for U.S. Appl. No. 13/303,112 dated Oct. 11, 2012; 20 pages.
USPTO Non-Final Rejection for U.S. Appl. No. 09/975,338 dated Apr. 5, 2005; 13 pages.
USPTO Non-Final Rejection for U.S. Appl. No. 10/288,003 dated Apr. 7, 2004; 9 pages.
USPTO Notice of Allowance for U.S. Appl. No. 09/975,105 dated Dec. 4, 2006; 4 pages.
USPTO Notice of Allowance for U.S. Appl. No. 09/989,777 dated Jul. 7, 2008; 23 pages.
USPTO Notice of Allowance for U.S. Appl. No. 09/989,777 dated Sep. 15, 2008; 28 pages.
USPTO Notice of Allowance for U.S. Appl. No. 09/989,777 dated Nov. 4, 2008; 3 pages.
USPTO Notice of Allowance for U.S. Appl. No. 09/992,076 dated Nov. 13, 2008; 15 pages.
USPTO Notice of Allowance for U.S. Appl. No. 09/992,076 dated Nov. 29, 2007; 8 pages.
USPTO Notice of Allowance for U.S. Appl. No. 09/992,076 dated Mar. 26, 2008; 23 pages.
USPTO Notice of Allowance for U.S. Appl. No. 09/992,076 dated Jul. 29, 2008; 6 pages.
USPTO Notice of AHowance for U.S. Appl. No. 09/994,600 dated May 14, 2008:; 22 pages.
USPTO Notice of Allowance for U.S. Appl. No. 09/994,601 dated Nov. 12, 2008; 35 pages.
USPTO Notice of Allowance for U.S. Appl. No. 09/994,601 dated Dec. 22, 2008; 15 pages.
USPTO Notice of Allowance for U.S. Appl. No. 09/998,834 dated May 19, 2005; 7 pages.
USPTO Notice of Allowance for U.S. Appl. No. 09/998,859 dated Mar. 14, 2005; 6 pages.
USPTO Notice of Allowance for U.S. Appl. No. 10/001,477 dated Nov. 10, 2008; 7 pages.
USPTO Notice of Allowance for U.S. Appl. No. 10/002,217 dated Jan. 28, 2009; 4 pages.
USPTO Notice of Allowance for U.S. Appl. No. 10/002,217 dated Jun. 6, 2008; 7 pages.
USPTO Notice of Allowance for U.S. Appl. No. 10/008,096 dated Dec. 22, 2008; 24 pages.
USPTO Notice of Allowance for U.S. Appl. No. 10/033,027 dated Mar. 31, 2009; 7 pages.
USPTO Notice of Allowance for U.S. Appl. No. 10/113,065 dated Apr. 6, 2008; 8 pages.
USPTO Notice of Allowance for U.S. Appl. No. 10/238,966 dated Jan. 27, 2009; 4 pages.
USPTO Notice of Allowance for U.S. Appl. No. 09/404,891 dated Mar. 4, 2005; 6 pages.
USPTO Notice of Allowance for U.S. Appl. No. 09/475,808 dated Nov. 8, 2001; 8 pages.
USPTO Notice of Allowance for U.S. Appl. No. 09/475,879 dated Oct. 22, 2004; 7 pages.
USPTO Notice of Allowance for U.S. Appl. No. 09/826,397 dated Oct. 7, 2004; 8 pages.

USPTO Notice of Allowance for U.S. Appl. No. 09/855,868 dated Apr. 25, 2005; 6 pages.
USPTO Notice of Allowance for U.S. Appl. No. 09/875,599 dated Oct. 17, 2006; 4 pages.
USPTO Notice of Allowance for U.S. Appl. No. 09/887,923 dated Sep. 27, 2004; 5 pages.
USPTO Notice of Allowance for U.S. Appl. No. 09/887,955 dated Oct. 12, 2004; 5 pages.
USPTO Notice of Allowance for U.S. Appl. No. 09/893,048 dated Jul. 25, 2006; 4 pages.
USPTO Notice of Allowance for U.S. Appl. No. 09/893,050 dated Jul. 5, 2005; 6 pages.
USPTO Notice of Allowance for U.S. Appl. No. 09/909,047 dated Feb. 15, 2005; 6 pages.
USPTO Notice of Allowance for U.S. Appl. No. 09/909,047 dated May 11, 2005; 25 pages.
USPTO Notice of Allowance for U.S. Appl. No. 09/912,768 dated Sep. 13, 2005; 5 pages.
USPTO Notice of Allowance for U.S. Appl. No. 09/922,579 dated Dec. 28, 2004; 6 pages.
USPTO Notice of Allowance for U.S. Appl. No. 09/923,461 dated May 12, 2005; 6 pages.
USPTO Notice of Allowance for U.S. Appl. No. 09/929,891 dated Jun. 15, 2005; 6 pages.
USPTO Notice of Allowance for U.S. Appl. No. 09/929,891 dated Dec. 23, 2005; 4 pages.
USPTO Notice of Allowance for U.S. Appl. No. 09/930,021 dated Nov. 26, 2004; 4 pages.
USPTO Notice of Allowance for U.S. Appl. No. 09/943,062 dated Jun. 29, 2010; 4 pages.
USPTO Notice of Allowance for U.S. Appl. No. 09/943,149 dated Jan. 12, 2004; 7 pages.
USPTO Notice of Allowance for U.S. Appl. No. 09/953,423 dated Jul. 12, 2004; 6 pages.
USPTO Notice of Allowance for U.S. Appl. No. 09/957,084 dated May 18, 2004; 5 pages.
USPTO Notice of Allowance for U.S. Appl. No. 09/969,311 dated Mar. 1, 2005; 4 pages.
USPTO Notice of Allowance for U.S. Appl. No. 09/969,313 dated Oct. 4, 2005; 6 pages.
USPTO Notice of Allowance for U.S. Appl. No. 09/972,003 dated Jul. 14, 2004; 4 pages.
USPTO Notice of Allowance for U.S. Appl. No. 09/972,133 dated Jun. 9, 2006; 6 pages.
USPTO Notice of Allowance for U.S. Appl. No. 09/972,319 dated Dec. 30, 2004; 4 pages.
USPTO Notice of Allowance for U.S. Appl. No. 09/975,030 dated Feb. 6, 2006; 7 pages.
USPTO Notice of Allowance for U.S. Appl. No. 09/975,104 dated Oct. 19, 2006; 6 pages.
USPTO Notice of Allowance for U.S. Appl. No. 09/975,115 dated Jan. 29, 2010; 9 pages.
USPTO Notice of Allowance for U.S. Appl. No. 09/977,111 dated Sep. 28, 2006; 6 pages.
USPTO Notice of Allowance for U.S. Appl. No. 09/989,570 dated May 19, 2005; 4 pages.
USPTO Notice of Allowance for U.S. Appl. No. 09/989,570 dated Sep. 10, 2004; 8 pages.
USPTO Notice of Allowance for U.S. Appl. No. 09/989,571 dated Sep. 13, 2005; 6 pages.
USPTO Notice of Allowance for U.S. Appl. No. 09/989,761 dated Jan. 14, 2005; 6 pages.
USPTO Notice of Allowance for U.S. Appl. No. 09/989,762 dated Jan. 2, 2008; 6 pages.
USPTO Notice of Allowance for U.S. Appl. No. 09/989,762 dated Feb. 22, 2010; 7 pages.
USPTO Notice of Allowance for U.S. Appl. No. 09/989,762 dated Mar. 25, 2009; 7 pages.
USPTO Notice of Allowance for U.S. Appl. No. 09/989,762 dated Jun. 2, 2008; 6 pages.
USPTO Notice of Allowance for U.S. Appl. No. 09/989,762 dated Oct. 24, 2008; 7 pages.
USPTO Notice of Allowance for U.S. Appl. No. 09/989,762 dated Jul. 16, 2009; 6 pages.
USPTO Notice of Allowance for U.S. Appl. No. 09/989,762 dated Oct. 30, 2009; 6 pages.
USPTO Notice of Allowance for U.S. Appl. No. 09/989,765 dated Mar. 31, 2010; 8 pages.
USPTO Notice of Allowance for U.S. Appl. No. 09/989,765 dated Sep. 3, 2009; 7 pages.
USPTO Notice of Allowance for U.S. Appl. No. 09/989,766 dated Dec. 22, 2009; 8 pages.
USPTO Notice of Allowance for U.S. Appl. No. 09/989,777 dated Jan. 15, 2010; 8 pages.
USPTO Notice of Allowance for U.S. Appl. No. 09/989,777 dated Aug. 6, 2009; 8 pages.
USPTO Notice of Allowance for U.S. Appl. No. 09/989,777 dated Mar. 9, 2009; 7 pages.
USPTO Notice of Allowance for U.S. Appl. No. 09/989,808 dated Feb. 13, 2008; 4 pages.
USPTO Notice of Allowance for U.S. Appl. No. 09/989,817 dated May 9, 2005; 6 pages.
USPTO Notice of Allowance for U.S. Appl. No. 09/989,819 dated Jan. 11, 2005; 7 pages.
USPTO Notice of Allowance for U.S. Appl. No. 09/992,076 dated Feb. 27, 2009; 6 pages.
USPTO Notice of Allowance for U.S. Appl. No. 09/994,600 dated Jan. 4, 2010; 4 pages.
USPTO Notice of Allowance for U.S. Appl. No. 09/994,600 dated Apr. 3, 2009; 5 pages.
USPTO Notice of Allowance for U.S. Appl. No. 09/994,600 dated Jun. 25, 2009; 4 pages.
USPTO Notice of Allowance for U.S. Appl. No. 09/998,848 dated Jan. 13, 2010; 4 pages.
USPTO Notice of Allowance for U.S. Appl. No. 10/001,477 dated Mar. 23, 2010; 6 pages.
USPTO Notice of Allowance for U.S. Appl. No. 10/001,477 dated Aug. 26, 2009; 6 pages.
USPTO Notice of Allowance for U.S. Appl. No. 10/001,477 dated Dec. 4, 2009; 7 pages.
USPTO Notice of Allowance for U.S. Appl. No. 10/001,477 dated May 8, 2009; 6 pages.
USPTO Notice of Allowance for U.S. Appl. No. 10/001,478 dated Jun. 2, 2010; 11 pages.
USPTO Notice of Allowance for U.S. Appl. No. 10/001,568 dated Mar. 17, 2006; 9 pages.
USPTO Notice of Allowance for U.S. Appl. No. 10/002,217 dated Oct. 14, 2008.
USPTO Notice of Allowance for U.S. Appl. No. 10/002,217 dated Jan. 11, 2010; 7 pages.
USPTO Notice of Allowance for U.S. Appl. No. 10/002,217 dated Jun. 8, 2009; 8 pages.
USPTO Notice of Allowance for U.S. Appl. No. 10/002,217 dated Sep. 17, 2009; 6 pages.
USPTO Notice of Allowance for U.S. Appl. No. 10/002,726 dated Feb. 6, 2007; 7 pages.
USPTO Notice of Allowance for U.S. Appl. No. 10/004,039 dated Aug. 15, 2006; 7 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Notice of Allowance for U.S. Appl. No. 10/008,096 dated Feb. 1, 2010; 6 pages.
USPTO Notice of Allowance for U.S. Appl. No. 10/008,096 dated Jun. 5, 2009; 12 pages.
USPTO Notice of Allowance for U.S. Appl. No. 10/008,096 dated Oct. 21, 2009; 6 pages.
USPTO Notice of Allowance for U.S. Appl. No. 10/011,214 dated Apr. 11, 2005; 4 pages.
USPTO Notice of Allowance for U.S. Appl. No. 10/024,093 dated Sep. 10, 2002; 3 pages.
USPTO Notice of Allowance for U.S. Appl. No. 10/033,027 dated Feb. 18, 2010; 4 pages.

USPTO Notice of Allowance for U.S. Appl. No. 10/033,027 dated Sep. 2, 2009; 4 pages.
USPTO Notice of Allowance for U.S. Appl. No. 10/109,979 dated Mar. 14, 2006; 6 pages.
USPTO Notice of Allowance for U.S. Appl. No. 10/113,064 dated Sep. 21, 2006; 7 pages.
USPTO Notice of Allowance for U.S. Appl. No. 10/113,581 dated Mar. 5, 2010; 9 pages.
USPTO Notice of Allowance for U.S. Appl. No. 10/113,581 dated Sep. 3, 2010; 11 pages.
USPTO Notice of Allowance for U.S. Appl. No. 10/118,682 dated Apr. 3, 2006; 4 pages.
USPTO Notice of Allowance for U.S. Appl. No. 10/137,497 dated Jan. 24, 2007; 12 pages.
USPTO Notice of Allowance for U.S. Appl. No. 10/137,497 dated Jul. 20, 2007; 4 pages.
USPTO Notice of Allowance for U.S. Appl. No. 10/226,911 dated Aug. 20, 2004; 4 pages.
USPTO Notice of Allowance for U.S. Appl. No. 10/238,966 dated Feb. 1, 2010; 4 pages.
USPTO Notice of Allowance for U.S. Appl. No. 10/238,966 dated Aug. 5, 2009; 5 pages.
USPTO Notice of Allowance for U.S. Appl. No. 10/256,829 dated May 10, 2010; 4 pages.
USPTO Notice of Allowance for U.S. Appl. No. 10/256,829 dated Jan. 29, 2007; 6 pages.
USPTO Notice of Allowance for U.S. Appl. No. 10/272,231 dated Mar. 8, 2004; 6 pages.
USPTO Notice of Allowance for U.S. Appl. No. 10/288,003 dated Jan. 14, 2005; 6 pages.
USPTO Notice of Allowance for U.S. Appl. No. 10/293,392 dated Mar. 10, 2004; 6 pages.
USPTO Notice of Allowance for U.S. Appl. No. 10/305,589 dated Feb. 4, 2005; 5 pages.
USPTO Notice of Allowance for U.S. Appl. No. 10/324,455 dated Feb. 12, 2004; 4 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Notice of Allowance for U.S. Appl. No. 10/327,217 dated Aug. 12, 2004; 6 pages.
USPTO Notice of Allowance for U.S. Appl. No. 10/329,162 dated Jul. 5, 2007; 7 pages.
USPTO Notice of Allowance for U.S. Appl. No. 10/653,050 dated Jul. 29, 2004; 3 pages.
USPTO Notice of Allowance for U.S. Appl. No. 10/803,030 dated Jan. 8, 2007; 6 pages.
USPTO Notice of Allowance for U.S. Appl. No. 10/871,582 dated Mar. 30, 2006; 6 pages.
USPTO Notice of Allowance for U.S. Appl. No. 11/088,028 dated Jan. 26, 2007; 6 pages.
USPTO Notice of Allowance for U.S. Appl. No. 11/088,028 dated Jul. 2, 2007; 6 pages.
USPTO Notice of Allowance for U.S. Appl. No. 11/125,554 dated Feb. 7, 2008; 4 pages.
USPTO Notioe of Allowance for U.S. Appl. No. 11/125,554 dated Apr. 24, 2007; 7 pages.
USPTO Notice of Allowance for U.S. Appl. No. 11/132,894 dated Apr. 26, 2007; 4 pages.
USPTO Notice of Allowance for U.S. Appl. No. 11/201,627 dated Jan. 20, 2011; 8 pages.
USPTO Notice of Allowance for U.S. Appl. No. 11/201,922 dated Apr. 9, 2009; 4 pages.
USPTO Notice of Allowance for U.S. Appl. No. 11/273,708 dated Aug. 9, 2007; 4 pages.
USPTO Notice of Allowance for U.S. Appl. No. 11/337,272 dated Aug. 15, 2007; 9 pages.
USPTO Notice of Allowance for U.S. Appl. No. 11/415,588 dated Mar. 11, 2008; 6 pages.
USPTO Notice of Allowance for U.S. Appl. No. 11/644,100 dated Jan. 6, 2011; 6 pages.
USPTO Notice of Allowance for U.S. Appl. No. 11/709,866 dated Feb. 16, 2010; 7 pages.
USPTO Notice of Allowance for U.S. Appl. No. 11/709,866 dated Apr. 7, 2009; 8 pages.
USPTO Notice of Allowance for U.S. Appl. No. 11/709,866 dated Aug. 4, 2009; 7 pages.
USPTO Notice of Allowance for U.S. Appl. No. 11/799,439 dated Feb. 5, 2010; 4 pages.
USPTO Notice of Allowance for U.S. Appl. No. 11/799,439 dated Jun. 25, 2009; 6 pages.
USPTO Notice of Allowance for U.S. Appl. No. 11/850,260 dated Jul. 2, 2010; 8 pages.
USPTO Notice of Allowance for U.S. Appl. No. 11/857,947 dated Jul. 8, 2011; 7 pages.
USPTO Notice of Allowance for U.S. Appl. No. 11/857,947 dated Dec. 23, 2011; 7 pages.
USPTO Notice of Allowance for U.S. Appl. No. 11/965,291 dated Apr. 15, 2010; 4 pages.
USPTO Notice of Allowance for U.S. Appl. No. 11/965,291 dated Sep. 21, 2009; 7 pages.
USPTO Notice of Allowance for U.S. Appl. No. 11/965,291 dated Oct. 5, 2009; 2 pages.
USPTO Notice of Allowance for Appication No. 11/965,291 dated Jan. 13, 2010; 4 pages.
USPTO Notice of Allowance for U.S. Appl. No. 11/965,291 dated May 5, 2009; 7 pages.
USPTO Notice of Allowance for U.S. Appl. No. 11/965,677 dated Feb. 12, 2010; 4 pages.
USPTO Notice of Allowance for U.S. Appl. No. 11/965,677 dated Sep. 9, 2009; 6 pages.
USPTO Notice of Allowance for U.S. Appl. No. 11/965,677 dated May 12, 2011; 5 pages.
USPTO Notice of Allowance for U.S. Appl. No. 11/965,677 dated May 19, 2010; 4 pages.
USPTO Notice of Allowance for U.S. Appl. No. 11/965,677 dated Sep. 15, 2010; 4 pages.
USPTO Notice of Allowance for U.S. Appl. No. 11/965,677 dated Nov. 2, 2009; 4 ppages.
USPTO Notice of Allowance for U.S. Appl. No. 11/983,291 dated Oct. 22, 2009; 7 pages.
USPTO Notice of Allowance for U.S. Appl. No. 11/985,340 dated Feb. 19, 2010; 8 pages.
USPTO Notice of Allowance for U.S. Appl. No. 11/985,340 dated Jun. 2, 2009; 7 pages.
USPTO Notice of Allowance for U.S. Appl. No. 11/985,340 dated Jun. 9, 2010; 8 pages.
USPTO Notice of Allowance for U.S. Appl. No. 11/985,340 dated Nov. 9, 2009; 7 pages.
USPTO Notice of Allowance for U.S. Appl. No. 11/986,338 dated Feb. 16, 2010; 4 pages.
USPTO Notice of Allowance for U.S. Appl. No. 11/986,338 dated Oct. 19, 2009; 4 pages.
USPTO Notice of Allowance for U.S. Appl. No. 11/986,338 dated May 7, 2009; 1 page.
USPTO Notice of Allowance for U.S. Appl. No. 12/057,149 dated Nov. 30, 2010; 7 pages.
USPTO Notioe of Allowance for U.S. Appl. No. 12/058,569 dated Dec. 13, 2010; 6 pages.
USPTO Notice of Allowance for U.S. Appl. No. 12/060,128 dated Oct. 19, 2009; 8 pages.
USPTO Notice of Allowance for U.S. Appl. No. 12/104,391 dated Dec. 1, 2011; 5 pages.
USPTO Notice of Allowance for U.S. Appl. No. 12/104,391 dated Dec. 7, 2012; 5 pages.
USPTO Notice of Allowance for U.S. Appl. No. 12/104,672 dated Jan. 11, 2010; 7 pages.
USPTO Notice of Allowance for U.S. Appl. No. 12/218,404 dated Feb. 16, 2010; 7 pages.
USPTO Notice of Ailowance for U.S. Appl. No. 12/218,404 dated Mar. 19, 2009; 7 pages.
USPTO Notice of Allowance for U.S. Appl. No. 12/218,404 dated Jul. 10, 2009; 7 pages.

USPTO Notice of Allowance for U.S. Appl. No. 12/218,404 dated Nov. 3, 2009; 8 pages.
USPTO Notice of Allowance for U.S. Appl. No. 13/099,334 dated Nov. 23, 2012; 7 pages.
USPTO Notice of Allowance for U.S. Appl. No. 10/238,966 dated Apr. 19, 2007; 4 pages.
USPTO Requirement for Restriction for U.S. Appl. No. 11/985,340 dated Mar. 16, 2009; 7 pages.
USPTO Requirement for Restriction/Election for U.S. Appl. No. 09/969,313 dated Mar. 18, 2005; 6 pages.
USPTO Requirement for Restriction/Electio, for U.S. Appl. No. 09/972,003 dated May 6, 2004; 4 pages.
USPTO Requirement for Restriction/Election for U.S. Appl. No. 11/337,272 dated Sep. 11, 2006; 5 pages.
USPTO Requirement for Restriction/Election for U.S. Appl. No. 11/818,005 dated Jul. 14, 2009; 5 pages.
USPTO Requirement Restriction for U.S. Appl. No. 10/118,682 dated Apr. 28, 2005; 4 pages.
USPTO Requirement Restriction for U.S. Appl. No. 12/004,833 dated Sep. 22, 2010; 6 pages.
Van Ess, David; "Simulating a 555 Timer with PSoC," Cypress Semiconductor Corporation, Application Note AN2286, May 19, 2005; 10 pages.
Varma et al., "A Structured Test Re-Use Methodology for Core-Based System Chips," IEEE, 1998; 9 pages.
Vixel, "InSpeed SOC 320 Embedded Storage Switch," 2003, Vixel, pp. 1-5; 5 pages.
Wang, et al. "Synthesizing Operating System Based Device Drivers in Embedded Systems," Oct. 1-3, 2003; ACM, pp. 37-44; 8 pages.
Wikipedia—Main Page, retrieved on Mar. 8, 2006 from http://en.wikipedia.org/wiki/Main_Page and http://en.wikipedia.org/wiki/Wikipedia:Introduction; 5 pages.
Wikipedia—Processor register, retreved on Mar. 7, 2006 from http://en.wikipedia.org/wiki/Processor_register; 4 pages.
Wikipedia "XML" retrieved on Jan. 29, 2007 from http://en.wikipedia.org/wiki/XML; 16 pages.
Wikipedia.org, "Von Neumann architecture"; retrieved from http://en.wikipedia.org/wiki/Von_Neumann_architecture on Jan. 22, 2007; 4 pages.
Written Opinion of the International Search Authority for International Application No. PCT/US08/60680 dated Aug. 15, 2008; 4 pages.
Written Opinion of the International Searching Authority for International Application No. PCT/US08/60681 dated Sep. 12, 2008; 4 pages.
Written Opinion of the International Searching Authority for International Application No. PCT/US08/60895 mailed Jul. 22, 2009; 6 pages.
Written Opinion of the International Searching Authority for International Application No. PCT/US08/60696 mailed Sep. 22, 2008; 4 pages.
Xerox, "Mesa Debugger Documentation," Apr. 1979; Xerox Systems Development Department; Version 5.0, pp. 1-30; 33 pages.
Xilinx, Virtex-II Pro Platform FPGA Developers Kit, "How Data2BRAM Fits in Hardware and Software Flows," Chapter 2: Using Data2BRAM, Jan. 2003 Release; 2 pages.
Yoo et al., "Fast Hardware-Software Coverification by Optimistic Execution of Real Processor, Proceedings of Design, Automation and Test in Europe Conference and Exhibition," Mar. 2000, pp. 663-668; 8 pages.
York et al., "On-chip Support Needed for SOC Debug," Electronic Engineering Times, Jun. 1999, pp. 104, 110, 2 pages.
Zorian et al., "Testing Embedded-Core Based System Chips," IEEE, 1998; 14 pages.
Zorian, "Test Requirements for Embedded Core-based Systems and IEEE P1500," IEEE, 1997; 9 pages.
SIPO Office Action for Application No. 200880012232.1 dated Dec. 5, 2012; 2 pages.
USPTO Notice of Allowance for U.S. Appl. No. 11/965,677 dated Jan. 6, 2011; 4 pages.
USPTO Notice of Allowance for U.S. Appl. No. 13/099,334 dated Jan. 24, 2013; 5 pages.
USPTO Notice of Allowance for U.S. Appl. No. 13/099,334 dated Mar. 1, 2013; 5 pages.

* cited by examiner

SYSTEM LEVEL INTERCONNECT WITH PROGRAMMABLE SWITCHING

RELATED APPLICATIONS

The application is a continuation of U.S. patent application Ser. No. 11/965,677, filed Dec. 27, 2007 now U.S. Pat. No. 8,026,739, which claims priority to U.S. Provisional Patent Application No. 60/912,399, filed Apr. 17, 2007, both of which are hereby incorporated by reference herein.

TECHNICAL FIELD

The present disclosure relates generally to programmable devices, and more particularly to a programmable interconnect matrix.

BACKGROUND

Field-programmable gate arrays (FPGAs) and programmable logic devices (PLDs) have been used in data communication and telecommunication systems. Conventional PLDs and FPGAs consist of an array of programmable elements, with the elements program ed to implement a fixed function or equation. Some currently available Complex PLD (CPLD) products comprise arrays of logic cells. Conventional PLD devices have several drawbacks, such high power and large silicon area.

In developing complex electronic systems, there is often a need for additional peripheral units, such as operational and instrument amplifiers, filters, timers, digital logic circuits, analog to digital and digital to analog converters, etc. As a general rule, implementation of these extra peripherals create additional difficulties: extra space for new components, additional attention during production of a printed circuit board, and increased power consumption. All of these factors can significantly affect the price and development cycle of the project.

The introduction of Programmable System on Chip (PSoC) chips feature digital and analog programmable blocks, which allow the implementation of a large number of peripherals. A programmable interconnect allows analog and digital blocks to be combined to form a wide variety of functional modules. The digital blocks consist of smaller programmable blocks and are configured to provide different digital functions. The analog blocks are used for development of analog elements, such as analog filters, comparators, inverting amplifiers, as well as analog to digital and digital to analog converters. Current PSoC architectures provide only a coarse grained digital programmability in which a few fixed functions with a small number of options are available.

SUMMARY

Different functional elements are all located on a same intew-ated circuit wherein at least one of the functional elements comprises a micro-controller. Configuration registers or configuration memory in the integrated circuit store configuration values loaded by the micro-controller or some other data transfer mechanism such as Direct Memory Access (DMA). I/O pins are configured to connect the integrated circuit to external signals. A system level interconnect also located in the integrated circuit programmably connects together the different functional elements and different IO pins according to the configuration values loaded into the configuration registers.

The system level interconnect can dynamically change the connections between the different functional elements and the different TO pins in real-time according to different operational states of the integrated circuit. Any of the different functional elements in the integrated circuit can be connected to any of the different I/O pins and any of the different functional elements can be connected to each other according to the configuration values.

A first set of the functional elements can comprise analog peripherals and a second set of the functional elements can comprise digital peripherals. The system level interconnect can be programmed according to the configuration values to couple an IO pin to one of the analog peripherals while the integrated circuit is in a first state and then couple the same I/O pin to one of the digital peripherals when the integrated circuit is in a second different state.

The functional elements can further include multiple digital blocks that each include programmable logic device sections having uncommitted user programmable logic functions and datapath sections having structural arithmetic elements that together form an arithmetic sequencer. The system level interconnect is programmably configurable to connect different selectable programmable logic device sections in the digital blocks to other different selectable functional elements and to different selectable I/O pins. The system level interconnect is also programmably configurable to connect different selectable datapath sections in the same digital blocks to other different selectable functional elements and to different selectable I/O pins.

A selected I/O pin can operate as an input pin by coupling the selected I/O pin to an input for one of the functional elements while the integrated circuit is in a first operational state. The same I/O pin can also operate as an output pin by coupling the same selected I/O pin to an output for one of the functional elements while the integrated circuit is in a second operational state. Analog or digital signals from different I/O pins can also be synchronously multiplexed to a same functional element through dynamic programming of the I/O pin connections.

This programmable switching consists of channel switches that programmably couple the horizontal channels of the system level interconnect to connect to the different functional elements in the system according to the configuration values. Segmentation switches in the system level interconnect programmably couple the horizontal channels to each other and vertical channels in the system level interrconnect according to the configuration values.

Different sets of interface signals are coupled to different associated functional elements and different associated I/O pins. The interface signals overlap with the different channel lines and programmably couple to the different channel lines according to the configuration values. The interface signals can be shorted together and each of the multiple shorted interface lines can be programmably coupled to multiple different channel lines according to the configuration values. Hold cells are connected to the interface lines and retain a last state prior to the integrated circuit being reconfigured. The hold cells can also set the associated interface lines to weak predetermined states upon receiving a reset signal.

INTRODUCTION

A system level interconnect allows signals to be routed globally on and off the chip and also increases the number of functions that can be supported while improving the overall routing efficiency in a digital programmable system. The system level interconnect is a general purpose routing resource interconnecting I/O pins with on-chip peripherals. The system level interconnect has two components: the interconnect matrix in the Universal Digital Block (UDB) array that connects different UDBs together and a Digital System Interconnect (DSI) that connects the UDB array to other peripherals and I/O pins. The system level interconnect enables on-chip peripherals to be connected to arbitrary input/output pins and then reconfigured on the fly in real time.

DETAILED DESCRIPTION

Figure 1:
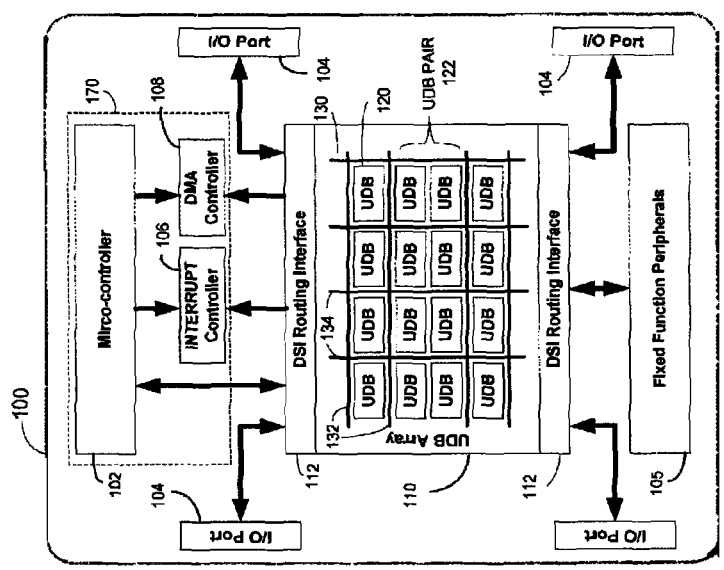
FIG. 1 is a schematic block diagram illustrating an example PSoC architecture that includes a Universal Digital Block (UDB) array.

FIG. 1 is a high level view of a Universal Digital Block (UDB) array 110 contained within a Programmable System on a Chip (PSoC) Integrated Circuit (IC) 100. The UDB array 110 includes a programmable interconnect matrix 130 that connects together the different UDBs 120. The individual UDBs 120 each include a collection of uncommitted logic in the form of Programmable Logic Devices (PLDs) and structural dedicated logic elements that form a datapath 210 shown in more detail in FIGS. 8 and 9.

UDB Array

The UDB array 110 is arranged into UDB pairs 122 that each include two UDBs 120 that can be tightly coupled to a shared horizontal routing channel 132. The UDB pairs 122 can also be programmably connected to the horizontal routing channels 132 of other UDB pairs 122 either in the same horizontal row or in different rows through vertical routing channels 134. The horizontal and vertical routing channels and other switching elements are all collectively referred to as the interconnect matrix 130.

A Digital System Interconnect (DSI) routing interface 112 connects a micro-controller system 170 and other fixed function peripherals 105 to the UDB array 110. The micro-controller system 170 includes a micro-controller 102, an interrupt controller 106, and a Direct Memory Access (DMA) controller 108. The other peripherals 105 can be any digital or analog functional element in PSoC 100. The DSI 112 is an extension of the interconnect matrix 130 at the top and bottom of the UDB array 110.

Figure 2:
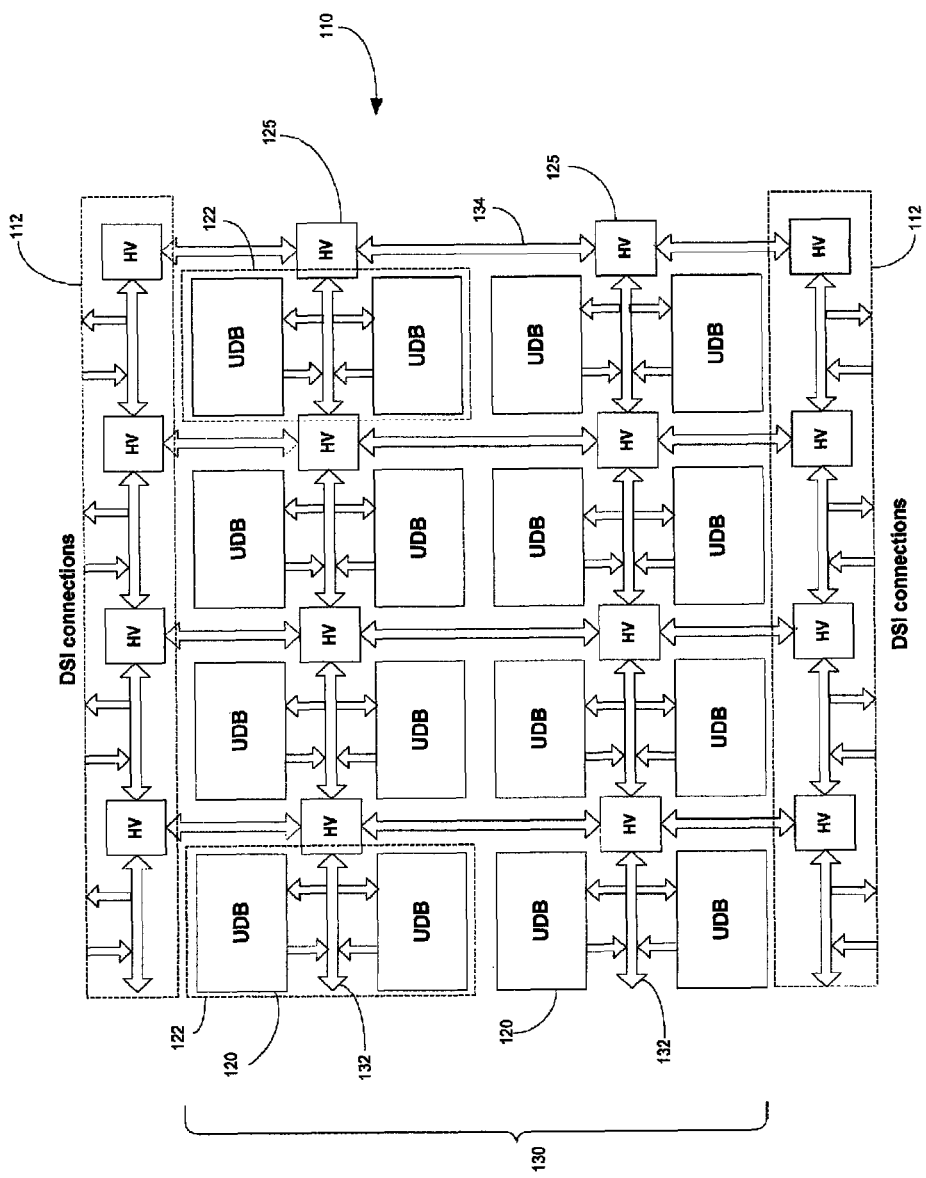
FIG. 2 is a schematic block showing an interconnect matrix in the UDB array.

FIG. 2 shows the interconnect matrix 130 in more detail and includes horizontal routing channels 132 that programmably connect with one or more associated Universal Digital Blocks (UDB) 120. In this example, pairs 122 of UDBs 120 are tightly coupled together through their associated horizontal routing channel 132. However, more than two UDBs 120 can be tightly coupled together through the same horizontal routing channel 132.

The interconnect matrix 130 also includes Horizontal/Vertical (H/V) segmentation elements 125 that programmably interconnect the different horizontal routing channels 132 together. The segmentation elements 125 couple together the horizontal routing channels 132 for the different digital block pairs 122 in the same rows. The segmentation elements 125 also programmably couple together the horizontal routing channels 132 for digital block pairs 122 in different rows through vertical routing channels 134.

Figure 3:
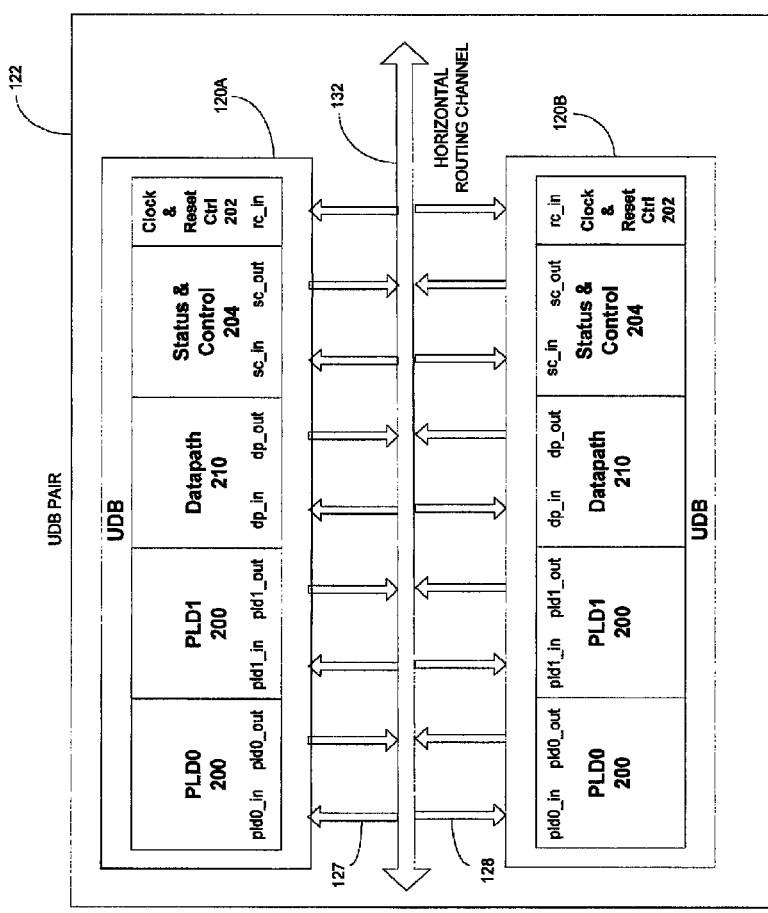
FIG. 3 is a schematic block diagram showing how a pair of UDBs are tightly coupled to a horizontal routing channel.

FIG. 3 shows one of the UDB pairs 122 in more detail. The UDBs 120A and 120B each contain several different functional blocks that in one embodiment include two Programmable Logic Devices (PLDs) 200, a data path 210, status and control 204, and clock and reset control 202. The operations of these different functional elements are described in more detail below in FIGS. 8 and 9.

The two UDBs 120A. and 120B in UDB pair 122 are tightly coupled together to common routes in the same associated horizontal routing channel 132. Tight coupling refers to the UDB I/O signals 127 in the upper UDB 120A and the corresponding signals 128 in the lower UDB 120B all being directly connected to the same associated horizontal routing channel 132. This tight coupling provides high performance signaling between the two UDBs 120A and 120B. For example, relatively short connections 127 and 128 can be programmably established between the upper UDB 120A and the lower UDB 120B.

In one embodiment, the horizontal routing channels 132 can also have a larger number of routes and connections to the UDBs 120A and 120B than the vertical routing channels 134 shown in FIG. 2. This allows the horizontal routing channels 132 to provide more interconnectivity both between the UDBs 120A and 120B in UDB pair 122 and also provides more interconnectivity between different UDB pairs 122 in the same rows of interconnect matrix 130.

Thus, the interconnect matrix 130 in FIGS. 1 and 2 more effectively uses chip space by providing more traces and connectivity for the shorter/higher performance horizontal routing channels 132 than the relatively longer/lower performance vertical routing channels 134.

Figure 4:
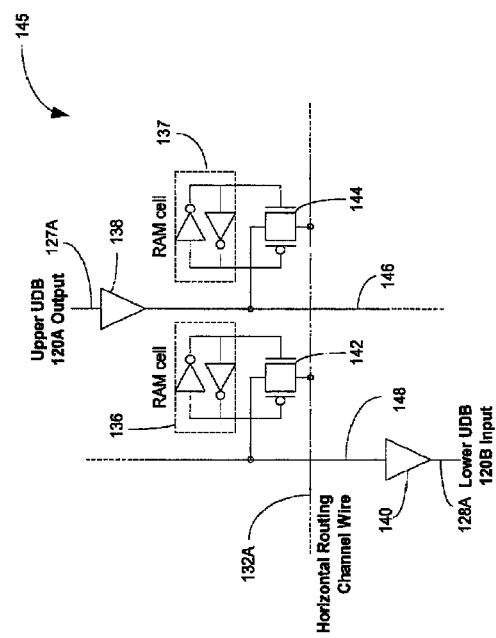
FIG. 4 is a schematic block diagram showing programmable switches that connect the UDBs in FIG. 3 to the horizontal routing channel.

FIG. 4 shows switching elements 145 that connect the different I/O signals 127 and 128 for the UDBs 120A and 120B in FIG. 3 to the horizontal routing channel 132. In this example, an output 127A from the upper UDB 120A in the UDB pair 122 drives an input 128A in the lower UDB 120B. A buffer 138 is connected to the UDB output 127A and a buffer 140 is connected to the UDB input 128A. The output 127A and input 128A are connected to vertical wires 146 and 148, respectively that intersect the horizontal routing channel wire 132A with a regular pattern.

At the switch points, RAM bits operate RAM cells 136 and 138 which in turn control Complementary Metal Oxide Semiconductor (CMOS) transmission gate switches 142 and 144, respectively. The switches 142 and 144 when activated connect the UDB output 127A and the UDB input 128A to horizontal routing channel wire 132A.

Figure 7:
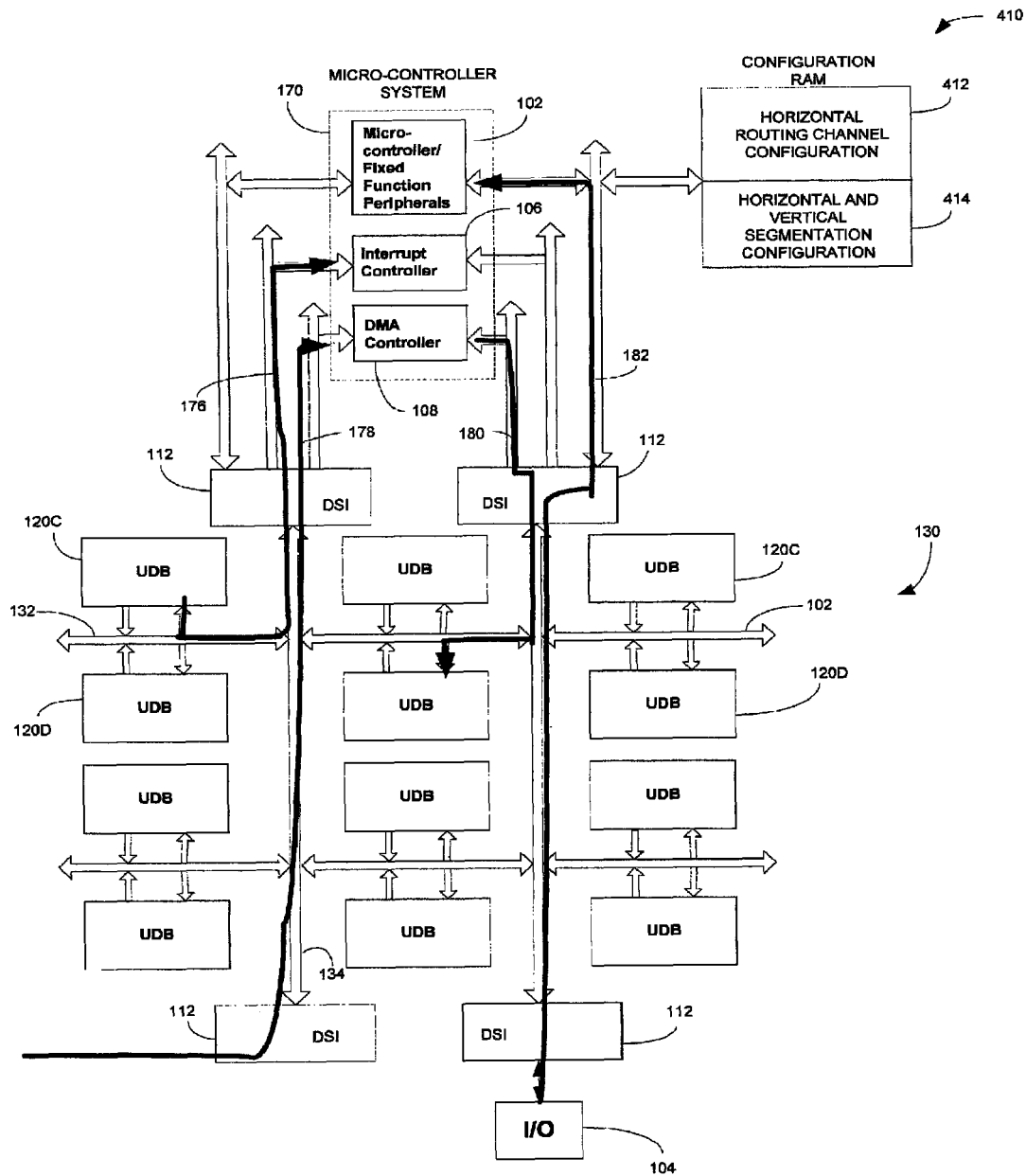
FIG. 7 is a schematic block diagram that shows how the interconnect matrix of FIG. 2 can connect different interconnect paths to a micro-controller system.

The RAM cells 136 and 137 are programmably selectable by the microcontroller 102 (FIG. 1) by writing values into a configuration RAM 410 (FIG. 7). This allows the microcontroller 102 to selectively activate or deactivate any of the gate switches 142 and 144 and connect any I/O 127 or 128 from either of the two universal digital blocks 120A and 120B to different wires in the horizontal channel 132.

Figure 5:
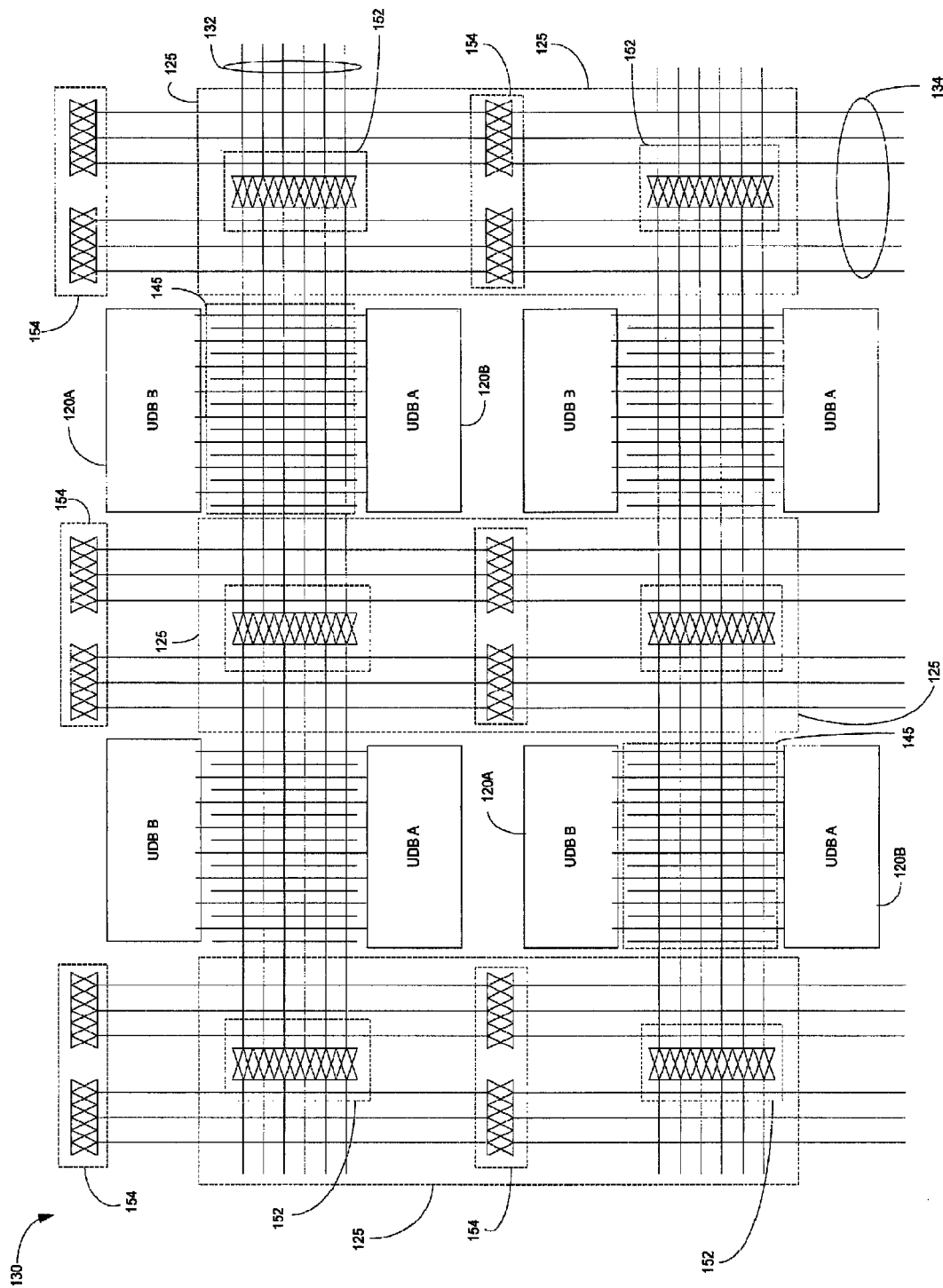
FIG. 5 is a schematic block diagram showing segmentation elements in the interconnect matrix.

FIG. 5 shows the interconnect matrix 130 previously shown in FIGS. 1 and 2 in further detail. The segmentation elements 125 can include different combinations of horizontal segmentation switches 152 and vertical segmentation switches 154. The horizontal segmentation switches 152 programmably couple together adjacent horizontal routing channels 132 located in the same row. The vertical segmentation switches 152 programmably couple together horizontal routing channels 132 located vertically in adjacent rows via vertical routing channels 134.

In addition to the segmentation elements 125, the interconnect matrix 130 includes the switching elements 145 previously shown in FIG. 4 that programmably connect the upper and lower UDBs 120A and 120B with their associated horizontal routing channels 132.

Figure 6:
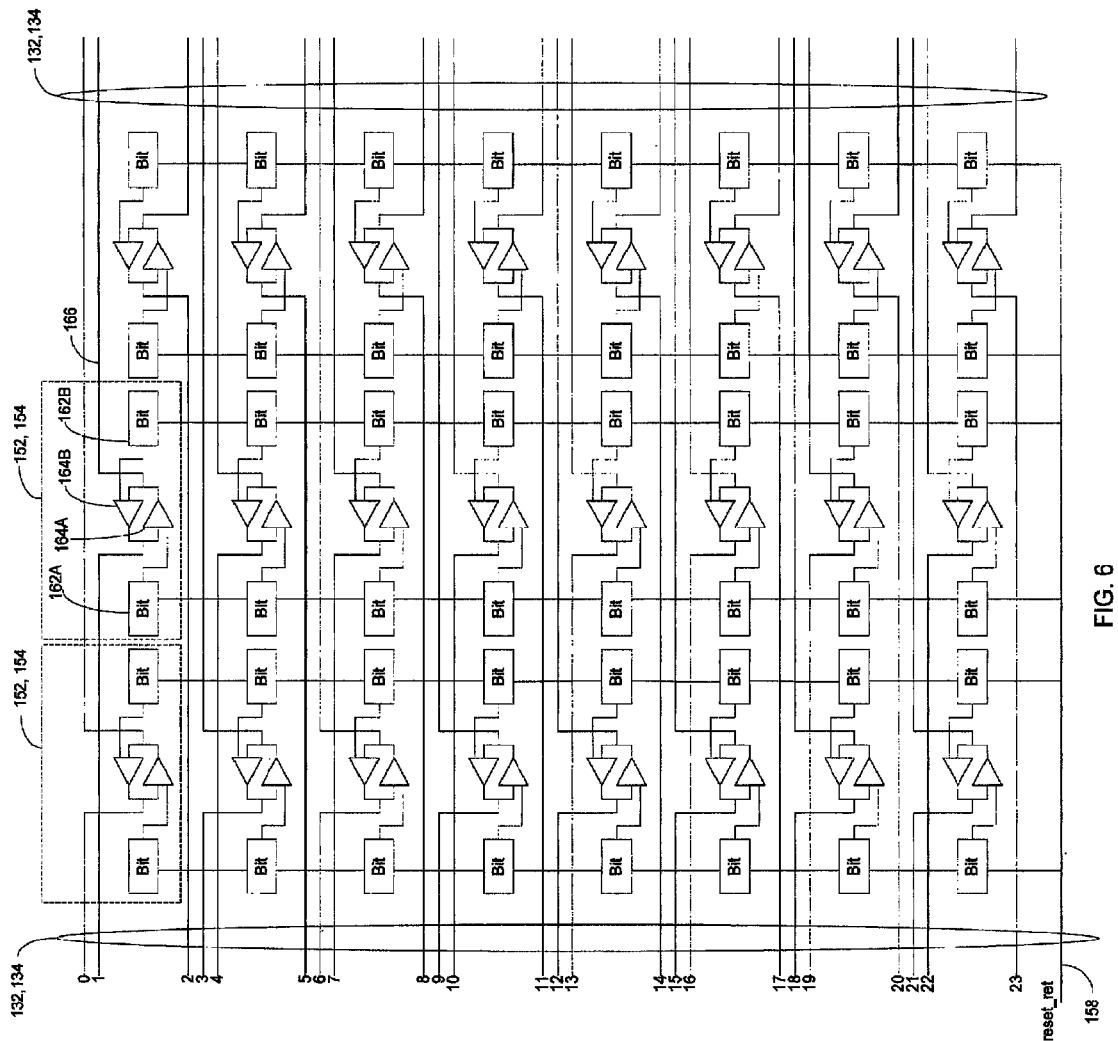
FIG. 6 is a schematic block diagram showing different programmable switches in the segmentation elements of FIG. 5 in more detail.

Referring to FIGS. 5 and 6, the segmentation elements 125 comprise arrays of horizontal segmentation switches 152 that are coupled in-between different horizontal routing channels 132 and vertical segmentation switches 154 coupled in-between the vertical routing channels 134. Each segmentation switch 152 and 154 is controlled by two bits 162A and 162B from the configuration RAM 410 (FIG. 7). The two bits 162A and 162B together control a tri-state buffer 164.

When bit 162A is set, the buffer 164A drives one of the horizontal or vertical channel lines 166 from left to right. When bit 162B is set, the buffer 164B drives the same horizontal or vertical channel line 166 from right to left. If neither bit 162A nor bit 162B is set, the buffers 164A and 164B drive line 166 to a high impedance state.

Configuration and Programmability

Any combination of the switching elements 145, horizontal segmentation switches 152, and vertical segmentation switches 154 can be programmably configured to connect together almost any combination of external I/O pins 104 (FIG. 1), UDBs 120, and micro-controller system elements 170 and fixed peripherals 105 (FIG. 1).

FIG. 7 shows different examples of how different types of interconnect paths can be programmed through the interconnect matrix 130. A Random Access Memory (RAM) or a set of configuration registers 410 are directly readable and writeable by the micro-controller 102. A first set of bits in RAM section 412 are associated with the RAM cells 136 and 137 shown in FIG. 4 that control connections between the inputs and output of UDB and their associated horizontal routing channels 132. A second set of bits in RANI section 414 control how the horizontal segmentation switches 152 in FIGS. 5 and 6 connect the horizontal routing channels 132 in the same rows together and other bits in RAM section 414 control how the vertical segmentation switches 154 connect together the horizontal routing channels 132 in different rows.

Pursuant to the micro-controller 102 programming RAM 410, the interconnect matrix 130 is configured with a first interconnect path 176 that connects a UDB 120C to the interrupt controller 106. The UDB 120C can then send interrupt requests to the DMA controller 108 over interconnect path 176. A second interconnect path 178 is established between a peripheral (not shown) in the PSoC chip 100 (FIG. 1) and DMA controller 108. The peripheral sends DMA requests to the DMA controller 108 over the interconnect path 178 that includes system level interconnect 172 and interconnect matrix 130.

A third interconnect path 180 is also configured by the micro-controller 102 by loading bits into RAM sections 412 and 414. The DMA controller 108 uses the interconnect path 180 to send a DMA terminate signal to UDB 120D. A fourth interconnect path 182 is programmably configured between one of the PSoC 110 pins 104 and a fixed digital peripheral, such as the micro-controller 102. The interconnect path 182 is used to send I/O signals between the micro-controller 102 and the I/O pin 104.

Interconnect paths 176-182 are of course just a few examples of the many different interconnect configurations that can be simultaneously provided by the interconnect matrix 130. This example also shows how different I/O pins 104, UDBs 120, and other peripherals can be connected to the same interrupt line on the interrupt controller 106 or connected to the same DMA line on the DMA controller 108.

Typically, interrupt requests received by an interrupt controller and DMA requests received by a DMA controller can only be connected to one dedicated pin. The interconnect matrix 130 allows any variety of different selectable functional elements or 110 pins to be connected to the same input or output for the interrupt controller 106 or DMA controller 108 according to the programming of RAM 410 by microcontroller 102.

The programmability of the interconnect matrix 130 also allows any number, or all, of the I/O pins 104 to be undedicated and completely programmable to connect to any functional element in PSoC 100. For example, the pin 104 can operate as an input pin for any selectable functional element in FIG. 7. In another interconnect matrix configuration, the same pin 104 can operate as an output pin when connected to a first peripheral and operate as an output pin when connected to a different peripheral.

Universal Digital Block

Figure 8:
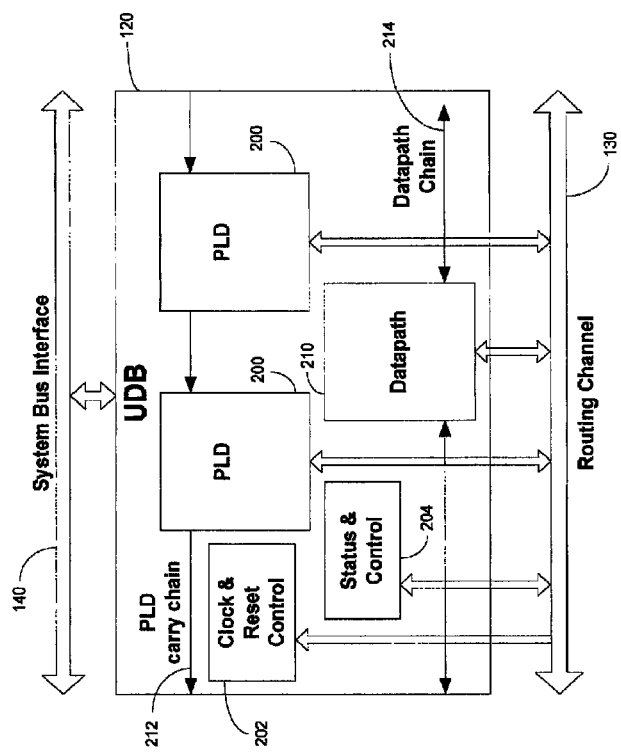
FIG. 8 is a schematic diagram that shows one of the UDBs in more detail.

FIG. 8 is a top-level block diagram for one of the UDBs 120. The major blocks include a pair of Programmable Logic Devices (PLDs) 200. The PLDs 200 take inputs from the routing channel 130 and foul registered or combinational sum of-products logic to implement state machines, control for datapath operations, conditioning inputs and driving outputs.

The PLD blocks 200 implement state machines, perform input or output data conditioning, and create look-up tables. The PLDs 200 can also be configured to perform arithmetic functions, sequence datapath 210, and generate status. PLDs are generally known to those skilled in the art and are therefore not described in further detail.

The datapath block 210 contains highly structured dedicated logic that implements a dynamically programmable ALU, comparators, and condition generation. A status and control block 204 allows micro-controller firmware to interact and synchronize with the UDB 120 by writing to control inputs and reading status outputs.

A clock and reset control block 202 provides global clock selection, enabling, and reset selection. The clock and reset block 202 selects a clock for each of the PLD blocks 200, the datapath block 210, and status and control block 204 from available global system clocks or a bus clock. The clock and reset block 202 also supplies dynamic and firmware resets to the UDBs 120.

Routing channel 130 connects to UDB I/O through a programmable switch matrix and provides connections between the different elements of the UDBs in FIG. 7. A system bus interface 140 maps all registers and RAMs in the UDBs 120 into a system address space and are accessible by the micro-controller 102.

The PLDs 200 and the datapath 210 have chaining signals 212 and 214, respectively that enable neighboring UDBs 120 to be linked to create higher precision functions. The PLD carry chain signals 212 are routed from the previous adjacent UDB 120 in the chain, and routed through each macrocell in both of the PLDs 200. The carry out is then routed to the next UDB 120 in the chain. A similar connectivity is provided for the set of conditional signals generated by the datapath chain 214 between datapath blocks 210 in adjacent UDBs 120.

Figure 9:
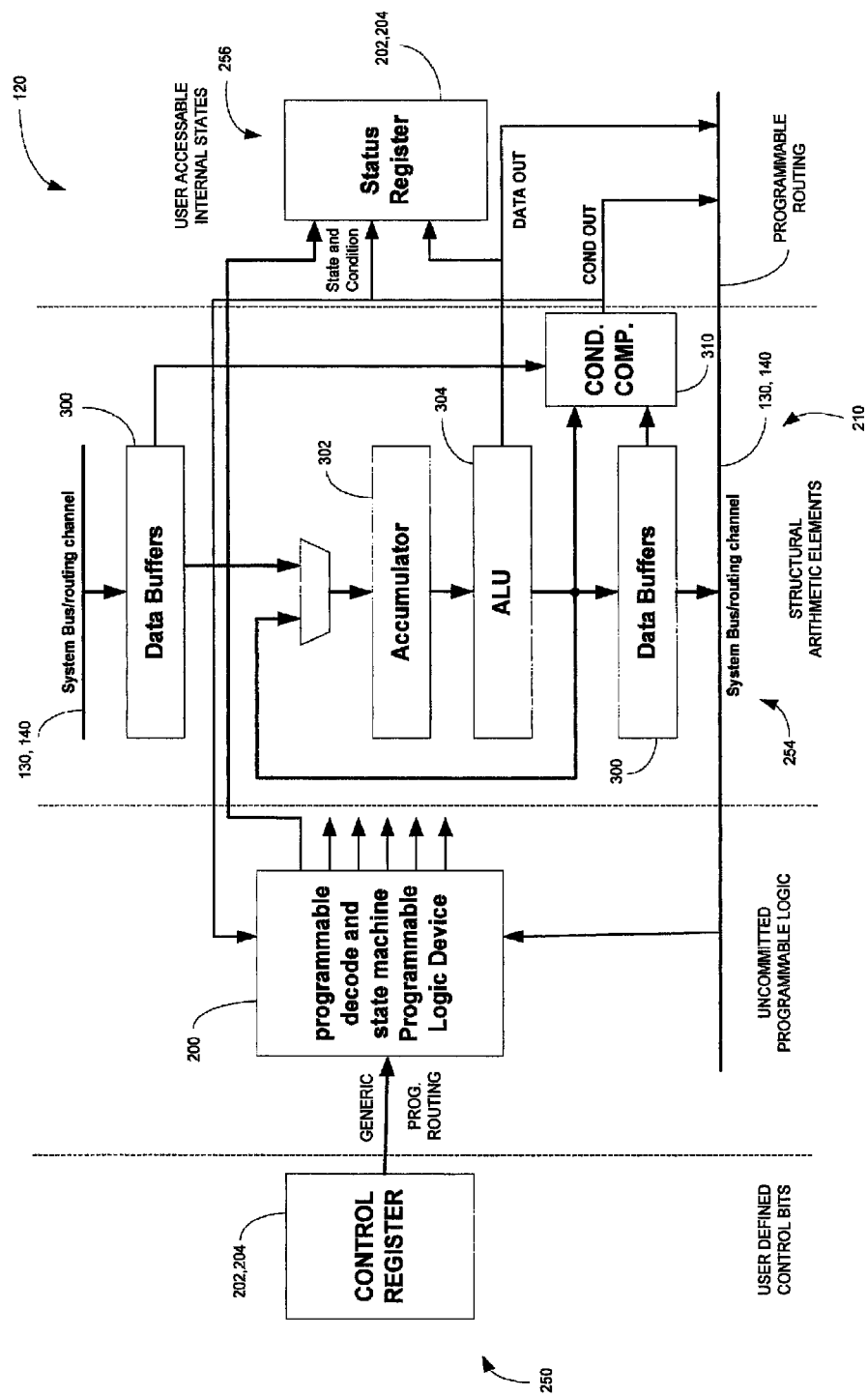
FIG. 9 is a schematic diagram that shows a datapath in the UDB of FIG. 8 in more detail.

Referring to FIG. 9, each UDB 120 comprises a combination of user defined control bits that are loaded by the micro-controller 102 into control register 250. The control register 250 is part of the control blocks 202 and 204 described above in FIG. 8. The control register 250 feeds uncommitted programmable logic 200 and control for structure datapath inputs. The same control blocks 202 and 204 described above in FIG. 8 also include associated status registers 256 that allow the micro-controller 102 to selectably read different internal states both the uncommitted logic elements and for structural arithmetic elements 254 within the datapath 210.

The datapath 210 comprises highly structured logic elements 254 that include a dynamically programmable ALU 304, conditional comparators 310, accumulators 302, and data buffers 300. The ALU 304 is configured to perform instructions on accumulators 302, and to perform arithmetic sequences as controlled by a sequence memory. The conditional comparators 310 can operate in parallel with the ALU 304. The datapath 210 is further optimized to implement typical embedded functions, such as timers, counters, pseudo random sequence generators, Cyclic Redundancy Checkers (CRC), Pulse Width Modulators (PWM), etc.

The combination of uncommitted PLDs 200 with a dedicated datapath module 210 allow the UDBs 120 to provide embedded digital functions with more silicon efficient processing. The dedicated committed structural arithmetic elements 254 more efficiently implement arithmetic sequencer operations, as well as other datapath functions. Since the datapath 210 is structural, fewer gates are needed to implement these structural elements 254 and fewer interconnections are needed to connect the structural elements 254 together into an arithmetic sequencer. Implementing the same datapath 210 with PLDs could require a much greater quantity of additional combinational logic and additional interconnections.

The structured logic in the datapath 210 is also highly programmable to provide a wide variety of different dynamically selectable arithmetic functions. Thus, the datapath 210 not only conserves space on the integrated circuit 100 (FIG. 1) but also is highly configurable similar to PLDs. It has an additional advantage of being dynamically configurable and reconfigurable.

The functional configurability of the datapath 210 is provided through the control registers 250 and allow the micro-controller 102 to arbitrarily write into a system state and selectively control different arithmetic functions. The status registers 256 allow the micro-controller 102 to also identify different states associated with different configured arithmetic operations.

The flexible connectivity scheme provided by the routing channel 130 selectively interconnects the different functional element 250, 200, 254, and 256 together as well as programmably connecting these functional element to other UDBs, I/O connections, and peripherals. Thus, the combination of uncommitted logic 200, structural logic 254, and programmable routing channel 130 provide as much functionality and more efficiently uses integrated circuit space.

The interconnect matrix 130 also requires little or no dedicated UDB block routing. All data, state, control, signaling, etc, can be routed through the interconnect matrix 130 in the UDB array 110. The array routing is efficient because there is little or no difference between a local UDB net and a net that spans the UDB array. Horizontal and vertical segmentation allow the array to be partitioned for increased efficiency and random access to the RAM 410 allow high speed configuration or on the fly reconfigurability.

System Level Interconnect

Figure 10:
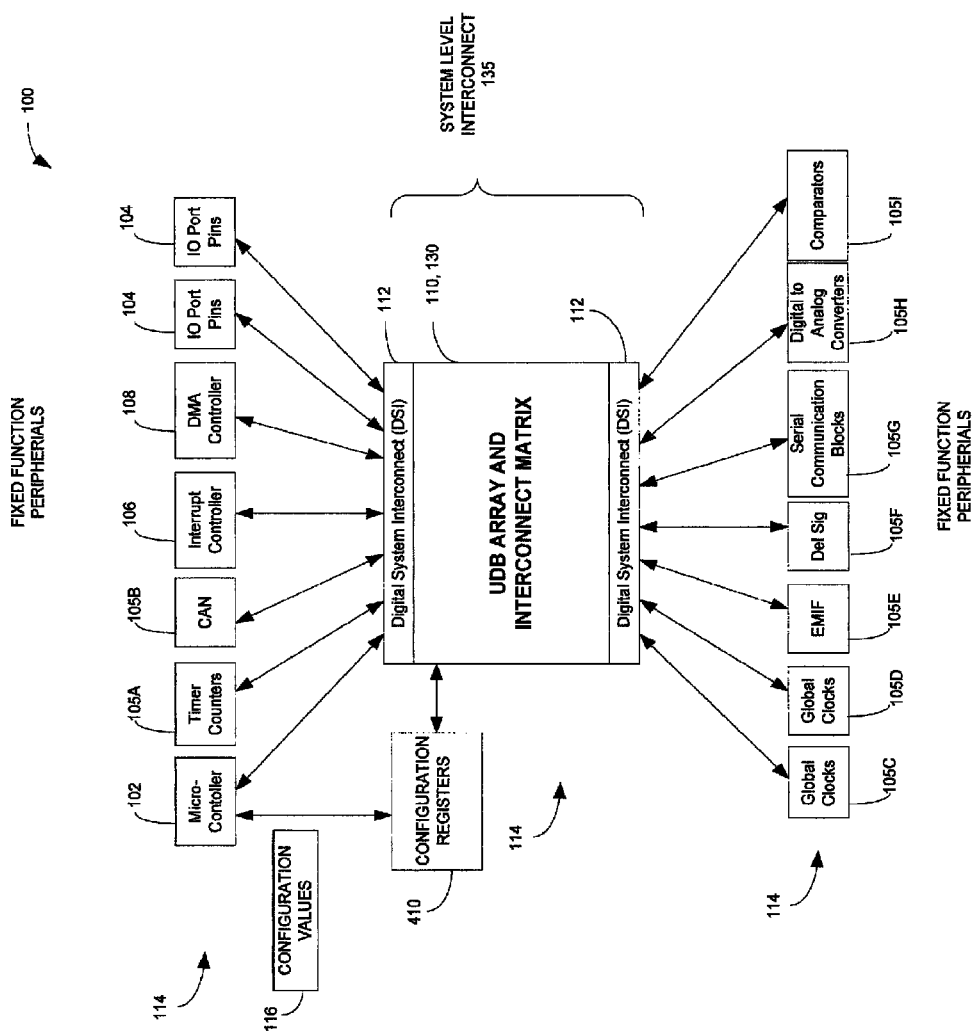
FIG. 10 is a diagram showing a system level interconnect.

FIG. 10 shows an abstract view of a system level routing architecture in the PSoC Integrated Circuit (IC) 100. The UDB array 110 includes DSI interfaces 112 at the top and bottom of the array 110. The DS' 112 is an extension of the interconnect matrix 130 described above in FIG. 2 and the combination of the DSI 112 and interconnect matrix 130 within UDB an-ay 110 is referred to generally as a system level interconnect 135.

The different peripherals 102, 105, 106, 108, and 110 are all referred to generally as functional elements 114 and can all be located in the same PSoC IC 100. Examples of fixed digital peripherals include, but are not limited to, timers and counters 105A, a Controller Area Network communications protocol (CAN) 105B, the micro-controller 102, the DMA controller 108, global clocks 105C and 105D, an External Memory Interface (EMIF) 105E, Delta Sigma ADC block (Del SIG) 105F, serial communication blocks 105G and comparators 105I. Fixed analog peripherals can include, but are not limited to Digital-to-Analog Converters (DACs) 105H. I/O pins 104 are alternatively referred to as I/O ports or I/O pins and provide the external signal path for the functional elements 114.

The micro-controller 102 configures the system level interconnect 135 by loading configuration values 116 into configuration registers or configuration memory 410. The system level interconnect 135 then programmably connects together the different functional elements 114 and different I/O pins 104 according to the configuration values 116 loaded into the configuration registers 410.

The system level interconnect 135 is configured by the micro-controller 102 to connect any of the different functional elements 114 to any of the different I/O pins 104 and can also be configured to connect any of the different functional elements 114 to each other according to the loaded configuration values 116. The system level interconnect 135 can also be dynamically reconfigured on-the-fly by the micro-controller 102 in real-time according to different operational states of the IC 100.

Figure 11:
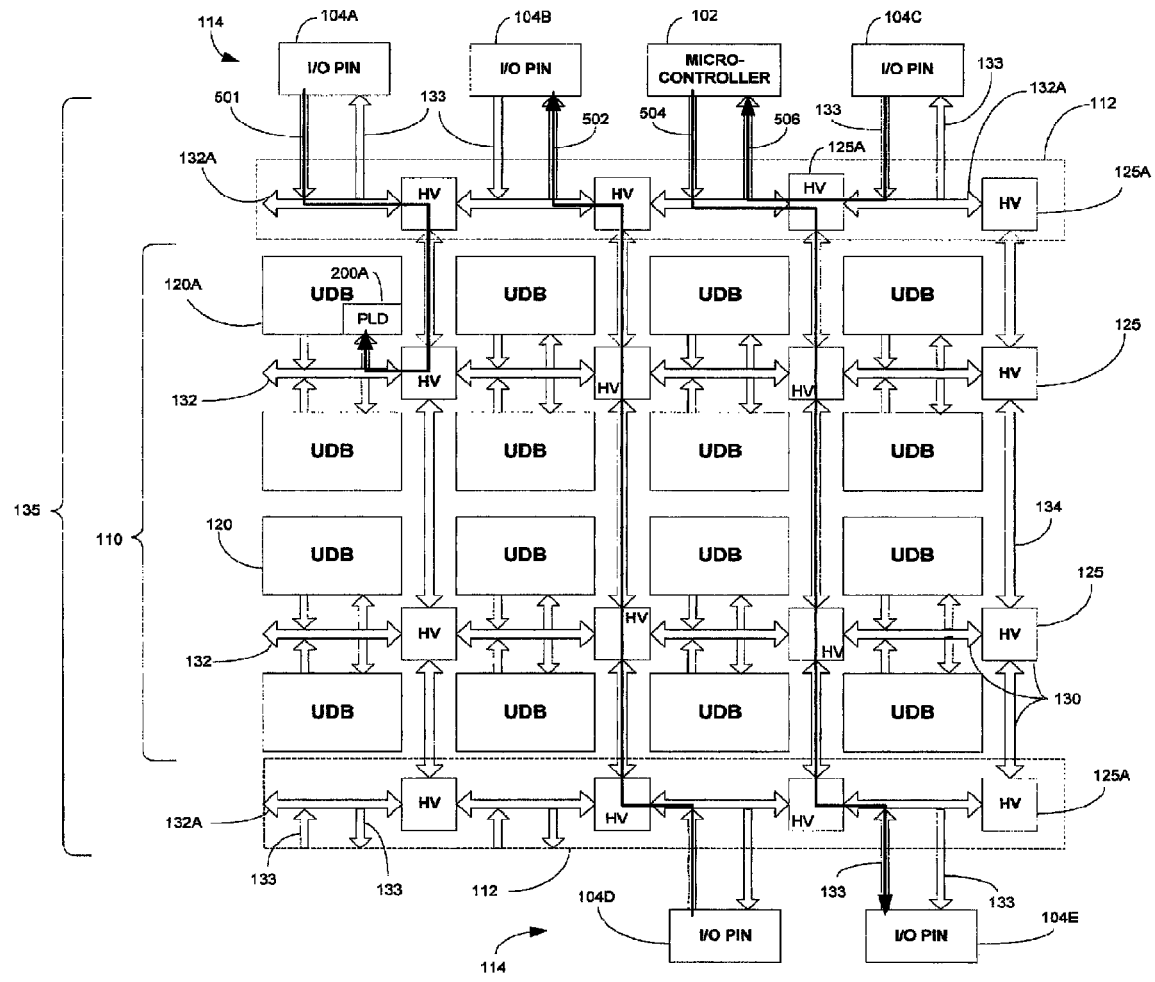
FIG. 11 is a more detailed drawing of the system level interconnect.

Referring to FIG. 11, the system level interconnect 135 includes both the interconnect matrix 130 used in the UDB array 110 and the DST 112. The DSI 112 provides the additional connectivity between the UDB array 110 and the other fixed functional elements 114 and I/O pins 104. The DSI 112 is built from similar functional blocks as the interconnect matrix 130. As with the interconnect matrix 130, the DSI 112 includes multiple horizontal channels 132A that are programmably connected together by segmentation elements 125A. The segmentation elements 125A also connect to other horizontal channels 132 in the UDB array 110.

The horizontal channels 132A in the DSI 112 are programmably connected to the different fixed peripherals 114 and different I/O pins 104 through interface lines 133. For example, FIG. 11 shows the micro-controller 102 and multiple different I/O pins 104A-104E connected to horizontal channels 132A via the interface lines 133. The different segmentation elements 125A in the DSI 112 then couple the horizontal channels 132A to each other and to other horizontal channels 132 in the UDB array 110.

System level routing provides multiple equivalent destinations. For example, routing from the I/O pin 104A to an input of a PLD 200A is facilitated by the fact that all PLD inputs are permutable, i.e., they are all equivalent. The concept of permutability at the destination is applied as a general rule for internal array destinations in the UDBs 120 (PLD inputs, datapath inputs, clock and reset inputs, etc). However, it is also applied to destinations outside the UDB array 110.

The system level interconnect 135 allows any I/O from any UDB 120 to be connected to any other UDB I/O in any other UDB array 110. Further, any I/O from any UDB 120 in UDB array 130 can also be connected to any I/O of any fixed peripheral element 114 or connect to any I/O pin 104. Further, any I/O for any peripheral 114 can also be connected to any I/O of another other peripheral 114 and can also be connected to any I/O pin 104.

FIG. 11 shows some examples. In a first example, the micro-controller 102 (FIG. 10) configures a first path 501 in the system level interconnect 135 that couples I/O pin 104A to one of the inputs of the PLD 200A in UDB 120A. At the same time, the micro-controller 102 configures a second path 502 in the system level interconnect 135 that connects the I/O pin 104B directly to the pin 104 D.

In this example, the micro-controller 102 also loads configuration values 116 into configuration registers 410 that configure a path 504 in the system level interconnect 135 that connect an output of micro-controller 102 to I/O pin 104E and also configure a path 506 that connects an input of micro-controller 102 to I/O pin 104C. Any combination of different connection paths can be created by loading associated configuration values 116 into the configuration registers 401 shown in FIG. 10.

Figure 12:
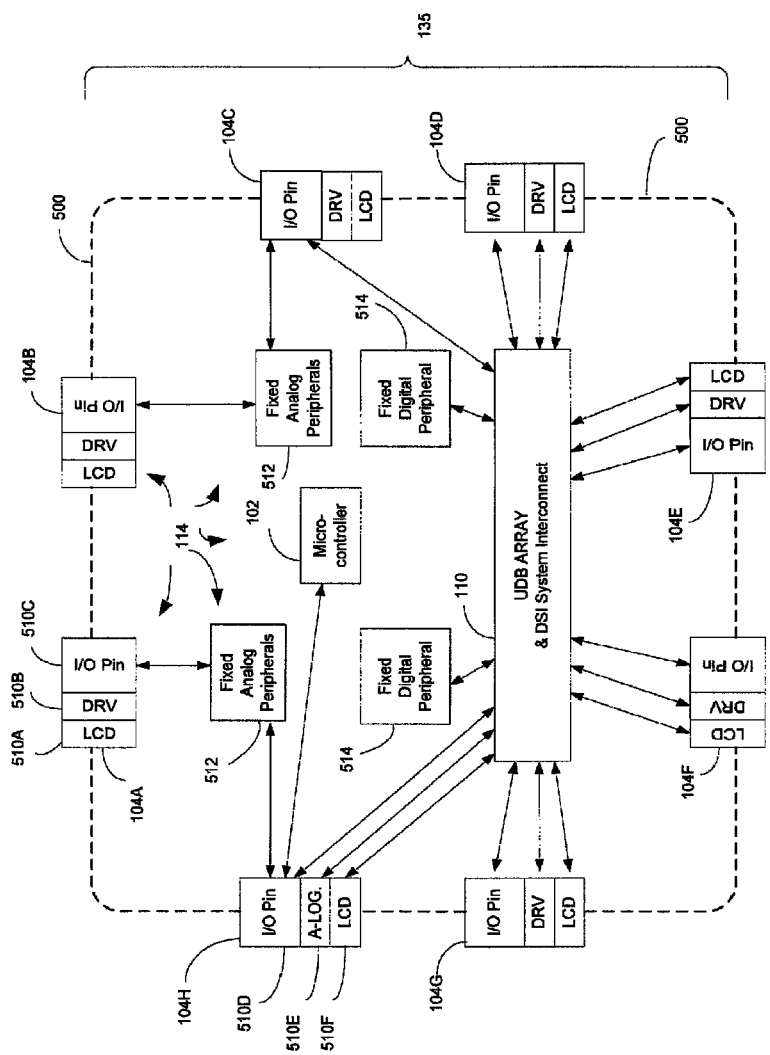
FIG. 12 is a diagram showing how I/O pins can be reconfigured using the system level interconnect.

FIG. 12 is another abstract view of the system level interconnect 135 shown extending around the edge of an integrated circuit 500. In this example, the same or a similar interconnect matrix 130 is used in the UDB array 110 and used in conjunction with the DSI 112. The embodiment in FIG. 12 may also have a separate control bus that extends around the periphery of IC 500 that selectively connects to the different functional elements 114. Prior to configuring the system level interconnect 135, the I/O pins 104 are effectively undedicated and unconnected to any functional element 114. After configuration, the I/O pins 104 provide any type of input and/or output associated with the connected functional element 114.

For example, some pins 104 are configured by the micro-controller 102 to operate as an I/O connection for a Liquid Crystal Display (LCD) function 510A, a multi-level driver (DRV) function 510B, and a general digital I/O function 510C. These different functions 510A-510C can be configured in the PLDs 200, datapaths 210, or fixed peripherals 512 and 514. The functions 510A-510C are shown next to pins to represent the pins 104 being associated with different functional elements in IC 500.

Depending on the operational state of the IC 500, the different configuration values 116 in configuration register 410 (FIG. 10) are changed by the micro-controller 102 to reconnect the pins to the different functions 510A-510C. For example, pin 104A may initially operate as an I/O pin for digital I/O function 510C. Upon detection of a particular signal or state, the micro-controller 102 may then reconfigure the system level interconnect 135 to connect pin 104A to the LCD function 510A.

In another example, the system level interconnect 135 is initially configured to connect pin 104H as a digital input for a digital function 510D in one of the UDBs 120 of UDB array 110. After a particular signal or state is detected in the IC 500, the micro-controller 102 reconfigures the system level interconnect 135 to connect pin 104H to a digital output of a digital function 510E in one of the fixed digital peripherals 514.

Figure 13:
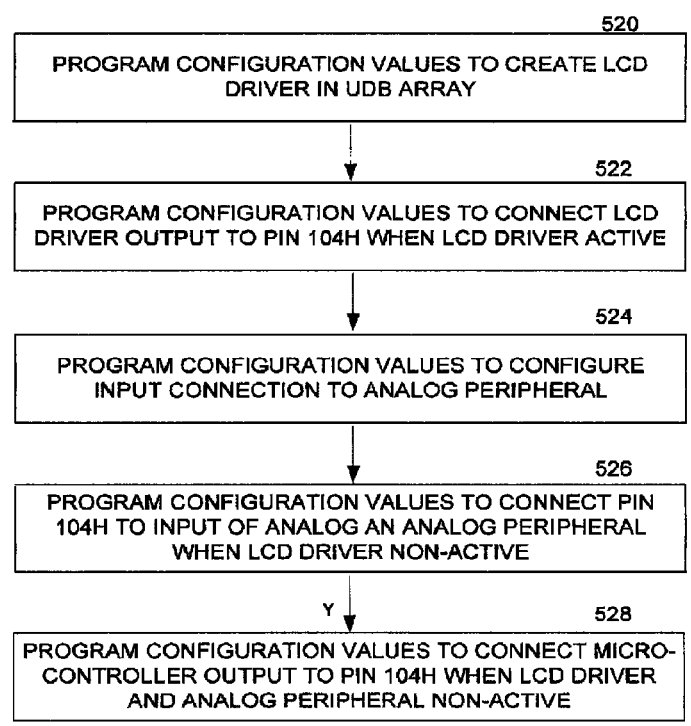
FIGS. 13 and 14 are flow diagrams explaining how I/O pins are dynamically reconfigured for different operations.

Referring to FIGS. 12 and 13, the pin 104H in another example is dynamically configured to operate as an external I/O for a digital function 510D, an analog function 510E, and a LCD function 510F. In operation 520, the micro-controller 102 loads configuration values 116 into configuration registers 410 that configure a LCD driver in the UDB array 110. Other configuration values 116 in the registers 410 are loaded into the configuration registers 410 in operation 522 that configure the system level interconnect 135 to connect pin 104H to the output of LCD driver 510F.

Operation 524 loads configuration values 116 into the registers 410 that configure an analog-to-digital converter in one of the fixed analog peripherals 512. Operation 526 may happen later during a different operating state and loads configuration values into the configuration registers 410 that connect pin 104H to the analog-to-digital converter when the LCD driver 510F is inactivated. Finally, operation 528 loads configuration values into registers 410 that ca-use the same pin 104H to connect to the micro-controller 102 when the LCD driver 510F and the analog-to-digital converter 510E are both inactive.

Figure 14:
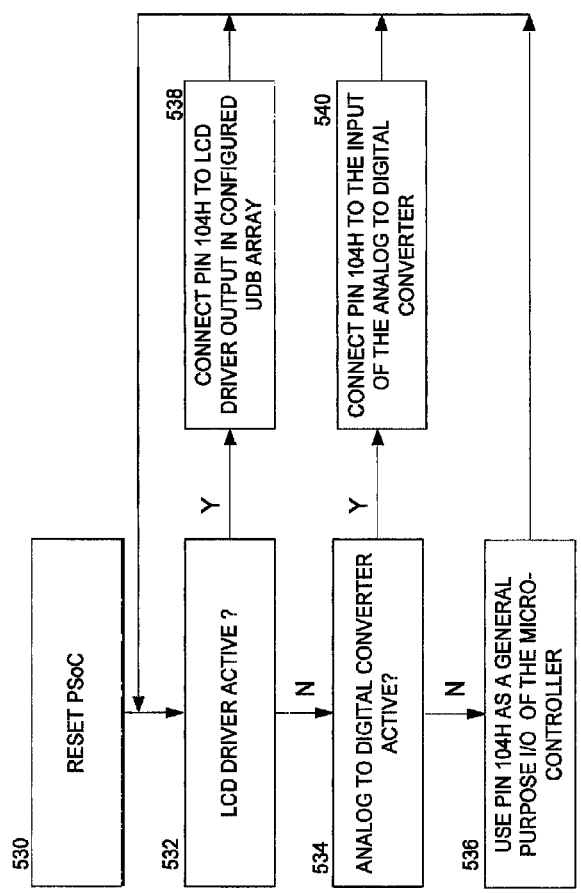

FIG. 14 further explains how the IC 500 in FIG. 12 operates according to the configuration values 116 loaded into the registers 410. In operation 530, the PSoC IC is reset. When the LCD driver 510H is active in operation 532, pin 104I-1 is connected to the LCD driver output in operation 538. When the LCD driver is inactive but the analog-to-digital converter 510E is active in operation 534, pin 104H is connected to the analog-to-digital converter 510E in operation 540. Otherwise, pin 104H is connected through the system level interconnect 135 to the micro-controller 102 in operation 536. The micro-controller 102 then waits for the LDC driver 510F or the analog-to-digital converter 510E to reactivate and accordingly reconnects pin 104H to the activated function.

In yet another example, the system level interconnect 135 is configured to synchronously multiplex two different analog signals from different I/O pins 104B and 104C to the same fixed analog peripheral 512. The analog peripheral in one example is also an analog-to-digital converter. In this example, a clock in UDB array 110 synchronously causes the micro-controller 102 to reconfigure system level interconnect 135 to toggle connecting pins 104B and 104C to the fixed analog peripheral 512 on a clocked periodic basis. Thus, the system level interconnect 135 in this example operates essentially as an analog multiplexer switching between the analog signal on I/O pin 104B and the analog signal on I/O pin 104C.

Figure 15:
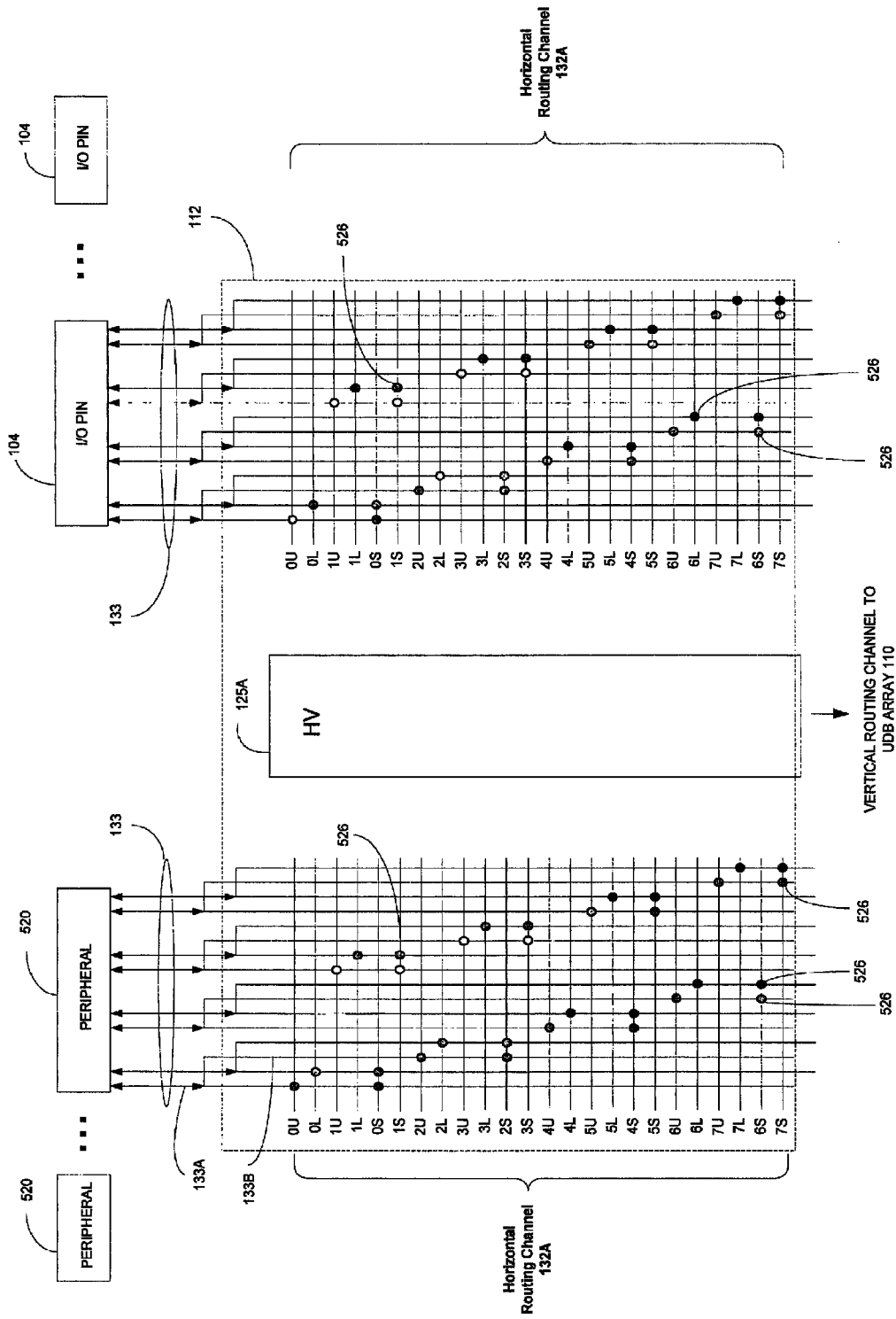
FIGS. 15 and 16 are more detailed diagrams of a Digital System Interconnect (DSI) used in the system level interconnect shown in FIG. 10.

FIG. 15 shows the DSI 112 from FIG. 11 in more detail. The segmentation elements 125A are essentially the same as those shown in FIGS. 5 and 6. The segmentation elements 125A connect adjacent horizontal channels 132A together and also connect the horizontal channels 132A to other horizontal channels in the UDB array 110.

Different sets of interface lines 133 are coupled to different associated peripherals 520 or I/O pins 104. The interface lines 133 overlap with multiple different channel lines in associated horizontal channels 132A and programmably couple to the different channel lines according to particular configuration values 116 (FIG. 10) that activate associated switching elements 526.

Multiple different interface lines 133 for the same peripheral 520 or for the same connector 104 are shorted together. For example, interface lines 133A and 133B in FIG. 15 are both shorted together. Shorting multiple interface lines together increases connectivity and allows shorter system level interconnect paths between the peripherals 520, I/O pins 104, and UDB array 110.

Figure 16:
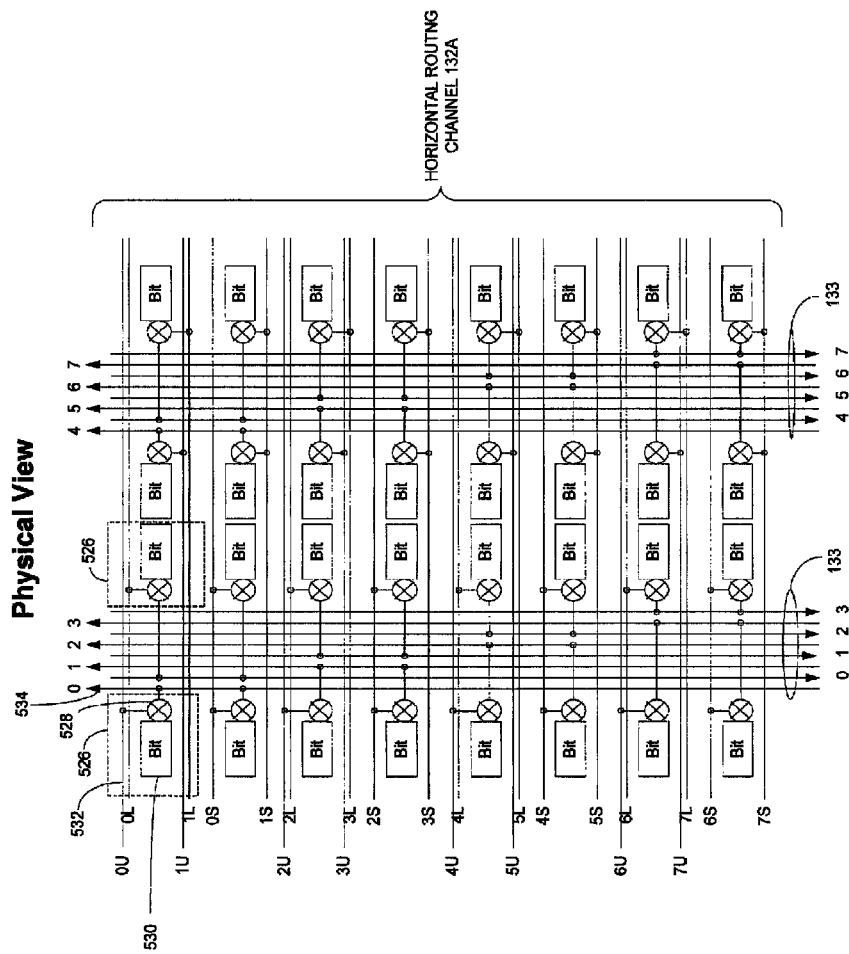

FIG. 16 shows the switching elements 526 in FIG. 15 in more detail. Each switching element 526 includes an associated bit 530 that is located in one of the configuration registers 410 shown in FIG. 10. The bits 530 control an associated gate 528 that when activated connect a horizontal channel line 532 to an interface line 534. As shown in FIG. 16, multiple interface switching elements 526 can be attached to the same interface line 534 and atached to multiple different horizontal channel lines 532. This again increases the connectivity of the peripherals 520 and I/O pins 104 in FIG. 15 with horizontal routing channel 132A. The bits 530 can be loaded into the configuration registers 410 by the micro-controller 102 and can be dynamically changed by the micro-controller 102 during IC operation as described above.

Figure 17:
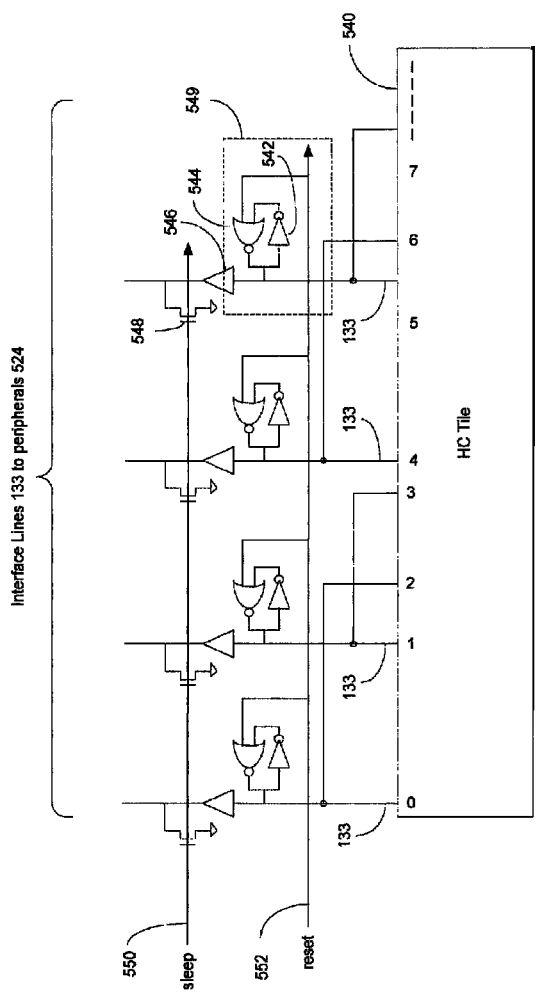
FIG. 17 shows how holds bits are used on interface lines.

FIG. 17 shows hold cells 549 that retain a last state on associated interface lines 133 prior to the integrated circuit being reconfigured and further set the interface lines 133 to weak predetermined states upon receiving a reset signal 552.

A tile 540 contains the interconnects previously shown in FIG. 16. Multiple different tiles 540 are arranged to connect the different peripherals 520 and I/O pins 104 (FIG. 15) to the horizontal routing channels 132A. The interface lines 133 at the top of each tile are coupled to hold cells 549 and gates 548. The gates 548 ground the interface lines 133 when a sleep signal 550 is asserted.

When a digital value is output on one of the interface lines 133 and the reset value is low, inverter 542 in hold cell 549 inverts the value which is then inverted back by the NOR gate 544. This holds the original digital state on the interface line 133.

Floating signals can cause problems for certain device inputs. For example, the floating state may be incorrectly interpreted as logic high or logic low values and in turn cause operational errors. To avoid this floating condition, the reset line 552 is asserted high causing all of the hold buffers 549 to output a weak zero value on the interface lines 133. A logic one or logic zero signal asserted on any one of the interface lines 133 overrides the weak zero signal and causes the hold cell 549 to latch the new signal state.

The system described above can use dedicated processor systems, micro controllers, programmable logic devices, or microprocessors that perform some or all of the operations. Some of the operations described above can be implemented in software and other operations can be implemented in hardware.

For the sake of convenience, the operations are described as various interconnected functional blocks or distinct software modules. This is not necessary, however, and there can be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

Having described and illustrated the principles of the invention in a preferred embodiment thereof, it should be apparent that the invention can be modified in arrangement and detail without departing from such principles. Claim is made to all modifications and variation coming within the spirit and scope of the following claims.

What is claimed is:

1. An apparatus, comprising:
   different functional elements all located in a same integrated circuit wherein at least one of the functional elements comprises a micro-controller;
   configuration registers or configuration memory in the integrated circuit to store configuration values;
   different I/O pins configured to connect the integrated circuit to external signals; and
   a system level interconnect, located in the integrated circuit, configured to programmably connect a first functional element to a first I/O pin and to connect the first functional element to the micro-controller according to the configuration values loaded into the configuration registers or configuration memory.

2. The apparatus of claim 1, wherein the system level interconnect is configured to dynamically change the connections between the different functional elements and the different I/O pins in real time according to different operational states of the integrated circuit.

3. The apparatus of claim 1, wherein the micro-controller is configured to load the configuration values into the configuration registers or configuration memory.

4. The apparatus of claim 1, wherein:
   the functional elements further include multiple digital blocks that each include an arithmetic sequencer formed from programmable logic device sections comprising uncommitted user programmable logic functions and datapath sections comprising structural arithmetic elements;
   the system level interconnect is programmably configurable to connect different selectable programmable logic device sections in the digital blocks to other different selectable functional elements and to different selectable I/O pins; and
   the system level interconnect is programmably configurable to connect different selectable datapath sections in the digital blocks to other different selectable functional elements and to different selectable I/O pins.

5. The apparatus of claim 1, wherein:
   the system level interconnect is configured to operate the first I/O pins as an input pin by coupling the first I/O pin to an input for one of the functional elements while the integrated circuit is in a first operational state; and
   the system level interconnect is further configured to operate the first I/O pin as an output pin by coupling the first I/O pin to an output for one of the functional elements while the integrated circuit is in a second operational state.

6. The apparatus of claim 1, wherein the system level interconnect is configured to synchronously multiplex analog signals from different I/O pins to a same functional element that operates as an analog to digital converter.

7. The apparatus of claim 1, wherein the system level interconnect comprises horizontal channels configured to:
   programmably couple to the different functional elements according to the configuration values in the configuration registers or configuration memory; and
   programmably couple to the different I/O pins according to the configuration values in the configuration registers or configuration memory.

8. The apparatus of claim 7, further comprising;
a channel switch to programmably couple a first horizontal channel to the first functional element according to the configuration values; and
a segmentation switch to programmably couple the first horizontal channel to a second horizontal according to the configuration values.

9. The apparatus of claim 1, further comprising:
a first set of interface lines coupled to different associated functional elements; and
a second set of interface lines coupled to different associated I/O pins, the first and second sets of interface lines overlapping with multiple different channel lines in associated channels of the system level interconnect and programmably coupled to the different channel lines according to the configuration values.

10. The apparatus of claim 9, further comprising:
hold cells configured to retain a last state on associated interface lines and further configured to set the associated interface lines to a weak predetermined state upon receiving a reset signal.

11. An integrated circuit, comprising:
an interconnect configured to programmably couple different selectable functional elements to different selectable I/O pins in the integrated circuit according to configuration values, the interconnect configured to be programmably changed in real-time while the integrated circuit is in operation,
wherein the interconnect comprises different sets of interface lines and different sets of channel lines, the interface lines selectively coupled to the different selectable functional elements, the different selectable I/O pins, and the different channel lines according to the configuration values.

12. The integrated circuit of claim 11, wherein the different channel lines programmably couple the different functional elements in the integrated circuit and the different I/O pins in the integrated circuit according to the configuration values.

13. The integrated circuit of claim 12, further comprising: segmentation elements to programmably couple the channels together according to the configuration values.

14. The integrated circuit of claim 12, further comprising:
an array of universal digital blocks comprising uncommitted programmable logic sections and structural arithmetic logic sections, the interconnect programmably configured to connect different programmable logic sections and different arithmetic logic sections to the different channel lines in the interconnect.

15. An apparatus, comprising:
different functional elements comprising a micro-controller, a first peripheral, and a second peripheral, all located in a same integrated circuit;
configuration registers or configuration memory in the integrated circuit to store configuration values;
different I/O pins configured to connect the integrated circuit to external signals; and
a system level interconnect located in the integrated circuit to programmably connect the different functional elements to different I/O pins according to the configuration values loaded into the configuration registers or configuration memory,
wherein the system level interconnect is configured to be programmed according to the configuration values to couple a first I/O pin to the first peripheral while the integrated circuit is in a first state and couple the first I/O pin to the second peripheral when the integrated circuit is in a second state.

16. The apparatus of claim 15, further comprising: a first set of interface lines coupled to different associated functional elements; and
a second set of interface lines coupled to different associated I/O pins, the first and second sets of interface lines overlapping with multiple different channel lines in associated channels of the system level interconnect and programmably coupled to the different channel lines according to the configuration values.

17. The apparatus of claim 16, wherein multiple interface lines associated with the same functional elements or associated with the same I/O pins are shorted together.

18. The apparatus of claim 17, wherein each of the multiple shorted interface lines are configured to be programmably coupled to different channel lines according to the configuration values.

19. The apparatus of claim 15, wherein the first peripheral comprises an analog peripheral.

20. The apparatus of claim 15, wherein the second peripheral comprises a digital peripheral.

* * * * *